(12) United States Patent
Yamazaki et al.

(10) Patent No.: US 8,853,690 B2
(45) Date of Patent: Oct. 7, 2014

(54) SEMICONDUCTOR DEVICE WITH OXIDE SEMICONDUCTOR LAYER

(71) Applicant: Semiconductor Energy Laboratory Co., Ltd., Atsugi (JP)

(72) Inventors: Shunpei Yamazaki, Setagaya (JP); Hiromichi Godo, Isehara (JP); Hideyuki Kishida, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/743,546

(22) Filed: Jan. 17, 2013

(65) Prior Publication Data

US 2013/0126863 A1    May 23, 2013

Related U.S. Application Data

(63) Continuation of application No. 12/759,220, filed on Apr. 13, 2010, now Pat. No. 8,362,478.

(30) Foreign Application Priority Data

Apr. 16, 2009  (JP) .................................. 2009-100119

(51) Int. Cl.
*H01L 29/10* (2006.01)
*H01L 27/12* (2006.01)
*H01L 29/786* (2006.01)
*H01L 21/02* (2006.01)

(52) U.S. Cl.
CPC ........ *H01L 29/7869* (2013.01); *H01L 27/1255* (2013.01); *H01L 27/1225* (2013.01); *H01L 21/02554* (2013.01); *H01L 21/02565* (2013.01); *H01L 29/78696* (2013.01); *H01L 29/78609* (2013.01); *H01L 29/78618* (2013.01); *H01L 27/12* (2013.01)

USPC .......... 257/43; 257/66; 257/72; 257/E29.095; 257/E29.296

(58) Field of Classification Search
CPC ..................... H01L 29/7869; H01L 29/78696; H01L 27/1214; H01L 27/3244
USPC ................. 257/43, 66, 72, E29.095, E29.296
See application file for complete search history.

(56) References Cited

U.S. PATENT DOCUMENTS 5,731,856 A    3/1998  Kim et al.
5,744,864 A    4/1998  Cillessen et al.
(Continued)

FOREIGN PATENT DOCUMENTS

CN    001534722    10/2004
CN    101335275 A  12/2008
(Continued)

OTHER PUBLICATIONS

Prins et al., "A Ferroelectric Transparent Thin-Film Transistor," Appl. Phys. Lett. (Applied Physics Letters), Jun. 17, 1996, vol. 68, No. 25, pp. 3650-3652.

(Continued)

*Primary Examiner* — Minh-Loan T Tran
(74) *Attorney, Agent, or Firm* — Eric J. Robinson; Robinson Intellectual Property Law Office, P.C.

(57) ABSTRACT

An object is to provide a transistor including an oxide layer which includes Zn and does not include a rare metal such as In or Ga. Another object is to reduce an off current and stabilize electric characteristics in the transistor including an oxide layer which includes Zn. A transistor including an oxide layer including Zn is formed by stacking an oxide semiconductor layer including insulating oxide over an oxide layer so that the oxide layer is in contact with a source electrode layer or a drain electrode layer with the oxide semiconductor layer including insulating oxide interposed therebetween, whereby variation in the threshold voltage of the transistor can be reduced and electric characteristics can be stabilized.

15 Claims, 43 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,741,643 B2 | 6/2010 | Miyazaki et al. |
| 7,906,777 B2 | 3/2011 | Yano et al. |
| 7,910,490 B2 | 3/2011 | Akimoto et al. |
| 7,932,521 B2 | 4/2011 | Akimoto et al. |
| 8,173,487 B2 | 5/2012 | Urayama et al. |
| 8,258,023 B2 | 9/2012 | Lee |
| 8,274,077 B2 | 9/2012 | Akimoto et al. |
| 8,466,463 B2 | 6/2013 | Akimoto et al. |
| 8,629,069 B2 | 1/2014 | Akimoto et al. |
| 8,669,550 B2 | 3/2014 | Akimoto et al. |
| 8,790,959 B2 | 7/2014 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0039670 A1 | 2/2005 | Hosono et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0270197 A1 | 11/2006 | Ho et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0063211 A1 | 3/2007 | Iwasaki |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0191204 A1 | 8/2008 | Kim et al. |
| 2008/0224133 A1 | 9/2008 | Park et al. |
| 2008/0237598 A1 | 10/2008 | Nakayama |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 | 12/2008 | Ryu et al. |
| 2008/0296569 A1 | 12/2008 | Ho et al. |
| 2008/0308805 A1 | 12/2008 | Akimoto et al. |
| 2008/0318368 A1 | 12/2008 | Ryu et al. |
| 2009/0057663 A1 | 3/2009 | Kim et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2009/0321731 A1 | 12/2009 | Jeong et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0117999 A1 | 5/2010 | Matsunaga et al. |
| 2010/0136743 A1 | 6/2010 | Akimoto et al. |
| 2010/0148170 A1 | 6/2010 | Ueda et al. |
| 2010/0283509 A1 | 11/2010 | Kim et al. |
| 2011/0104851 A1 | 5/2011 | Akimoto et al. |
| 2011/0121290 A1 | 5/2011 | Akimoto et al. |
| 2012/0319103 A1 | 12/2012 | Lee |

FOREIGN PATENT DOCUMENTS

| | | |
|---|---|---|
| CN | 101752428 | 6/2010 |
| EP | 1737044 A | 12/2006 |
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2197034 A | 6/2010 |
| EP | 2226847 A | 9/2010 |
| JP | 60-198861 | 10/1985 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 | 10/1996 |
| JP | 08-264794 A | 10/1996 |
| JP | 11-505377 | 5/1999 |
| JP | 2000-044236 A | 2/2000 |
| JP | 2000-150900 | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |

(56) References Cited

FOREIGN PATENT DOCUMENTS

| | | |
|---|---|---|
| JP | 2004-022625 A | 1/2004 |
| JP | 2004-103957 | 4/2004 |
| JP | 2004-103957 A | 4/2004 |
| JP | 2004-273614 A | 9/2004 |
| JP | 2004-273732 A | 9/2004 |
| JP | 2005-093974 A | 4/2005 |
| JP | 2007-073703 A | 3/2007 |
| JP | 2007-142196 A | 6/2007 |
| JP | 2007-281486 A | 10/2007 |
| JP | 2008-140984 A | 6/2008 |
| JP | 2008-199005 A | 8/2008 |
| JP | 2008-235871 A | 10/2008 |
| JP | 2008-270723 A | 11/2008 |
| JP | 2008-276212 A | 11/2008 |
| WO | WO-2004/114391 | 12/2004 |
| WO | WO-2008/126729 | 10/2008 |
| WO | WO-2008/126884 | 10/2008 |
| WO | WO-2008/133456 | 11/2008 |

OTHER PUBLICATIONS

Nakamura et al., "The Phase Relations in the $In_2O_3$-$Ga_2ZnO_4$-ZnO System at 1350° C.," Journal of Solid State Chemistry, 1991, vol. 93, No. 2, pp. 298-315.

Kimizuka et al., "Syntheses and Single-Crystal Data of Homologous Compounds, $In_2O_3(ZnO)_m$ (m= 3, 4, and 5), $InGaO_3(ZnO)_3$, and $Ga_2O_3(ZnO)_m$ (m= 7, 8, 9, and 16) in the $In_2O_3$-$ZnGa_2O_4$-ZnO System," Journal of Solid State Chemistry, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Nakamura, et al., "Syntheses and Crystal Structures of New Homologous Compounds, Indium Iron Zinc Oxides ($InFeO_3(ZnO)_m$) (m: natural number) and Related Compounds," Kotai Butsuri (Solid State Physics), 1993, vol. 28, No. 5, pp. 317-327.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga2O3$—$In2O3$—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM—FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM '09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn-Oxide TFTs with Suppressed Variation for 4.0 inch QVGA AMOLED Display,", AM—FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase,"", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 191-193.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0—In. AMOLED Display With Driver Circuit Using Amorphous In—Ga—Zn-Oxide TFTs,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM—FPD '08 Digest of Technical Papers, Jul. 2, 2008, pp. 275-278.

(56) References Cited

OTHER PUBLICATIONS

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn-Oxide TFT,", AM—FPD '09 Digest of Technical Papers, Jul. 1, 2009, pp. 41-44.

Osada.T et al., "Development of Driver-Integrated Panel Using Amorphous In—Ga—Zn-Oxide TFT,", AM—FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No, 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007,vol. 38, pp. 1830-1833.

Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.

Ohara.H et al., "21.3:4.0 IN. QVGA AMOLED Display Using In—Ga—Zn-Oxide TFTS With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transitors,", IEEE Transactions on Electron Devices, Jul. 1, 1995, vol. 42, No. 7, pp. 1240-1246.

Kikuchi.H et al., "39.1:Invited Paper:Optically Isotropic NANO-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the In2O3 and SC2O3—A2O3—BO Systems [A; Fe, Ga, or Al; B; Mg, Mn, Fe, Ni, Cu, or Zn] at Temperatures over 1000° C.", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transitors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008,, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters) Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Chinese Office Action (Application No. 201010165708.4; CN12321) Dated Nov. 4, 2013.

Chinese Office Action (Application No. 201010165708.4) Dated Jul. 7, 2014.

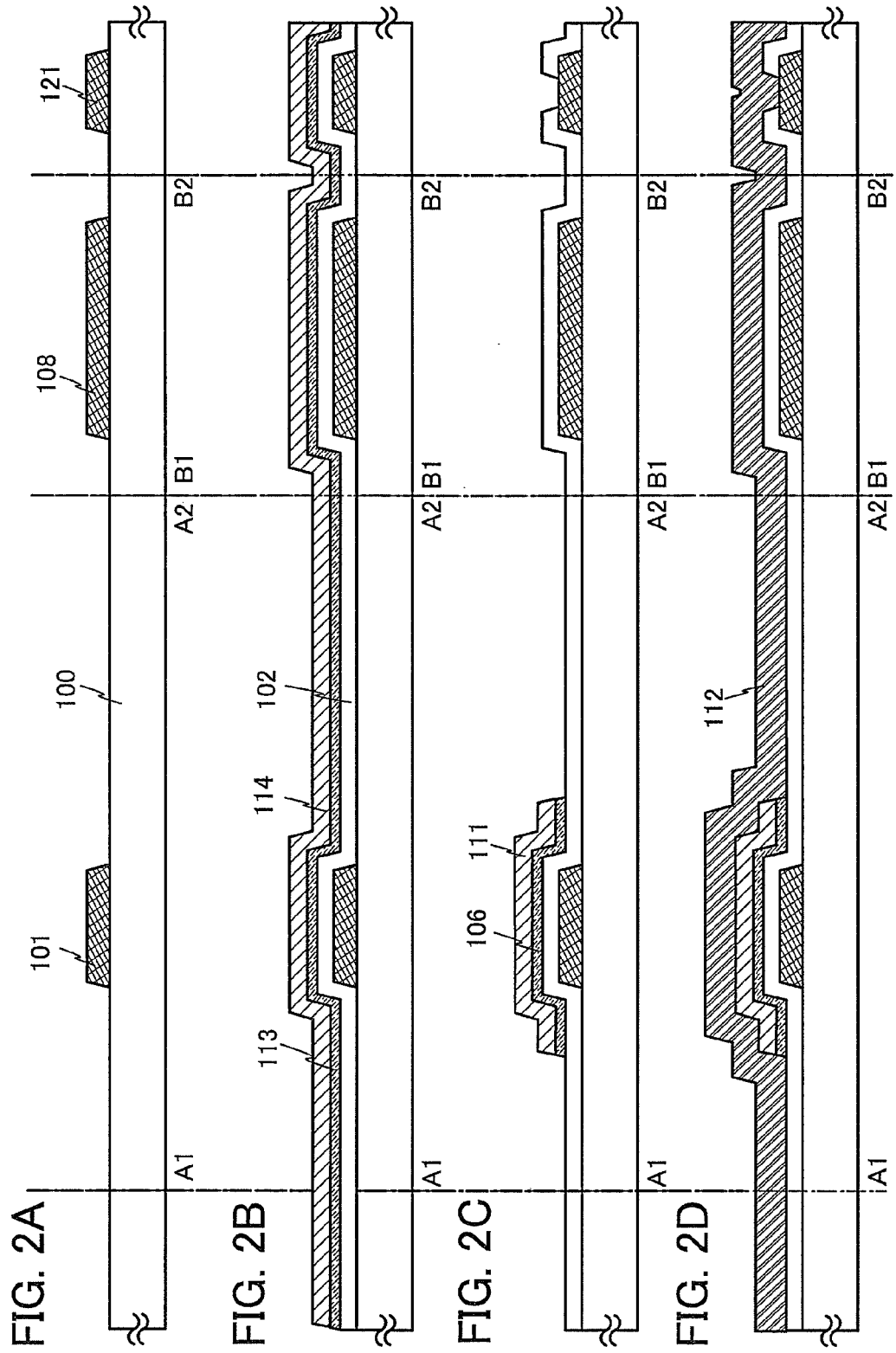

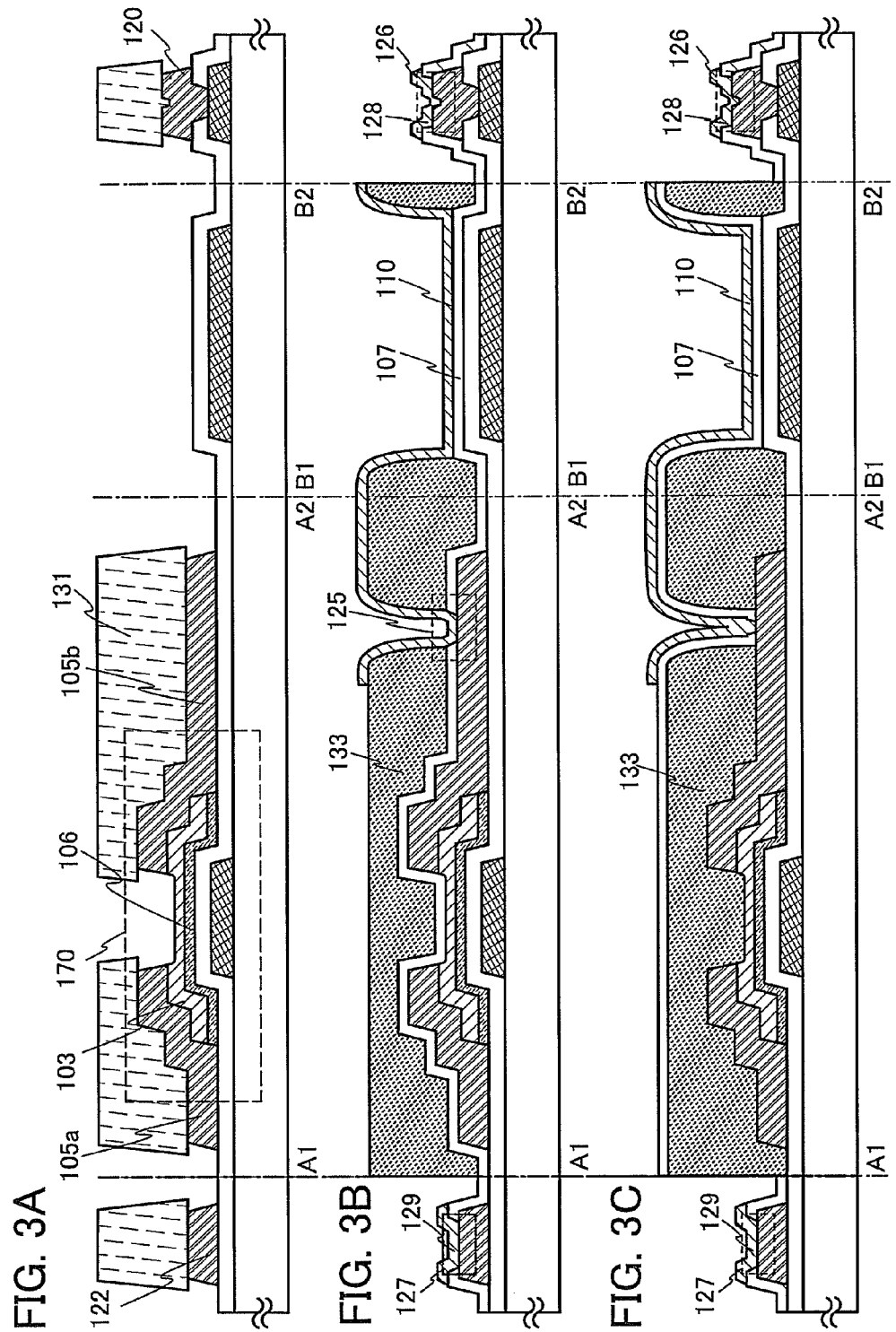

FIG. 9A1
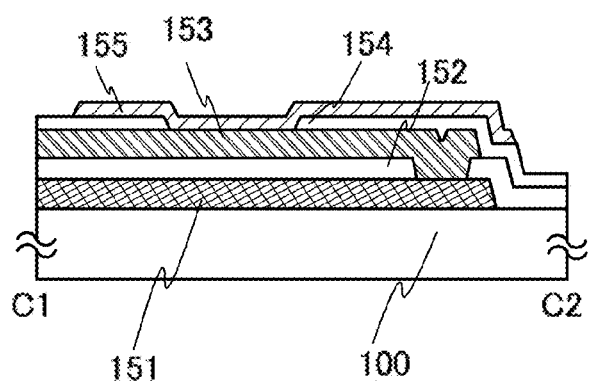
FIG. 9A2
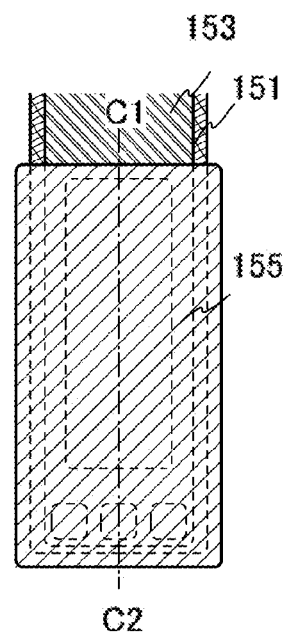
FIG. 9B1
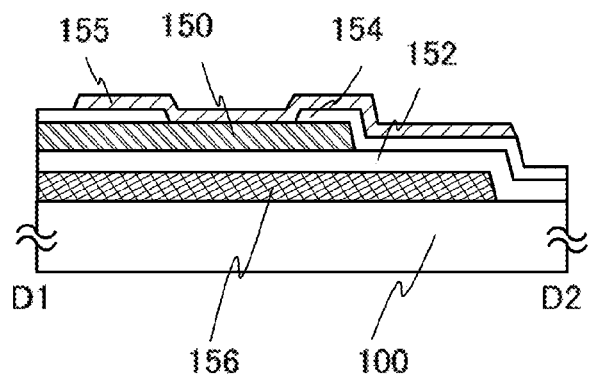
FIG. 9B2
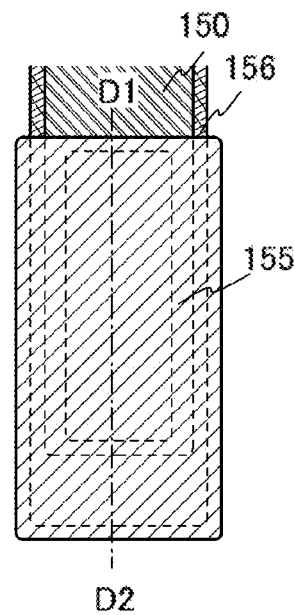

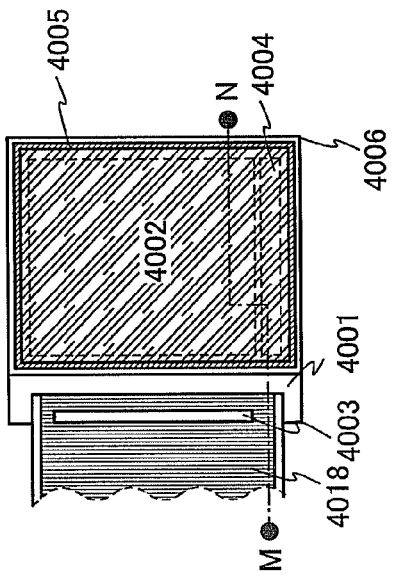
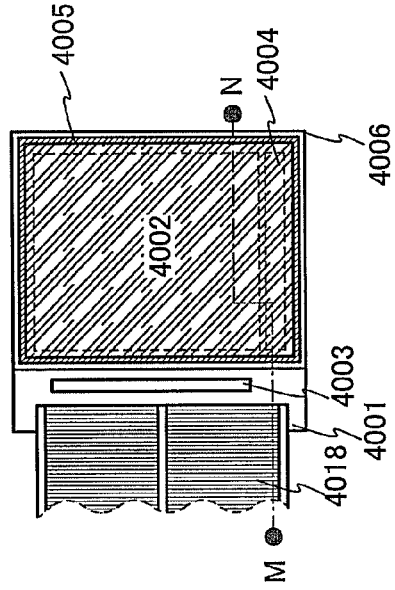
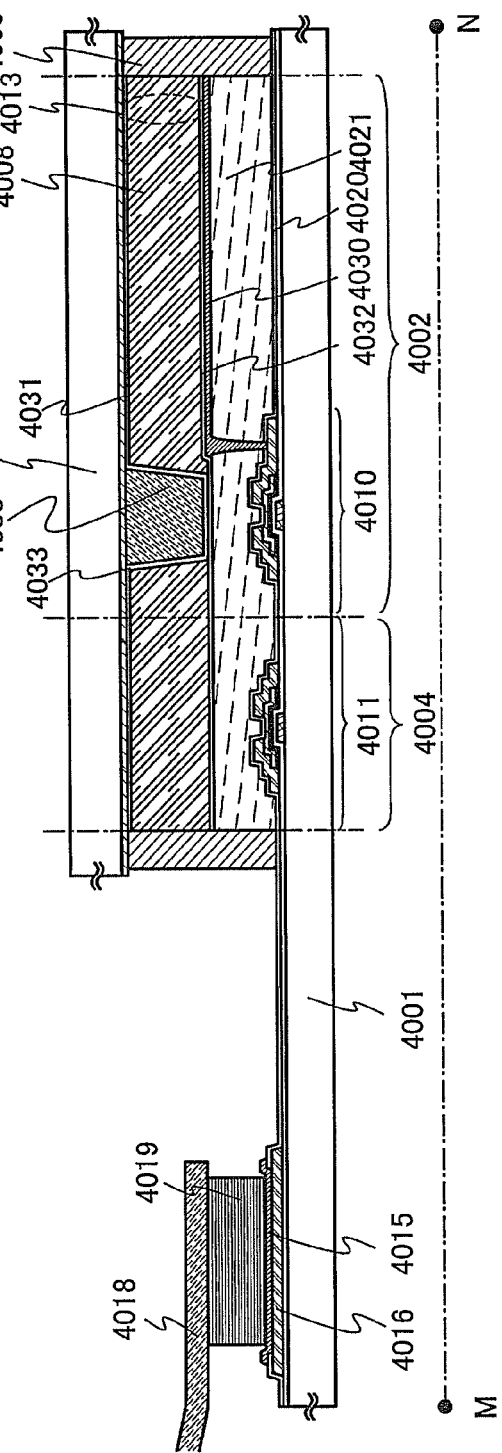

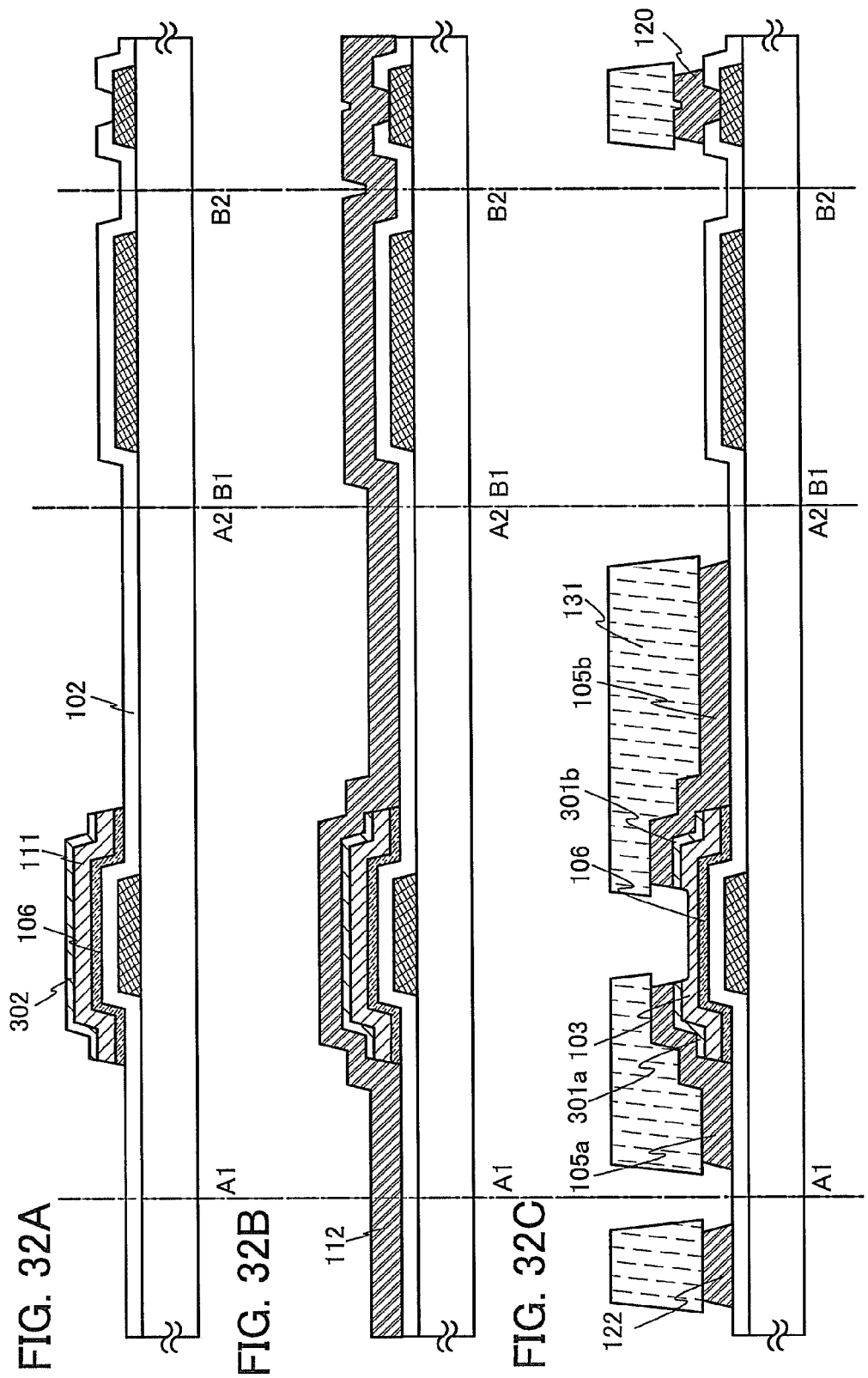

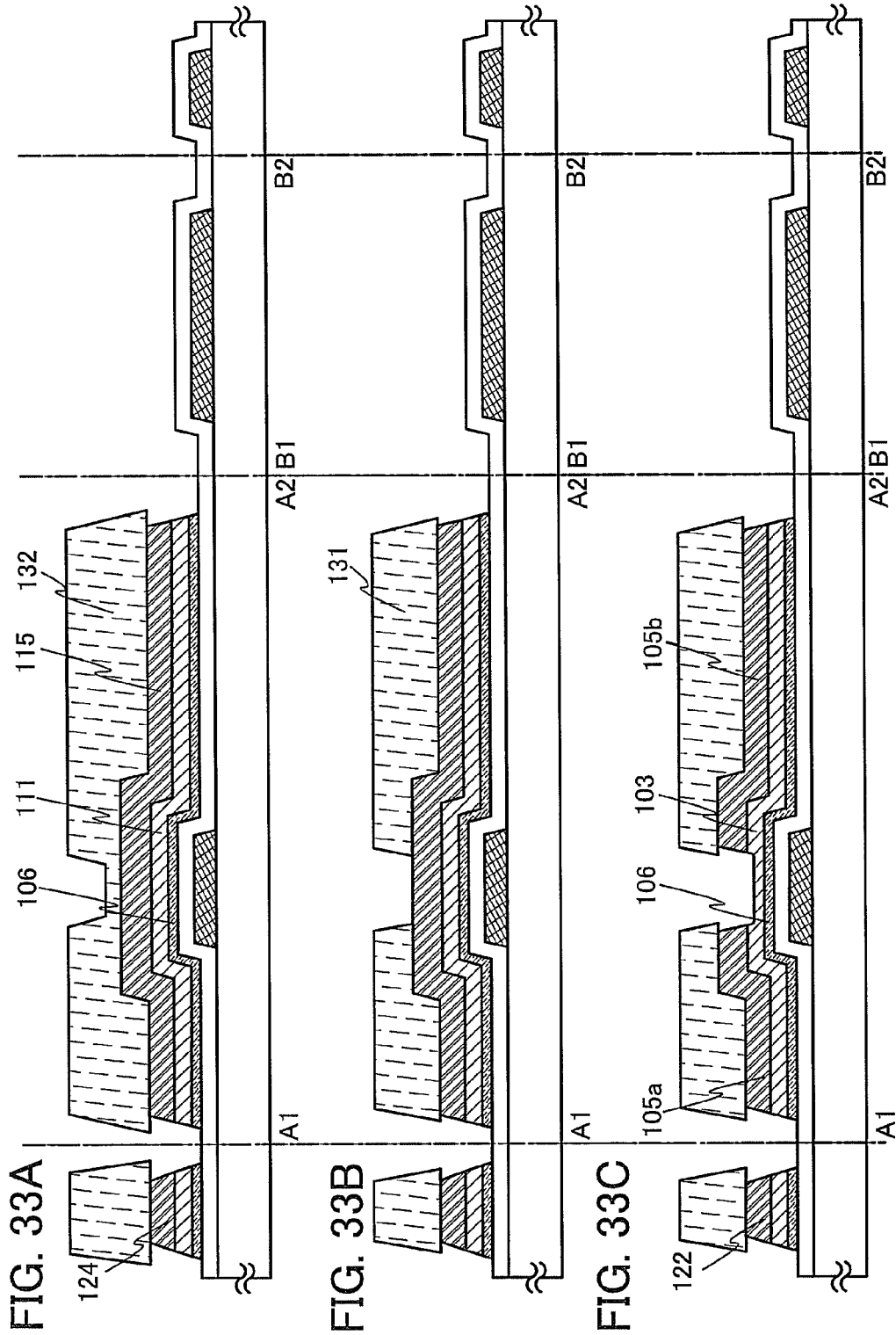

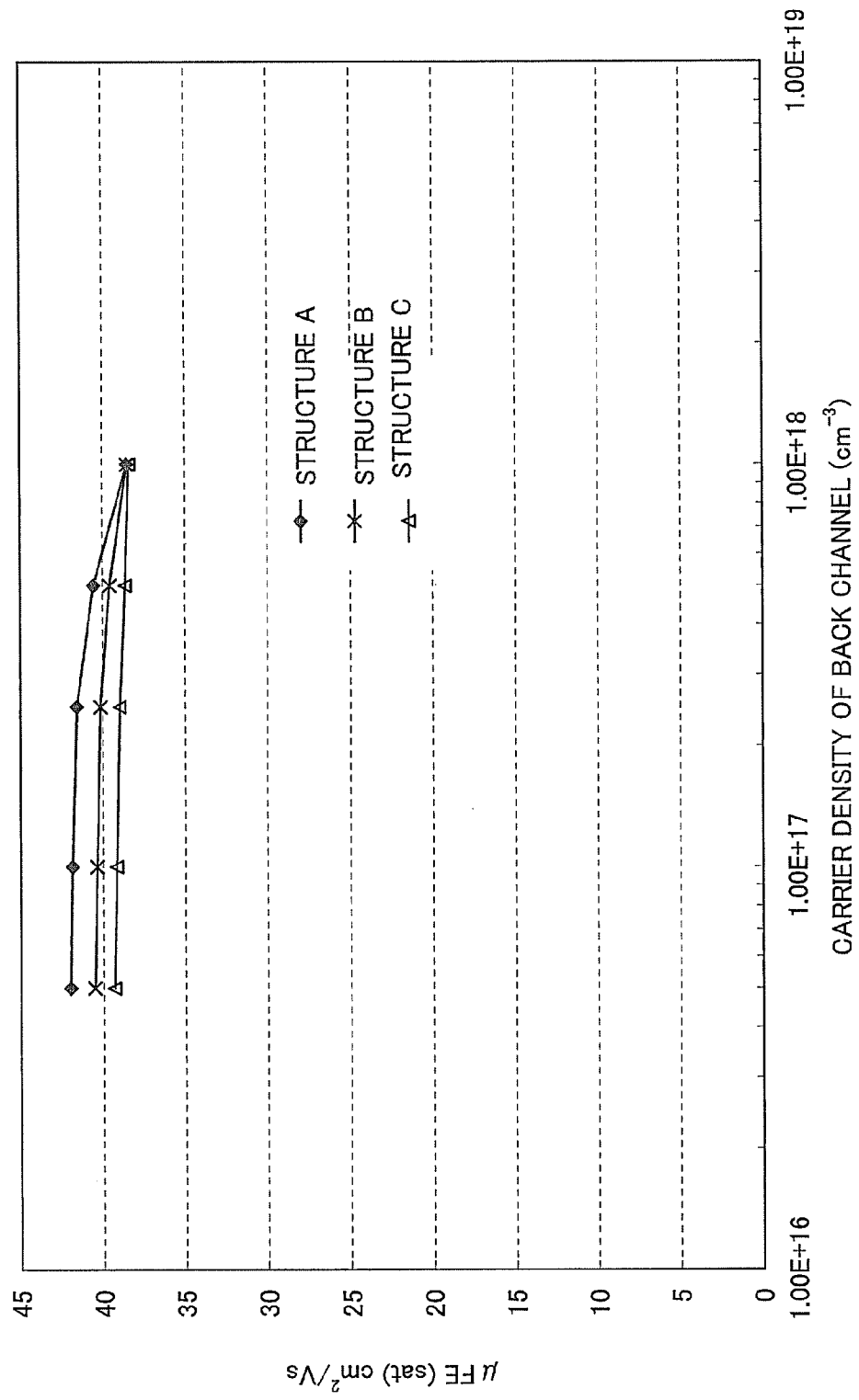

SEMICONDUCTOR DEVICE WITH OXIDE SEMICONDUCTOR LAYER

BACKGROUND OF THE INVENTION

1. Field of the Invention

The present invention relates to a semiconductor device including an oxide semiconductor, a display device including the semiconductor device, and a manufacturing method thereof.

2. Description of the Related Art

There are a wide variety of metal oxides and such metal oxides are used for various applications. Indium oxide is a well-known material and is used as a light-transmitting electrode material which is necessary for liquid crystal displays and the like.

Some metal oxides have semiconductor characteristics. As metal oxides having semiconductor characteristics, for example, there are tungsten oxide, tin oxide, indium oxide, zinc oxide, and the like, and a transistor having such a metal oxide having semiconductor characteristics in its channel formation region has been proposed (Patent Documents 1 to 4, Non-Patent Document 1).

As metal oxides, multi-component oxides as well as single-component oxides are known. For example, a homologous compound, $InGaO_3(ZnO)_m$ (m is natural number) is known as a multi-component oxide having In, Ga and Zn (Non-Patent Documents 2 to 4).

Further, it is confirmed that such an oxide semiconductor made of In—Ga—Zn-based oxide is applicable to a channel layer of a transistor (Patent Document 5 and Non-Patent Documents 5 and 6).

Having features such as high mobility, a light-transmitting property, and capability of being formed at low temperature, an In—Ga—Zn-based oxide has been attracting attention as a material for a pixel transistor of a next-generation display typified by a flexible display.

However, In and Ga in the In—Ga—Zn-based oxide are rare metals and very expensive, which may lead to an increase in transistor cost. Furthermore, In and Ga resources are in danger of depletion, and from an environment standpoint, discovery of an alternative material is desired.

[Reference]

[Patent Document]

[Patent Document 1] Japanese Published Patent Application No. S60-198861

[Patent Document 2] Japanese Published Patent Application No. H8-264794

[Patent Document 3] Japanese Translation of PCT International Application No. H11-505377

[Patent Document 4] Japanese Published Patent Application No. 2000-150900

[Patent Document 5] Japanese Published Patent Application No. 2004-103957

[Non-Patent Document]

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor" *Appl. Phys. Lett.*, 17 Jun. 1996, Vol. 68, p. 3650-3652

[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, p. 298-315

[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, p. 170-178

[Non-Patent Document 4] M. Nakamura, N. Kimizuka, T. Mohri, and M. Isobe, "Syntheses and crystal structures of new homologous compound, indium iron zinc oxides (In—$FeO_3(ZnO)_m$ (m: natural number) and related compounds", *KOTAI BUTSURI (SOLID STATE PHYSICS)*, 1993, Vol. 28, No. 5, p. 317-327

[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, p. 1269-1272

[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432, p. 488-492

SUMMARY OF THE INVENTION

It is an object of an embodiment of the present invention to provide a transistor including an oxide layer which includes Zn and does not include a rare metal such as In or Ga. It is an object of an embodiment of the present invention to reduce variation in the threshold voltage of a transistor including an oxide layer including Zn. Further, it is an object of an embodiment of the present invention to provide the transistor which includes an oxide layer including Zn and a semiconductor device including the transistor. Furthermore, it is an object of an embodiment of the present invention to provide a display device which includes the transistor including the oxide layer.

In order to achieve the above-mentioned objects, a transistor which includes an oxide layer including Zn is formed by stacking an oxide semiconductor layer including insulating oxide over an oxide layer so that the oxide layer is overlapped with a source electrode layer or a drain electrode layer with the oxide semiconductor layer including insulating oxide interposed therebetween.

An embodiment of the present invention is a semiconductor device which includes a gate electrode layer, a gate insulating layer over the gate electrode layer, an oxide layer over the gate insulating layer, an oxide semiconductor layer including insulating oxide over the oxide layer, and a source electrode layer and a drain electrode layer over the oxide semiconductor layer including insulating oxide. The oxide layer and the oxide semiconductor layer including insulating oxide include Zn, and the oxide layer and the oxide semiconductor layer including insulating oxide do not include indium. The oxide semiconductor layer including insulating oxide has an amorphous structure with a conductivity lower than that of the oxide layer, and the oxide semiconductor layer including insulating oxide is electrically connected to the source electrode layer and the drain electrode layer.

Another embodiment of the present invention is a semiconductor device which includes a gate electrode layer, a gate insulating layer over the gate electrode layer, an oxide layer over the gate insulating layer, an oxide semiconductor layer including insulating oxide over the oxide layer, buffer layers having n-type conductivity over the oxide semiconductor layer including insulating oxide, and a source electrode layer and a drain electrode layer over the buffer layers. The oxide layer and the oxide semiconductor layer including insulating oxide include Zn, and the oxide layer and the oxide semiconductor layer including insulating oxide do not include indium. The oxide semiconductor layer including insulating oxide has an amorphous structure with a conductivity lower than that of the oxide layer, and the buffer layers have a higher conductivity than the oxide semiconductor layer including insulating oxide. The oxide semiconductor layer including insulating oxide is electrically connected to the source electrode layer and the drain electrode layer through the buffer layers.

Note that the insulating oxide is preferably silicon oxide. Further, it is preferable that the oxide semiconductor layer including insulating oxide be formed by a sputtering method using a target containing $SiO_2$ at 2.5 percent by weight or more and 20 percent by weight or less. It is particularly preferable that the oxide semiconductor layer including insulating oxide be formed by a sputtering method using a target containing $SiO_2$ at 7.5 percent by weight or more and 12.5 percent by weight or less. In addition, the oxide layer is preferably an oxide semiconductor layer. The oxide layer may have a polycrystalline structure. Further, the oxide semiconductor layer including insulating oxide may include a plurality of layers, an upper layer of which is formed by a sputtering method using a target containing a larger amount of insulating oxide than a target used to form a lower layer of the plurality of layers.

Further, the buffer layers preferably include an oxide semiconductor including Zn. The oxide semiconductor layer including insulating oxide may include a region which is between the source electrode layer and the drain electrode layer and whose thickness is smaller than that of a region overlapping with the source electrode layer or the drain electrode layer. In addition, the gate electrode layer may have a width in a channel direction which is larger than that of the oxide semiconductor layer including insulating oxide and that of the oxide layer. A hollow may be formed under an end portion of the oxide semiconductor layer including insulating oxide. Further, an end portion of the oxide layer may be covered with the oxide semiconductor layer including insulating oxide.

Another embodiment of the present invention is a manufacturing method of a semiconductor device, which includes the steps of: forming a gate electrode layer over a substrate; forming a gate insulating layer over the gate electrode layer; forming an oxide film over the gate insulating layer by a sputtering method using a target containing Zn; forming an oxide semiconductor film including insulating oxide, which includes silicon oxide, over the oxide film by a sputtering method using a target containing $SiO_2$ and Zn; etching the oxide film and the oxide semiconductor film including insulating oxide to form an oxide layer and an oxide semiconductor layer including insulating oxide; forming a conductive layer over the oxide semiconductor layer including insulating oxide; and etching the oxide semiconductor layer including insulating oxide and the conductive layer to form a source electrode layer and a drain electrode layer. The target containing $SiO_2$ and Zn contains $SiO_2$ at 2.5 percent by weight or more and 20 percent by weight or less. The oxide layer and the oxide semiconductor layer including insulating oxide do not include indium.

Another embodiment of the present invention is a manufacturing method of a semiconductor device, which includes the steps of: forming a gate electrode layer over a substrate; forming a gate insulating layer over the gate electrode layer; forming an oxide film over the gate insulating layer by a sputtering method using a target containing Zn; etching the oxide film to form an oxide layer; forming an oxide semiconductor film including insulating oxide, which includes silicon oxide, over the oxide layer by a sputtering method using a target containing $SiO_2$ and Zn; etching the oxide semiconductor film including insulating oxide so that an oxide semiconductor layer including insulating oxide is formed to cover the oxide layer; forming a conductive layer over the oxide semiconductor layer including insulating oxide; and etching the oxide semiconductor layer including insulating oxide and the conductive layer to form a source electrode layer and a drain electrode layer. The target containing $SiO_2$ and Zn contains $SiO_2$ at 2.5 percent by weight or more and 20 percent by weight or less. The oxide layer and the oxide semiconductor layer including insulating oxide do not include indium.

Further, it is particularly preferable that the target containing $SiO_2$ and Zn contains $SiO_2$ at 7.5 percent by weight or more and 12.5 percent by weight or less. The oxide film and the oxide semiconductor film including insulating oxide may be etched by wet etching, so that the oxide film is side-etched to form a hollow under an end portion of the oxide semiconductor layer including insulating oxide. Further, the oxide layer may include a region which is between the source electrode layer and the drain electrode layer and whose thickness is smaller than that of a region overlapping with the source electrode layer or the drain electrode layer.

Note that ordinal numbers such as "first" and "second" in this specification are used for convenience. Therefore, they do not denote the order of steps, the stacking order of layers, and particular names which specify the invention.

In this specification, a semiconductor device refers to all types of devices which can function by utilizing semiconductor characteristics. An electro-optical device, a semiconductor circuit, and an electronic device are all included in the category of the semiconductor device.

According to an embodiment of the present invention, a transistor including an oxide layer which includes Zn and does not include a rare metal such as In or Ga can be provided. According to an embodiment of the present invention, a transistor including an oxide layer including Zn is formed by stacking an oxide semiconductor layer including insulating oxide over an oxide layer so that the oxide layer is overlaps with a source electrode layer or a drain electrode layer with the oxide semiconductor layer including insulating oxide interposed therebetween, whereby variation in the threshold voltage of the transistor can be reduced and electric characteristics can be stabilized. According to an embodiment of the present invention, a semiconductor device including the transistor can be provided.

By using the transistor for a pixel portion and a driver circuit portion of a display device, the display device can have stable electric characteristics and high reliability.

BRIEF DESCRIPTION OF THE DRAWINGS

In the accompanying drawings:

FIGS. 2A to 2D illustrate a manufacturing method of a semiconductor device according to an embodiment of the present invention;

FIGS. 3A to 3C illustrate a manufacturing method of a semiconductor device according to an embodiment of the present invention;

FIGS. 9A1 and 9A2 and FIGS. 9B1 and 9B2 illustrate a semiconductor device according to an embodiment of the present invention;

FIGS. 20A1 and 20A2 and FIG. 20B each illustrate a semiconductor device according to an embodiment of the present invention;

FIGS. 32A to 32C illustrate a manufacturing method of a semiconductor device according to an embodiment of the present invention;

FIGS. 33A to 33C illustrate a manufacturing method of a semiconductor device according to an embodiment of the present invention;

FIG. 43 show calculated saturation mobilities of transistors.

DETAILED DESCRIPTION OF THE INVENTION

Figure 1A:
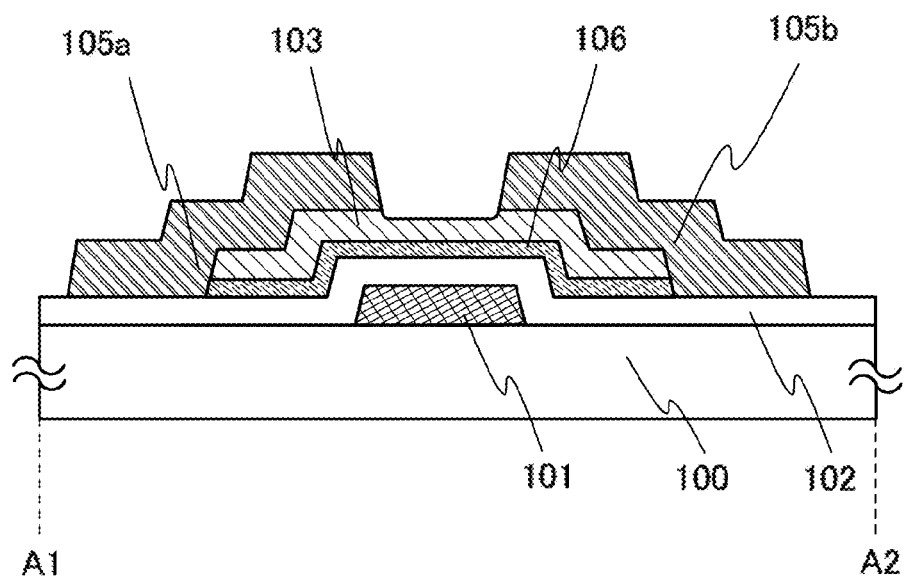
FIGS. 1A and 1B illustrate a semiconductor device according to an embodiment of the present invention.

Embodiments are described in detail with reference to drawings. The present invention is not limited to the following description, and it is easily understood by those skilled in the art that modes and details of the present invention can be changed in various ways without departing from the spirit and scope of the present invention. Therefore, the present invention is not construed as being limited to description of the embodiments below. Note that in the structures of the invention described below, the same portions or portions having similar functions are denoted by the same reference numerals through different drawings, and description of such portions is not repeated.

Embodiment 1

In this embodiment, a structure of a transistor will be described with reference to FIGS. 1A and 1B.

Figure 1B:
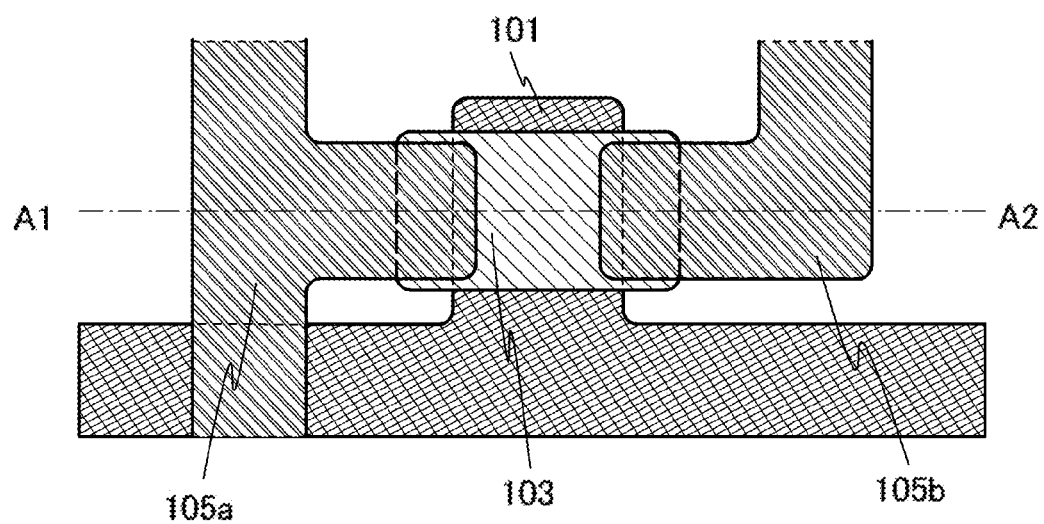

A transistor having a bottom gate structure of this embodiment is illustrated in FIGS. 1A and 1B. FIG. 1A is a cross-sectional view, and FIG. 1B is a plan view. FIG. 1A is a cross-sectional view along line A1-A2 of FIG. 1B.

In the transistor illustrated in FIGS. 1A and 1B, a gate electrode layer 101 is provided over a substrate 100, a gate insulating layer 102 is provided over the gate electrode layer 101, an oxide layer 106 is provided over the gate insulating layer 102, an oxide semiconductor layer 103 including insulating oxide is provided over the oxide layer 106, and source and drain electrode layers 105a and 105b are provided over the oxide semiconductor layer 103 including insulating oxide. Note that the oxide layer 106 and the oxide semiconductor layer 103 including insulating oxide include zinc (Zn).

The gate electrode layer 101 is formed to have a single-layer structure or a layered structure using a metal material such as aluminum, copper, molybdenum, titanium, chromium, tantalum, tungsten, neodymium, or scandium; an alloy material containing any of these metal materials as its main component; or a nitride containing any of these metal materials as its component. The gate electrode layer 101 is desirably formed using a low-resistance conductive material such as aluminum or copper; however, the low-resistance conductive material has disadvantages of having low heat resistance and being easily eroded. Thus, the low-resistance conductive material is preferably used in combination with a heat-resistant conductive material. As the heat-resistant conductive material, molybdenum, titanium, chromium, tantalum, tungsten, neodymium, scandium, or the like is used.

For example, as a layered structure of the gate electrode layer 101, a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, or a two-layer structure in which a molybdenum layer is stacked over a titanium nitride layer is preferable. Alternatively, a three-layer structure in which a tungsten layer or a tungsten nitride layer, an aluminum-silicon alloy layer or an aluminum-titanium alloy layer, and a titanium nitride layer or a titanium layer are stacked is preferably used.

The oxide layer 106 includes a Zn—O-based or Sn—Zn—O-based oxide and is preferably an oxide semiconductor. Note that the oxide layer 106 is not necessarily an oxide semiconductor and may have a conductive property. Further, the oxide layer 106 may have any of an amorphous structure, a polycrystalline structure, a single crystal structure, and a structure including crystal grains (nano crystals). The crystal grains (nanocrystals) each have a diameter of 1 nm to 10 nm, typically approximately 2 nm to 4 nm. Note that the crystal state is evaluated by X-ray diffraction (XRD) analysis.

In this specification, Zn—O-based oxide means oxide including at least Zn, and a Zn—O-based oxide semiconductor means an oxide semiconductor including at least Zn. In addition, Sn—Zn—O-based oxide means oxide including at least Sn and Zn, and a Sn—Zn—O-based oxide semiconductor means an oxide semiconductor including at least Sn and Zn. The above-mentioned oxides and oxide semiconductors may include one or more of metal elements selected from Fe, Ni, Mn, or Co.

Here, if an oxide semiconductor film having a polycrystalline structure or single crystal structure with high electron intrinsic mobility is used for the oxide layer 106, transistor mobility can be improved. Alternatively, if the oxide layer 106 formed having an amorphous structure or a structure including crystal grains is subjected to heat treatment during the manufacture of the transistor to have a polycrystalline structure or a single crystal structure, transistor mobility can be improved.

The thickness of the oxide layer 106 is 10 nm to 300 nm, preferably 20 nm to 100 nm.

The oxide semiconductor layer 103 including insulating oxide is an amorphous film in which insulating oxide is made to be contained in a Zn—O-based or Sn—Zn—O-based oxide semiconductor, and has a conductivity lower than the oxide layer 106. Here, as the insulating oxide, silicon oxide is preferable. Further, nitrogen may be added to the insulating oxide. Note that the crystal state is evaluated by X-ray diffraction (XRD) analysis in a manner similar to that of the oxide layer 106.

Further, the oxide semiconductor layer 103 including insulating oxide is preferably formed by a sputtering method using a target containing $SiO_2$ at 2.5 percent by weight to 20 percent by weight inclusive, more preferably at 7.5 percent by weight to 12.5 percent by weight inclusive.

The thickness of the oxide semiconductor layer 103 including insulating oxide is 10 nm to 300 nm, preferably 20 nm to 100 nm. The oxide semiconductor layer 103 including insulating oxide has a region which is between the source and drain electrode layers 105a and 105b and whose thickness is smaller than that of a region overlapping with the source or drain electrode layer 105a or 105b.

The oxide semiconductor layer 103 including insulating oxide includes insulating oxide such as silicon oxide, whereby crystallization of the oxide semiconductor layer 103 including insulating oxide can be suppressed and thus the oxide semiconductor layer 103 including insulating oxide can have an amorphous structure with reduced conductivity. Suppression of crystallization and the amorphous structure with reduced conductivity in the oxide semiconductor layer 103 including insulating oxide can reduce variation in the threshold voltage which is caused by carriers formed in a back channel of the oxide semiconductor layer 103 including insulating oxide, which is formed during the manufacture of the transistor. Thus, variation in transistor characteristics can be reduced and the characteristics can be stabilized. Further, by the insulating oxide such as silicon oxide included in the oxide semiconductor layer 103, even when heat treatment at 300° C. to 600° C. is performed during the manufacture of the transistor, crystallization of the oxide semiconductor layer 103 or generation of a microcrystal grain in the oxide semiconductor layer 103 including insulating oxide can be prevented.

Furthermore, in the transistor described in this embodiment, the oxide layer 106 and the oxide semiconductor layer 103 including insulating oxide can be formed without using rare metals such as indium (In) and gallium (Ga), whereby manufacturing cost of the transistor can be suppressed.

The source and drain electrode layers 105a and 105b can be formed using a metal material such as aluminum, copper, molybdenum, titanium, chromium, tantalum, tungsten, neodymium, or scandium; an alloy material containing any of these metal materials as its main component; or a nitride containing any of these metal materials as its component. The source and drain electrode layers 105a and 105b are desirably formed using a low-resistance conductive material such as aluminum or copper; however, the low-resistance conductive material has disadvantages of having low heat resistance and being easily eroded. Thus, the low-resistance conductive material is preferably used in combination with a heat-resistant conductive material. As the heat-resistant conductive material, molybdenum, titanium, chromium, tantalum, tungsten, neodymium, scandium, or the like is used.

For example, the source and drain electrode layers 105a and 105b preferably have a three-layer structure in which a first conductive layer and a third conductive layer are formed using titanium that is a heat-resistant conductive material, and a second conductive layer is formed using an aluminum alloy containing neodymium that has low resistance. The source and drain electrode layers 105a and 105b having such a structure can reduce generation of hillocks while making use of low resistance of aluminum. Without limitation thereto, the source and drain electrode layers 105a and 105b may have a single layer structure, a two-layer structure, or a structure of four or more layers.

Next, a phenomenon in which ZnO including $SiO_2$, which is formed by making insulating oxide $SiO_2$ included in an oxide semiconductor ZnO including single crystal Zn (zinc), has an amorphous structure will be described based on the classical molecular dynamics simulation. An empirical potential which characterizes the interaction between atoms is defined in the classical molecular dynamics method, so that force that acts on each atom is evaluated. A law of classical mechanics is applied to each atom and Newton's equation of motion is numerically solved, whereby motion (time-dependent change) of each atom can be deterministically tracked.

Calculation models and calculation conditions will be described below. In this calculation, a molecular dynamics calculation software "Materials Explorer", which is manufactured by Fujitsu Limited, was used. A Born-Mayer-Huggins potential was used as the empirical potential.

Figure 36:
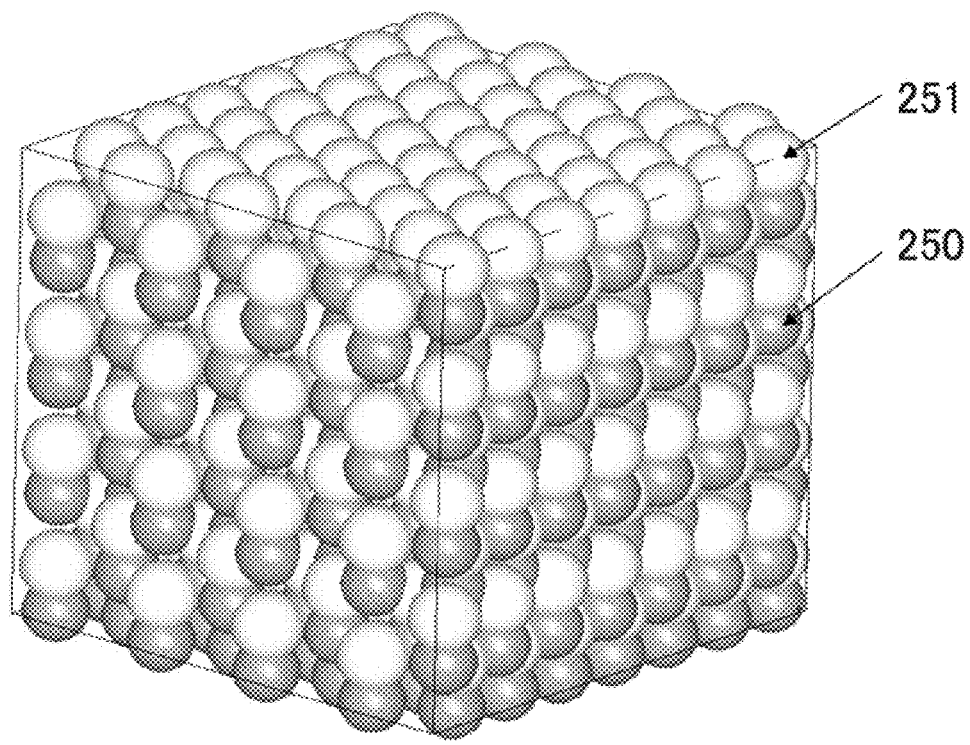
FIG. 36 shows a single crystal structure of ZnO which was used in calculation.

A single crystal ZnO formed of 896 atoms, which was used as a calculation model, is shown in FIG. 36. As shown in FIG. 36, the single crystal ZnO is formed of 250 zinc atoms (Zn) and 251 oxygen atoms (O). The 250 zinc atoms (Zn) in this structure are replaced with silicon atoms (Si) and oxygen atoms (O) with varying amount of replacement. Considering electric charge of each atom (Zn: +2, O: −2, Si: +4), three Zn atoms were replaced with two Si atoms and one O atom.

Structures where the amounts of replacement are 2.5 percent by weight, 4.9 percent by weight, 7.6 percent by weight, 10.0 percent by weight, 12.5 percent by weight, 15.0 percent by weight, 17.5 percent by weight, and 20.0 percent by weight were formed. The amount of replacement is defined as Formula I below. The structure in which Zn is replaced with Si and O is referred to as a ZnO replacement structure.

$$X \text{ weight \% replacement} = \frac{\text{mass of Si and O replaced with Zn (g)}}{\text{mass of ZnO replacement structure (g)}}$$ [Formula 1]

The classical molecular dynamics simulation was performed on the single crystal ZnO and the eight ZnO replacement structures under conditions where the temperature was set at 350° C.; the pressure was set at 1 atm; the total simulation time was set at 400 psec (time step of 0.2 fsec×2 million steps); and the number of atoms, the temperature, and the pressure were fixed.

Figure 37A:
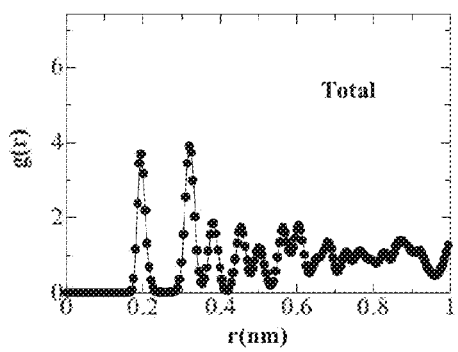
FIGS. 37A to 37E show radial distribution functions of ZnO which were obtained by calculation.
Figure 37B:
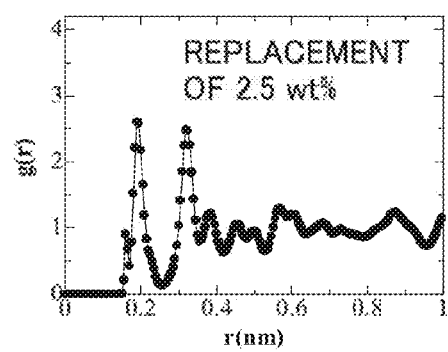
Figure 37C:
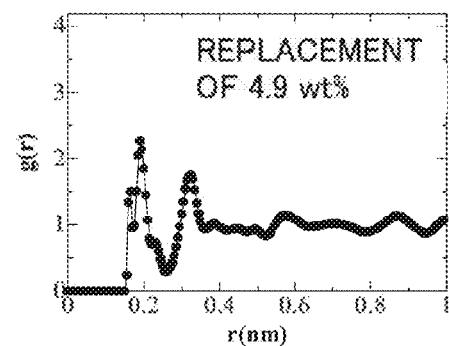
Figure 37D:
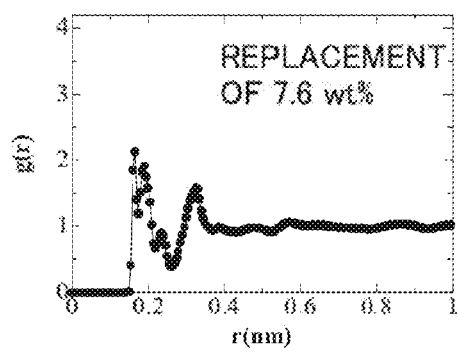
Figure 37E:
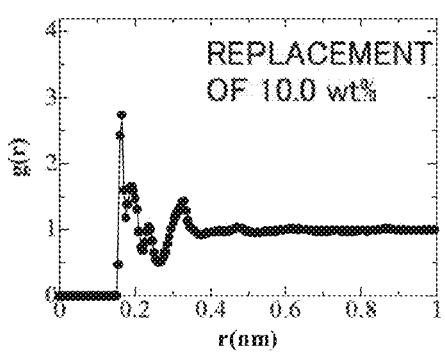
Figure 38A:
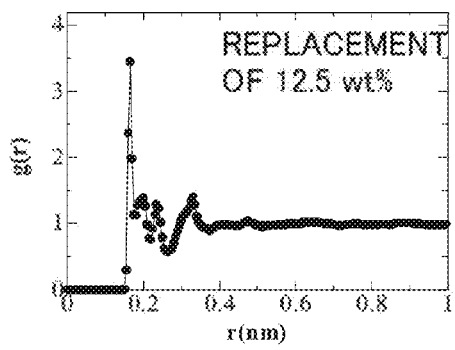
FIGS. 38A to 38D show radial distribution functions of ZnO which were obtained by calculation.
Figure 38B:
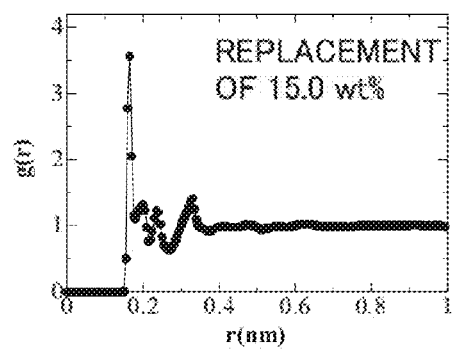
Figure 38C:
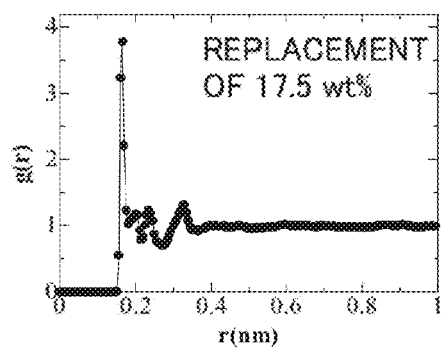
Figure 38D:
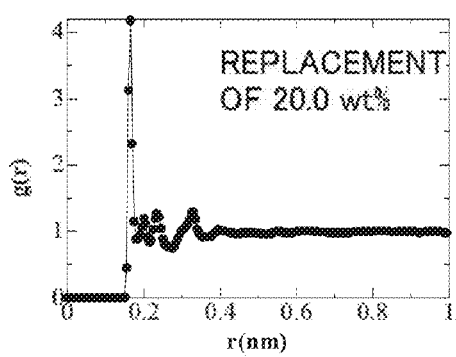

The radial distribution functions g(r) calculated from the pair correlation function with the use of classical molecular dynamics simulation results are shown in FIGS. 37A to 37E and FIGS. 38A to 38D. FIG. 37A shows the radial distribution function of single crystal ZnO, and FIGS. 37B to 37E and FIGS. 38A to 38D show the radial distribution functions of the ZnO replacement structures with the amounts of replacement of 2.5 percent by weight to 20.0 percent by weight. Note that the radial distribution function g(r) is a function representing the probability density of atoms existing at a distance r from one atom. As the correlation between atoms disappears, g(r) becomes closer to 1.

From comparison of the radial distribution functions g(r) of the calculation models in FIGS. 37A to 37E and FIGS. 38A to 38D, it is found that the single crystal structure and the ZnO replacement structures with the amounts of replacement of 2.5 percent by weight to 7.6 percent by weight have a peak in their radical distribution functions g(r) even at long distance r and have a long-range order. However, the ZnO replacement structures with the amounts of replacement of 10.0 percent by weight or more do not have peaks in their radical distribution functions g(r) in a distance r range of 0.6 nm or more and do not have a long-range order. Thus, it is recognized that the ZnO replacement structures with the amounts of replacement of 10.0 percent by weight or more have an amorphous phase.

Figure 39A:
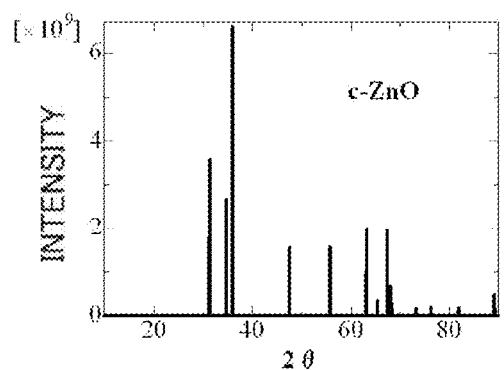
FIGS. 39A to 39E show intensities obtained by simulation of XRD analysis.
Figure 39B:
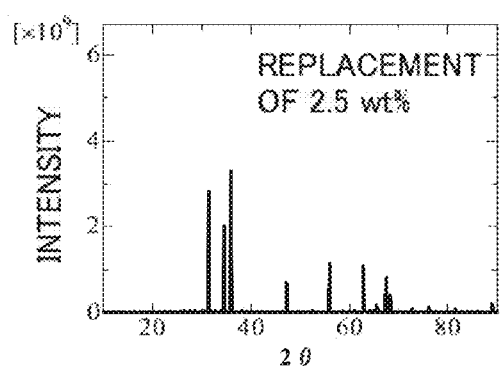
Figure 39C:
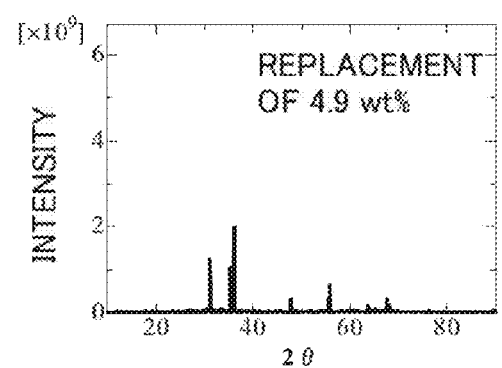
Figure 39D:
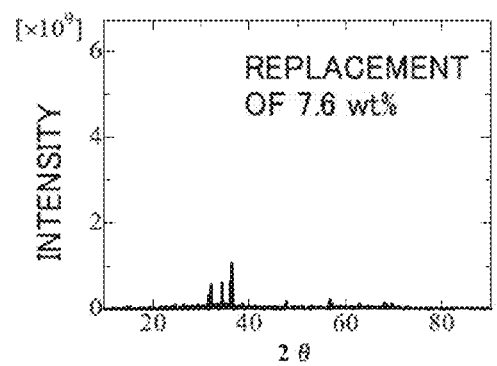
Figure 39E:
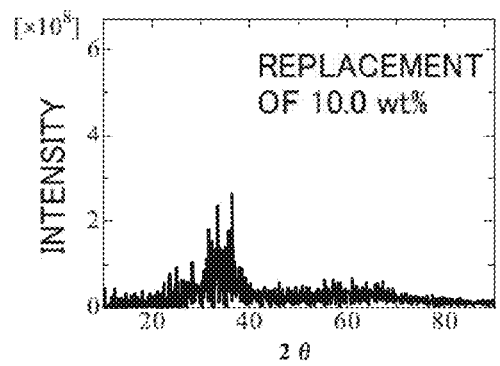
Figure 40A:
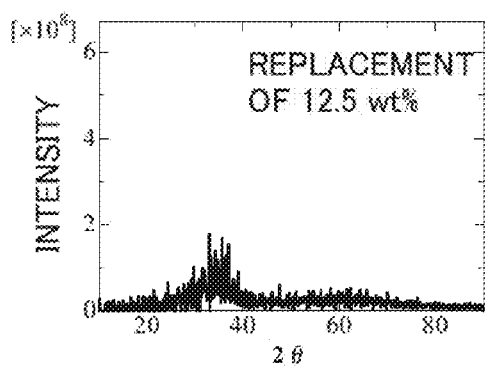
FIGS. 40A to 40D show intensities obtained by simulation of XRD analysis.
Figure 40B:
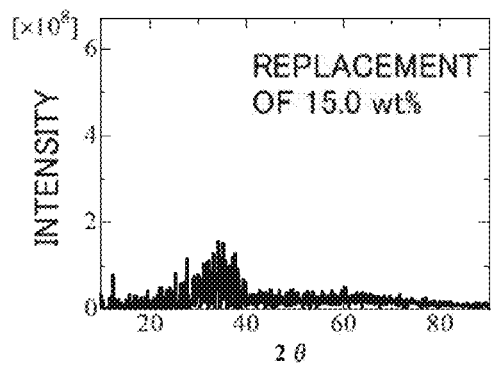
Figure 40C:
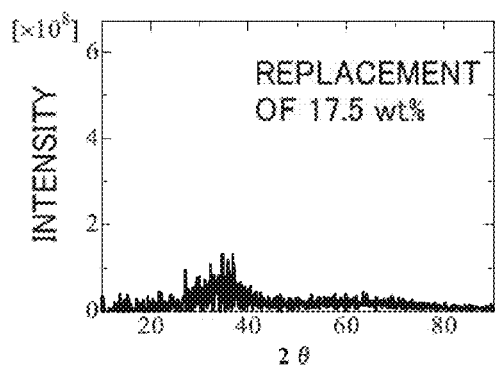
Figure 40D:
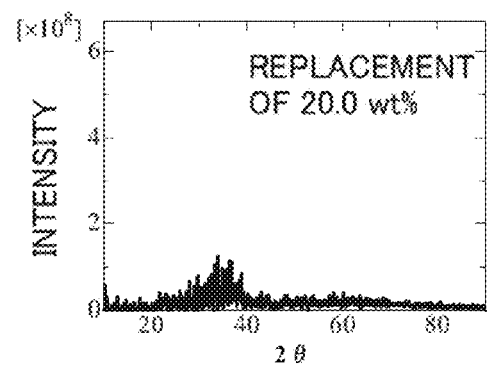

Next, results of simulation of XRD analysis performed on the single crystal ZnO and the eight ZnO replacement structures which were obtained by classical molecular dynamics simulation are shown in FIGS. 39A to 39E and FIGS. 40A to 40D. FIG. 39A shows X-ray intensity of the single crystal ZnO, and FIGS. 39B to 39E and FIGS. 40A to 40D show X-ray intensities of the ZnO replacement structures with the amounts of replacement of 2.5 percent by weight to 20.0 percent by weight. Note that the X-ray wavelength used for the calculation is 0.154138 nm (Cu Kα).

From comparison of XRD analysis simulation results of the calculation models in FIGS. 39A to 39E and FIGS. 40A to 40D, it is found that the ZnO replacement structures with the amounts of replacement of 2.5 percent by weight or more have peaks lower than those of the ZnO single crystal structure. From this, it is understood that when the amount of replacement equals or exceeds 2.5 percent by weight, entire breakdown of the single crystal structure starts and the ZnO replacement structure start changing to have an amorphous phase. Although the ZnO replacement structures with the amounts of replacement of 7.6 percent by weight or less have slight peaks, the ZnO replacement structures with the amounts of replacement of 10.0 percent by weight or more have a broad peak. Thus, it is recognized that the ZnO replacement structures with the amounts of replacement of 10.0 percent by weight or more almost completely have an amorphous phase.

The above-described calculation results points to the fact that ZnO is likely to have an amorphous structure when $SiO_2$ is included therein. An actual ZnO thin film including $SiO_2$ obtained by a sputtering method is an amorphous film immediately after deposition. Thus, according to these calculation results, inclusion of $SiO_2$ enables crystallization of ZnO to be hindered even if heat treatment is performed and the amorphous structure to be kept.

Next, effects of the transistor in which an oxide semiconductor layer of ZnO including insulating oxide $SiO_2$ is stacked over an oxide semiconductor layer of ZnO will be described on the basis of calculation results obtained with a calculator. Here, variation in the threshold voltage of a transistor due to carriers generated in a back channel is examined. Note that in this specification, a back channel is a portion of an active layer in a transistor, which is overlapped with neither a source electrode layer nor a drain electrode layer.

Figure 41A:
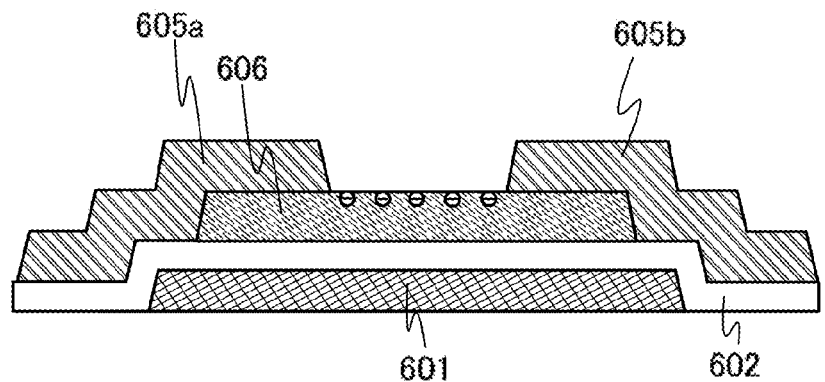
FIGS. 41A to 41C illustrate structures of transistors which were used for calculation.
Figure 41B:
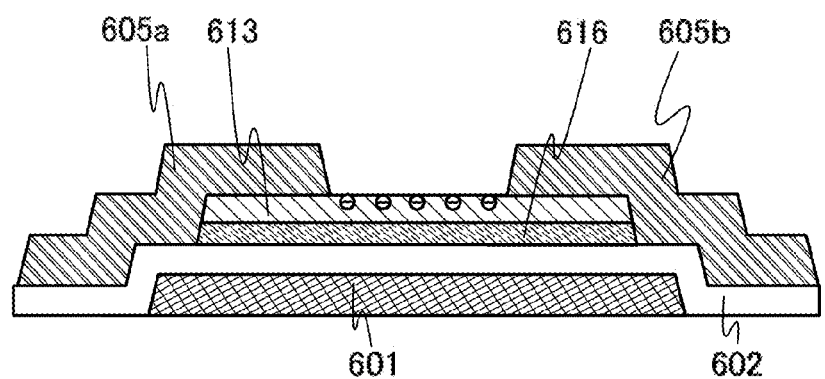
Figure 41C:
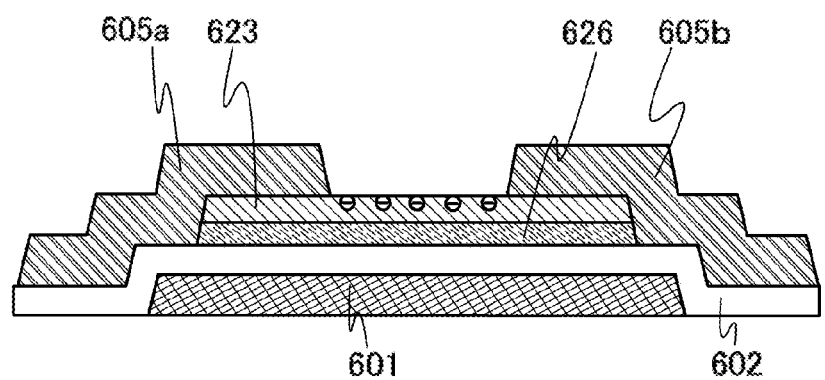

FIGS. 41A to 41C illustrate structures of transistors used as calculation models. Each of the transistors includes a gate electrode layer 601, a gate insulating layer 602 provided over the gate electrode layer 601, an active layer formed using an oxide semiconductor, which is provided over the gate insulating layer 602, and source and drain electrode layers 605a and 605b provided over the active layer. The channel length of the transistor was 10 μm and the channel width thereof was 100 μm. The gate electrode layer 601 was assumed to be a tungsten layer with a thickness of 100 nm, and the work function thereof was assumed to be 4.6 eV. The gate insulating layer 602 was assumed to be a silicon oxynitride layer with a thickness of 100 nm, and the dielectric constant thereof was assumed to be 4.1. In addition, the source and drain electrode layers 605a and 605b were assumed to be a titanium layer with a thickness of 100 nm, and the work function thereof was assumed to be 4.3 eV.

Here, it is known that in an oxide semiconductor, excess carriers are generated due to oxygen vacancy or entry of moisture or hydrogen. In the back channel of the transistor, oxygen vacancy is likely to occur due to plasma damage caused when the source and drain electrode layers 605a and 605b are formed by etching, and thus excess carries are likely to be generated. Further, there is a possibility that excess carriers may be generated in the back channel due to entry of moisture or hydrogen from the air or an interlayer film. Therefore, carriers (electrons) generated due to oxygen vacancy or entry of moisture or hydrogen through steps of etching, deposition, and the like were assumed to exist in the back channel of each of the transistors.

The transistor having structure A in FIG. 41A has an active layer formed of a single-layer oxide semiconductor layer 606. It was assumed that the oxide semiconductor layer 606 was a Zn—O-based non-single-crystal film with a thickness of 60 nm, the electron intrinsic mobility thereof was 40 $cm^2$/Vs, the band gap (Eg) was 3.05 eV, and the electron affinity (χ) was 4.3 eV.

The transistor having structure B in FIG. 41B has an active layer having a layered structure of an oxide semiconductor layer 616 and an oxide semiconductor layer 613 including insulating oxide, which is formed over the oxide semiconductor layer 616. It was assumed that the oxide semiconductor layer 613 including insulating oxide was a Zn—O-based non-single-crystal film including silicon oxide and had a thickness of 30 nm, and the electron intrinsic mobility thereof was 4 cm$^2$/Vs. Since a Zn—O-based non-single-crystal film changes to have an amorphous phase by including silicon oxide as described in the above classical molecular dynamics simulation, the electron intrinsic mobility is lowered. It was also assumed that the oxide semiconductor layer 616 was a Zn—O-based non-single-crystal film with a thickness of 30 nm, and the electron intrinsic mobility thereof was 40 cm$^2$/Vs. It was also assumed that the oxide semiconductor layer 613 including insulating oxide and the oxide semiconductor layer 616 each had a band gap (Eg) of 3.05 eV and an electron affinity ($\chi$) of 4.3 eV.

The transistor having structure C in FIG. 41C has an active layer having a layered structure of an oxide semiconductor layer 626 and an oxide semiconductor layer 623 including insulating oxide, which is formed over the oxide semiconductor layer 626. It is to be noted that the oxide semiconductor layer 623 including insulating oxide of the structure C includes a larger amount of silicon oxide than the oxide semiconductor layer 613 including insulating oxide of the structure B. It was assumed that the oxide semiconductor layer 623 including insulating oxide was a Zn—O-based non-single-crystal film including silicon oxide and had a thickness of 30 nm, and the electron intrinsic mobility thereof was 0.4 cm$^2$/Vs. Since the Zn—O-based non-single-crystal film includes a large amount of silicon oxide as compared to the structure B, the electron intrinsic mobility thereof was lower than that in the structure B. It was also assumed that the oxide semiconductor layer 626 was a Zn—O-based non-single-crystal film with a thickness of 30 nm, and the electron intrinsic mobility thereof was 40 cm$^2$/Vs. It was also assumed that the oxide semiconductor layer 623 including insulating oxide and the oxide semiconductor layer 626 each had a band gap (Eg) of 3.05 eV and an electron affinity ($\chi$) of 4.3 eV.

As for carriers (electrons) generated due to oxygen vacancy or entry of moisture or hydrogen in steps of etching, deposition, and the like, the carrier densities were assumed to be $5\times10^{16}$ cm$^{-3}$, $1\times10^{17}$ cm$^{-3}$, $2.5\times10^{17}$ cm$^{-3}$, $5\times10^{17}$ cm$^{-3}$, and $1\times10^{18}$ cm$^3$ at a depth of 5 nm from a surface of the back channel of each of the transistors, and the threshold voltages in the cases of respective carrier densities were calculated by calculator simulation.

Note that a device simulation software "Atlas" manufactured by Silvaco Data Systems Inc. was used for calculation of the models.

Figure 42:
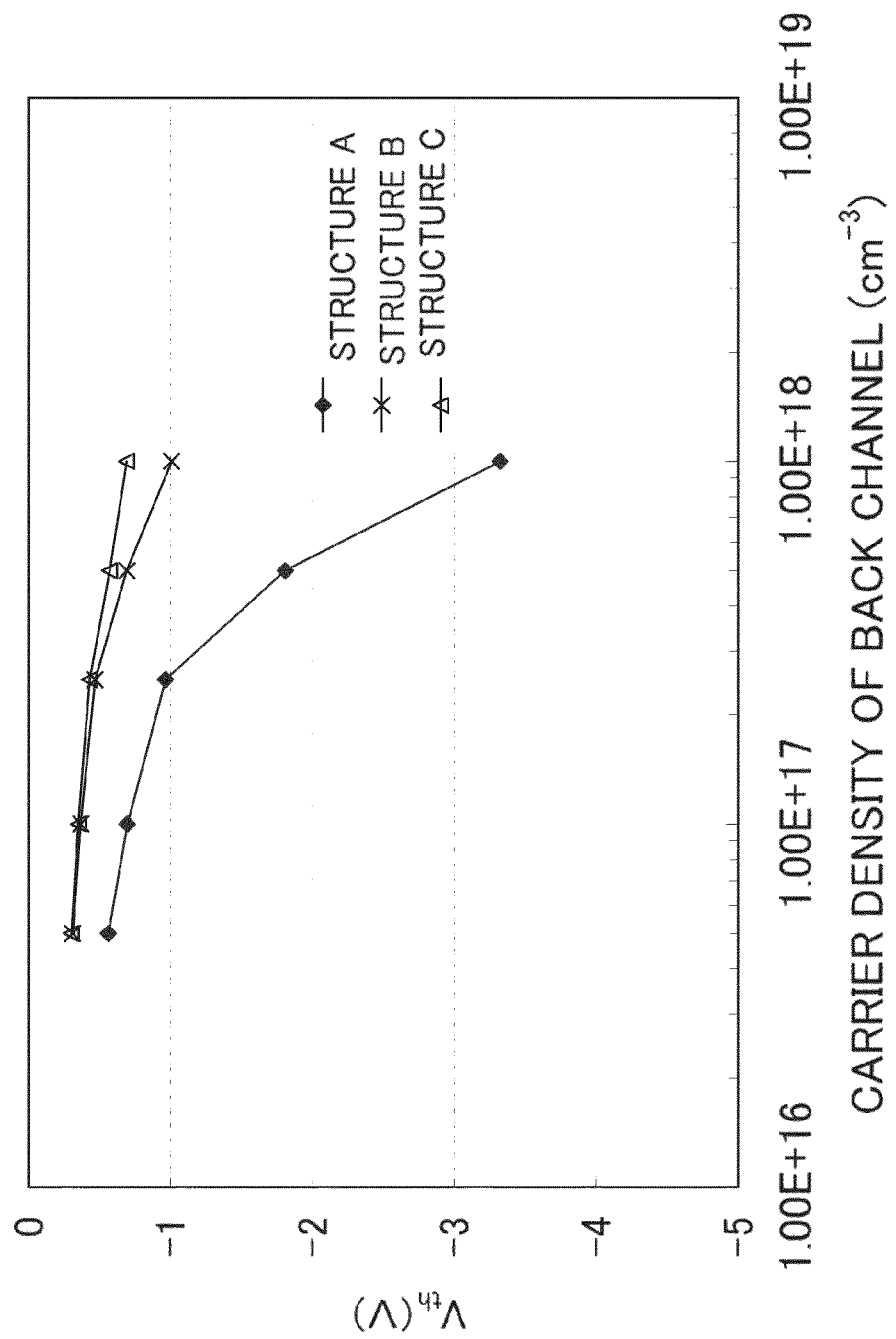
FIG. 42 show calculated threshold voltages of transistors.

FIG. 42 shows the dependence of the threshold voltage on the carrier density of the back channel in the transistors having the structures shown in FIGS. 41A to 41C. In FIG. 42, the vertical axis represents the threshold voltage (Vth [V]) of the transistors having the structures and the horizontal axis represents the density of carriers (cm$^{-3}$) generated in the back channel of the active layer of each structure.

In this calculation, the threshold voltage (Vth [V]) of the transistor is defined, in a graph where the horizontal axis and the vertical axis indicate the gate voltage (Vg [V]) and the square root of drain current (Id$^{1/2}$) respectively, as a point of intersection of the extrapolated tangent line of Id$^{1/2}$ having the highest inclination with the Vg axis.

As shown in FIG. 42, in the case of the transistor having structure A, as the carrier density of the back channel is increased, the absolute value of the threshold voltage is also increased. The threshold voltage of the structure A is shifted by about 2.7 V when the carrier density of the back channel is changed from $5\times10^{16}$ cm$^{-3}$ to $1\times10^{18}$ cm$^{-3}$.

As compared to the structure A, the structure B where the active layer has a layered structure of the oxide semiconductor layer 616 and the oxide semiconductor layer 613 including insulating oxide, has a smaller increase in absolute value of the threshold voltage with respect to the carrier density of the back channel. The threshold voltage of the structure B is shifted by only about 0.7 V when the carrier density of the back channel is changed from $5\times10^{16}$ cm$^{-3}$ to $1\times10^{18}$ cm$^{-3}$.

Furthermore, in the case of the structure C where the oxide semiconductor layer 623 including insulating oxide includes a larger amount of silicon oxide than the oxide semiconductor layer including insulating oxide of the structure B, an increase in absolute value of the threshold voltage with respect to the carrier density of the back channel is smaller than that of the structure B. The threshold voltage of the structure C is shifted by only about 0.4 V when the carrier density of the back channel is changed from $5\times10^{16}$ cm$^{-3}$ to $1\times10^{18}$ cm$^{-3}$.

Further, FIG. 43 shows the dependence of the saturation mobility on the carrier density of the back channel in the transistors having the structures shown in FIGS. 41A to 41C. The vertical axis represents the saturation mobility ($\mu_{FE}$(sat) [cm$^2$/Vs]) of the transistors having the structures and the horizontal axis represents the density of carriers (cm$^{-3}$) generated in the back channel of the active layer of each structure.

FIG. 43 shows that the transistors having the structure B and the structure C each have an almost the same saturation mobility as the transistor having the structure A and that as the carrier density of the back channel increases, the mobility of each of the transistor having the structure B and the transistor having the structure C becomes closer to the mobility of the transistor having the structure A. Therefore, even when an oxide semiconductor layer including insulating oxide with a low electron intrinsic mobility is stacked and thus variation in the threshold voltage due to carriers of a back channel is reduced, the saturation mobility and the on current of the transistor can be held.

Thus, it is proved that an active layer of a transistor formed to have a layered structure of an oxide semiconductor layer including insulating oxide and an oxide semiconductor layer can reduce variation in the threshold voltage due to carriers of a back channel without the saturation mobility of the transistor being reduced. Therefore, when a transistor having an active layer formed by stacking an oxide semiconductor layer including insulating oxide and an oxide semiconductor layer is used in a pixel portion of an image display device, variation in the threshold voltage of the switching transistor can be reduced and thus variation in luminance between pixels can be reduced.

Figure 34A:
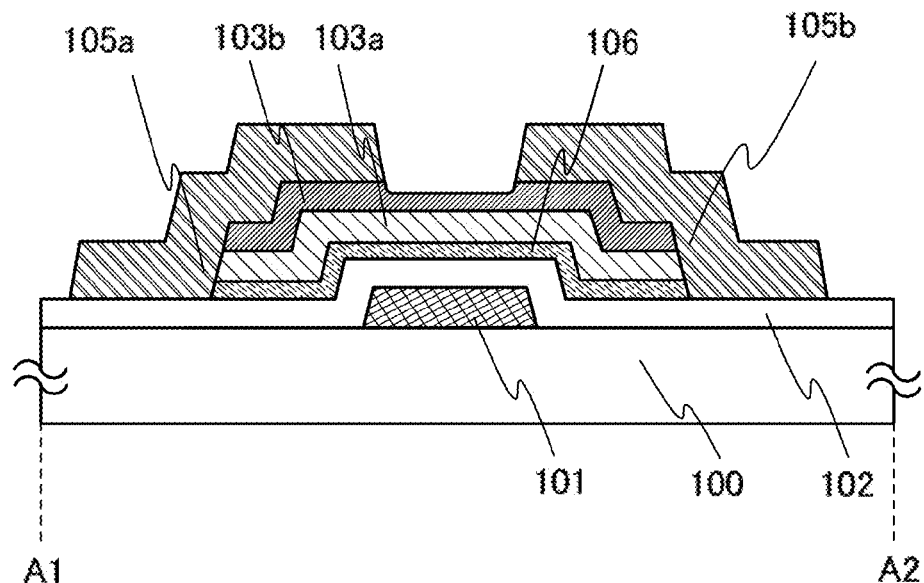
FIGS. 34A and 34B illustrate a semiconductor device according to an embodiment of the present invention.
Figure 34B:
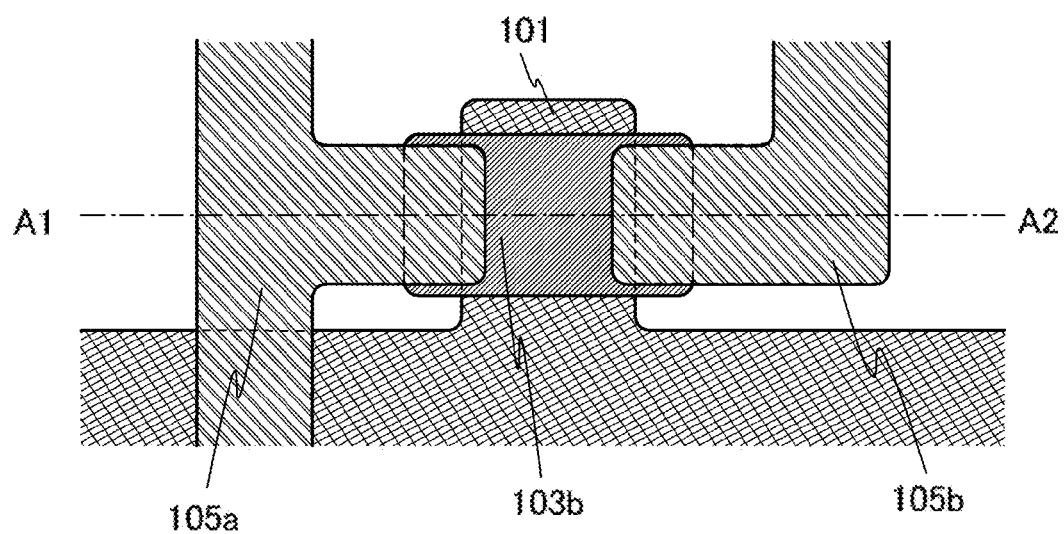

Although the inverted staggered transistor illustrated in FIGS. 1A and 1B includes an active layer having a two-layer structure of the oxide layer 106 and the oxide semiconductor layer 103 including insulating oxide, the transistor of this embodiment is not limited to this. As the one illustrated in FIGS. 34A and 34B, a three-layer structure may be employed in which a first oxide semiconductor layer 103*a* including insulating oxide is provided over an oxide layer 106 and a second oxide semiconductor layer 103*b* including insulating oxide is provided over the first oxide semiconductor layer 103*a* including insulating oxide. Note that FIG. 34A is a cross-sectional view taken along line A1-A2 in FIG. 34B. Here, the second oxide semiconductor layer 103*b* including insulating oxide includes a larger amount of insulating oxide than the first oxide semiconductor layer 103*a* including insulating oxide. For example, as a target used to form the first oxide semiconductor layer 103*a* including insulating oxide, a target containing SiO$_2$ at 2.5 percent by weight to 12.5 percent by weight inclusive is preferably used, and more preferably a target containing SiO$_2$ at 5 percent by weight to 10 percent by weight inclusive is used. Further, as a target used to form the second oxide semiconductor layer 103*b* including insulating oxide, a target containing SiO$_2$ at 7.5 percent by weight to 20 percent by weight inclusive is preferably used, and more preferably a target containing SiO$_2$ at 10 percent by weight to 15 percent by weight inclusive is used. Note that the target used to form the second oxide semiconductor layer 103b including insulating oxide contains a larger amount of SiO$_2$ than the target used to form the first oxide semiconductor layer 103a including insulating oxide. In the case where the amount of insulating oxide included is increased in steps by stacking oxide semiconductor layers including insulating oxide in the above-described manner, improvement in electric characteristics of the transistor can be achieved. It is needless to say that a layered structure including three or more oxide semiconductor layers including insulating oxide may also be employed. The oxide semiconductor layers are preferably formed so that the concentration of insulating oxide is lowered from the back channel side toward the gate electrode side. Note that except the first oxide semiconductor layer 103a including insulating oxide and the second oxide semiconductor layer 103b including insulating oxide, reference numerals of parts of the transistor illustrated in FIGS. 34A and 34B are the same as those of corresponding parts used for the transistor illustrated in FIGS. 1A and 1B.

Figure 10A:
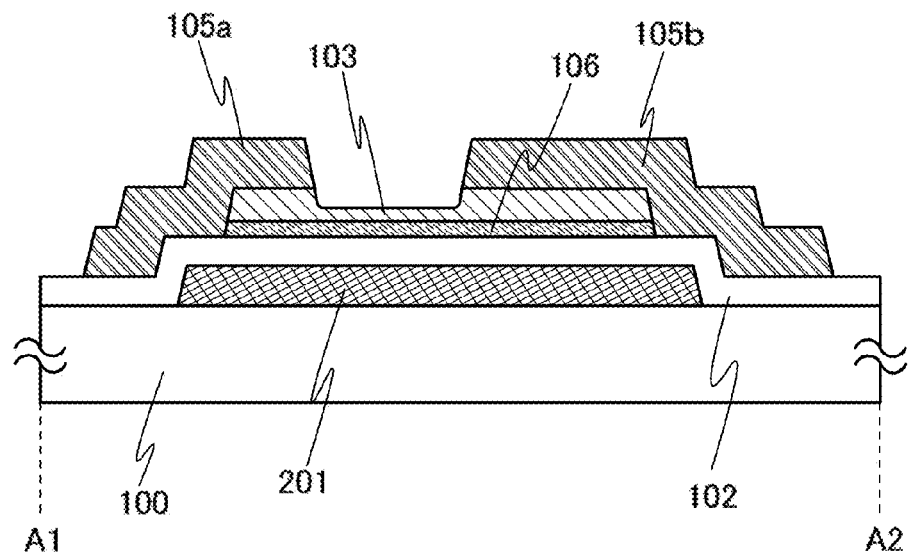
FIGS. 10A and 10B illustrate a semiconductor device according to an embodiment of the present invention.
Figure 10B:
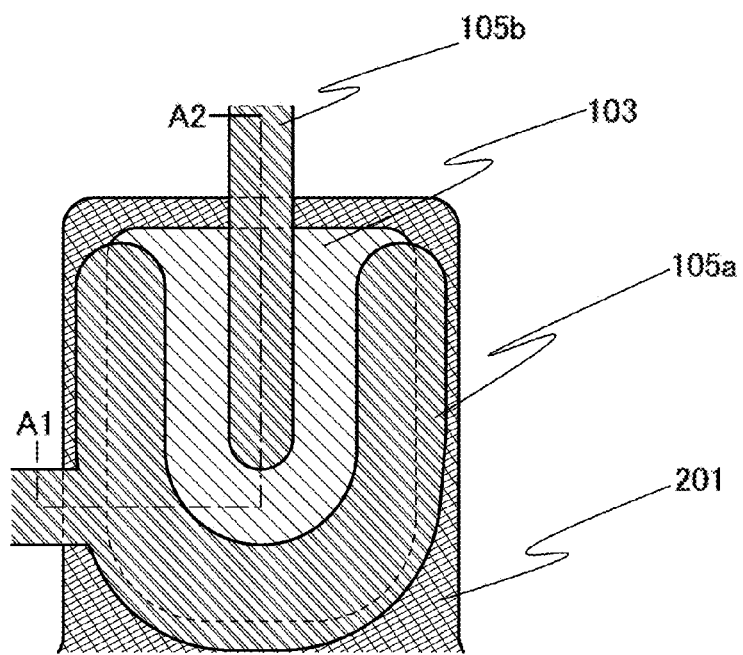

Further, although the inverted staggered transistor illustrated in FIGS. 1A and 1B has the gate electrode layer 101 having a width in a channel direction which is smaller than that of the oxide semiconductor layer 103 including insulating oxide or that of the oxide layer 106, the transistor described in this embodiment is not limited thereto. As illustrated in FIGS. 10A and 10B, a gate electrode layer 201 having a width in a channel direction which is larger than that of the oxide semiconductor layer 103 including insulating oxide and that of the oxide layer 106, may be used. Note that FIG. 10A is a cross-sectional view taken along line A1-A2 in FIG. 10B. With this structure, the oxide semiconductor layer 103 including insulating oxide and the oxide layer 106 can be shielded from light by the gate electrode layer 201. Accordingly, reliability of the transistor can be improved. Note that except the gate electrode layer 201, reference numerals of parts of the transistor illustrated in FIGS. 10A and 10B are the same as those of corresponding parts used for the transistor illustrated in FIGS. 1A and 1B.

Figure 11A:
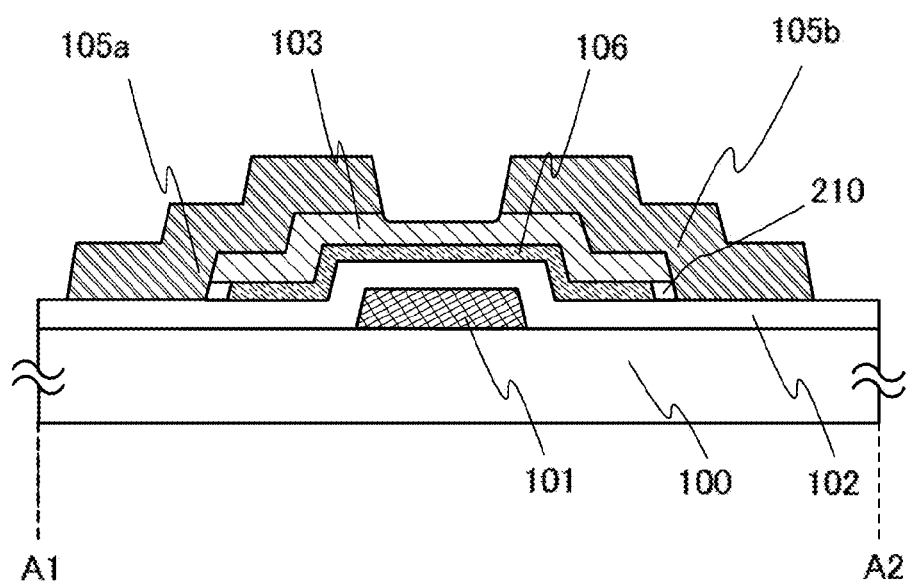
FIGS. 11A and 11B illustrate a semiconductor device according to an embodiment of the present invention.
Figure 11B:
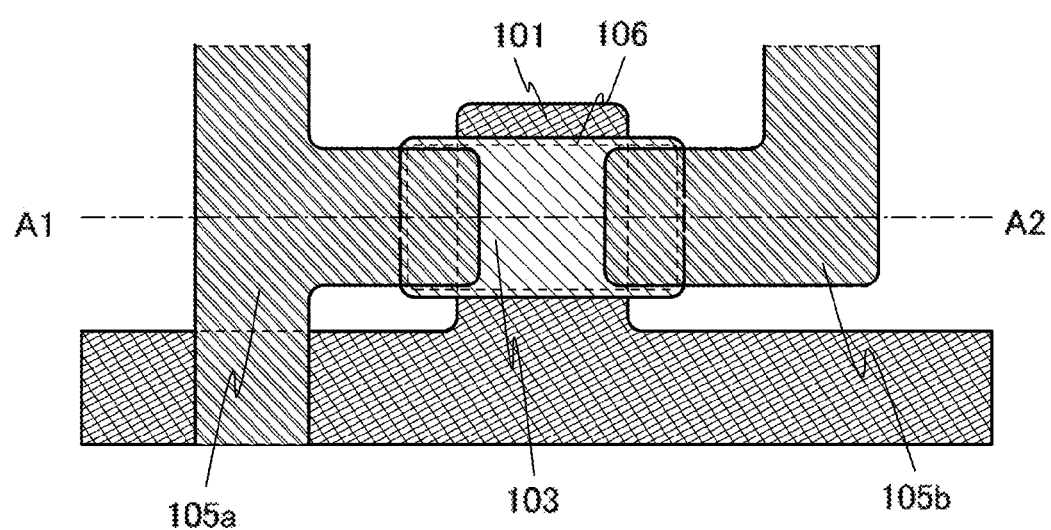

Further, in the inverted staggered transistor illustrated in FIGS. 1A and 1B, the oxide layer 106 is directly in contact with the source and drain electrode layers 105a and 105b at end portions of the oxide layer 106; however, the transistor described in this embodiment is not limited thereto. As illustrated in FIGS. 11A and 11B, the oxide layer 106 may have a smaller area than the oxide semiconductor layer 103 including insulating oxide and a hollow 210 may be formed under an end portion of the oxide semiconductor layer 103 including insulating oxide. The hollow 210 is formed so as to be surrounded by the oxide layer 106, the oxide semiconductor layer 103 including insulating oxide, the source or drain electrode layer 105a or 105b, and the gate insulating layer 102. Note that as illustrated in FIG. 11B, in a portion where the source and drain electrode layers 105a and 105b are not provided over the oxide layer 106, a protective insulating layer over the transistor, instead of the source and drain electrode layers 105a and 105b, works to form the hollow 210. The hollow 210 can be easily formed by utilizing the fact that the wet etching rate of the oxide semiconductor layer 103 including insulating oxide is lower than that of the oxide layer 106. With this structure, the oxide layer 106 is not in direct contact with the source and drain electrode layers 105a and 105b, so that an off current which directly flows from the source or drain electrode layer 105a or 105b to an end portion of the oxide layer 106 can be reduced. Thus, reliability of the transistor can be improved. Note that the transistor illustrated in FIGS. 11A and 11B has the same structure as the transistor illustrated in FIGS. 1A and 1B except that the hollow 210 is formed under the end portion of the oxide semiconductor layer 103 including insulating oxide, and reference numerals in FIGS. 11A and 11B are the same as those used for the transistor illustrated in FIGS. 1A and 1B.

Figure 12A:
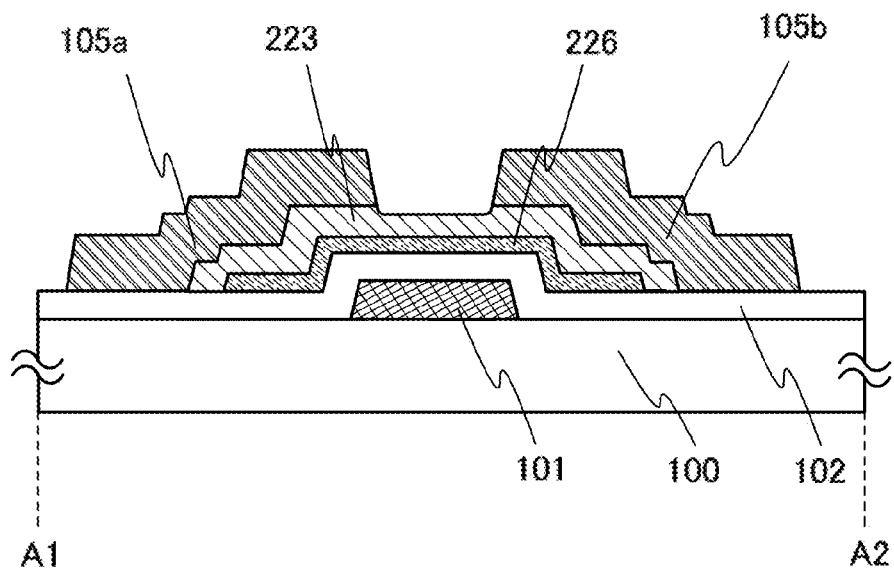
FIGS. 12A and 12B illustrate a semiconductor device according to an embodiment of the present invention.
Figure 12B:
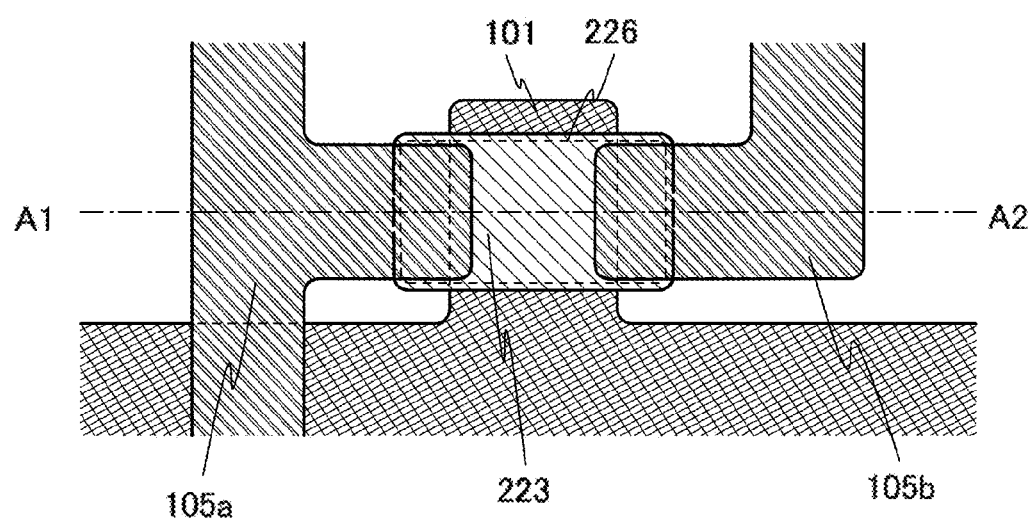

Further, as illustrated in FIGS. 12A and 12B, an end portion of an oxide layer 226 may be covered with an oxide semiconductor layer 223 including insulating oxide. Note that FIG. 12A is a cross-sectional view taken along line A1-A2 in FIG. 12B. With this structure, the oxide layer 226 is not in direct contact with the source and drain electrode layers 105a and 105b, so that an off current which directly flows from the source or drain electrode layer 105a or 105b to an end portion of the oxide layer 226 can be reduced. Thus, reliability of the transistor can be improved. Note that the transistor illustrated in FIGS. 12A and 12B has the same structure as the transistor illustrated in FIGS. 1A and 1B except that the end portion of the oxide layer 226 is covered with the oxide semiconductor layer 223 including insulating oxide, and reference numerals in FIGS. 12A and 12B are the same as those used for the transistor illustrated in FIGS. 1A and 1B.

By employing any of the above-described structures, a transistor including an oxide layer which includes Zn and does not include a rare metal such as In or Ga can be provided. A transistor including an oxide layer including Zn is formed by stacking an oxide semiconductor layer including insulating oxide over an oxide layer so that the oxide layer is overlaps with a source electrode layer or a drain electrode layer with the oxide semiconductor layer including insulating oxide interposed therebetween, whereby variation in the threshold voltage of the transistor can be reduced and electric characteristics can be stabilized.

Note that the structure described in this embodiment can be implemented in combination with any of the structures described in other embodiments as appropriate. Further, any of the structures described in this embodiment can be used in combination, as appropriate.

Embodiment 2

In this embodiment, a manufacturing process of a display device including the transistor described in Embodiment 1 will be described with reference to FIGS. 2A to 2D, FIGS. 3A to 3C, FIG. 4, FIG. 5, FIG. 6, FIG. 7, FIG. 8, and FIGS. 9A-1, 9A-2, 9B-1, and 9B-2. FIGS. 2A to 2D and FIGS. 3A to 3C are cross-sectional views, and FIG. 4, FIG. 5, FIG. 6, FIG. 7, and FIG. 8 are plan views. Line A1-A2 and Line B1-B2 in FIG. 4, FIG. 5, FIG. 6, FIG. 7, and FIG. 8 correspond to Line A1-A2 and Line B1-B2 in the cross-sectional views of FIGS. 2A to 2D and FIGS. 3A to 3C.

First, a substrate 100 is prepared. As the substrate 100, the following can be used: an alkali-free glass substrate manufactured by a fusion method or a floating method, such as a barium borosilicate glass substrate, an aluminoborosilicate glass substrate, or an aluminosilicate glass substrate; a ceramic substrate; a heat-resistant plastic substrate that can resist process temperature of this manufacturing process; or the like. Alternatively, a metal substrate such as a stainless steel alloy substrate which is provided with an insulating film over the surface may also be used. As the substrate 100, a substrate having a size of 320 mm×400 mm, 370 mm×470 mm, 550 mm×650 mm, 600 mm×720 mm, 680 mm×880 mm, 730 mm×920 mm, 1000 mm×1200 mm, 1100 mm×1250 mm, 1150 mm×1300 mm, 1500 mm×1800 mm, 1900 mm×2200 mm, 2160 mm×2460 mm, 2400 mm×2800 mm, 2850 mm×3050 mm, or the like can be used.

Further, an insulating film may be provided as a base film over the substrate 100. The base film may be formed to have a single-layer structure or a layered structure including any of a silicon oxide film, a silicon nitride film, a silicon oxynitride film, or a silicon nitride oxide film by a CVD method, a sputtering method, or the like. In the case where a substrate containing mobile ions, such as a glass substrate, is used as the substrate 100, a film containing nitrogen such as a silicon nitride film or a silicon nitride oxide film can be used as the base film, whereby the mobile ions can be prevented from entering the oxide semiconductor layer.

Figure 4:
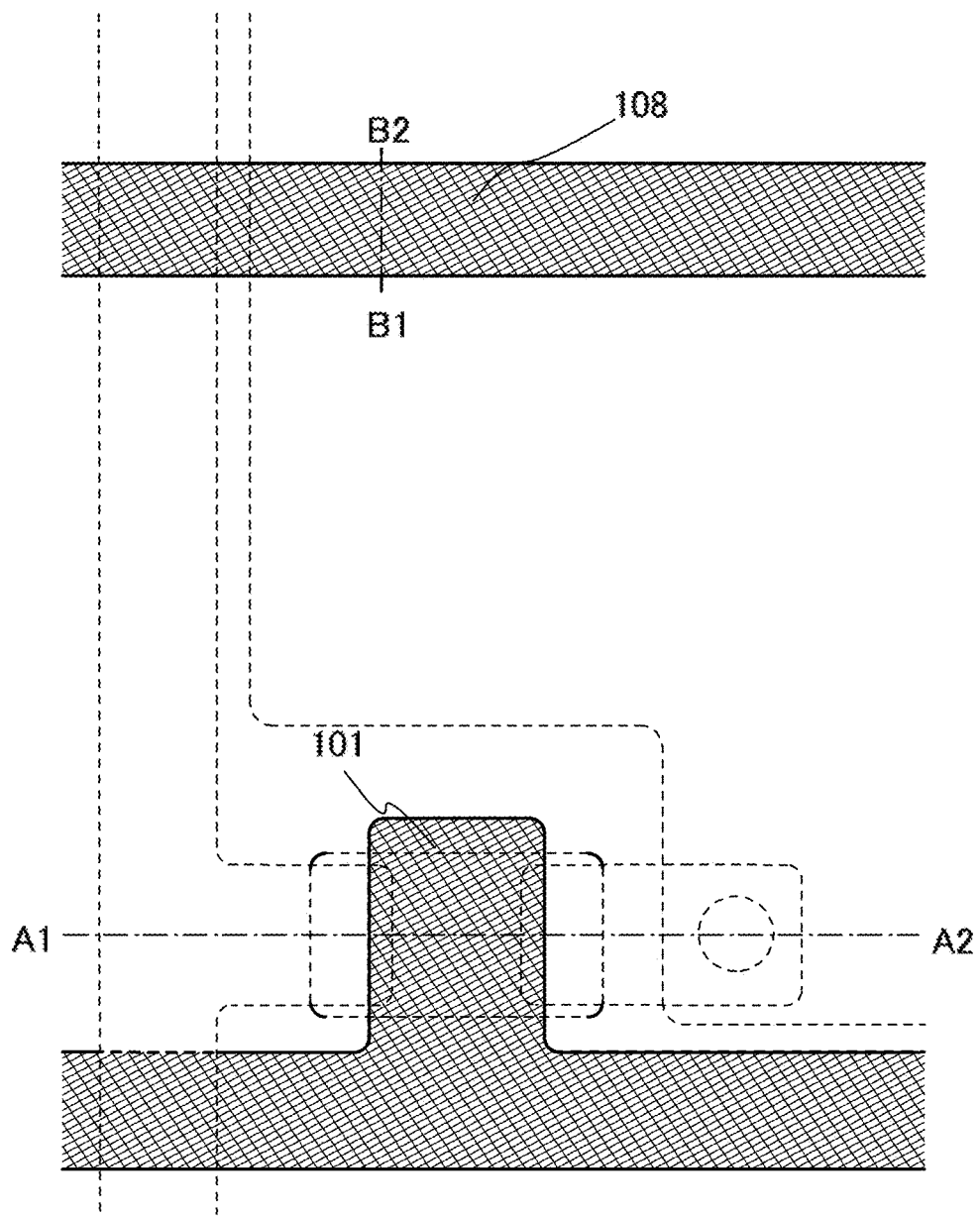
FIG. 4 illustrates a manufacturing method of a semiconductor device according to an embodiment of the present invention.

Next, a conductive film to be a gate wiring including the gate electrode layer 101, a capacitor wiring 108, and a first terminal 121 is formed over the entire surface of the substrate 100 by a sputtering method or a vacuum evaporation method. Next, a photolithography process is performed. That is, a resist mask is formed, and unnecessary portions are removed by etching to form wirings and an electrode (the gate wiring including the gate electrode layer 101, the capacitor wiring 108, and the first terminal 121). At this time, etching is preferably performed so that at least an end portion of the gate electrode layer 101 can be tapered in order to prevent disconnection. A cross-sectional view at this stage is illustrated in FIG. 2A. Note that FIG. 4 is a plan view at this stage.

The gate wiring including the gate electrode layer 101, the capacitor wiring 108, and the first terminal 121 in a terminal portion can be formed to have a single-layer structure or a layered structure using any of the conductive materials described in Embodiment 1.

Here, the gate electrode layer 101 may be formed to have a width in a channel direction larger than that of the oxide semiconductor layer 103 including insulating oxide and that of the oxide layer 106 which are to be formed in a later step. By forming the gate electrode layer 101 in this manner, a transistor illustrated in FIGS. 10A and 10B can be formed. In the case of the transistor illustrated in FIGS. 10A and 10B, the oxide semiconductor layer 103 including insulating oxide and the oxide layer 106 can be shielded from light by the gate electrode layer 201.

Next, a gate insulating layer 102 is formed over the entire surface of the gate electrode layer 101. The gate insulating layer 102 is formed by a CVD method, a sputtering method, or the like to a thickness of 50 nm to 400 nm.

The gate insulating layer 102 may be formed to have a single-layer structure or a layered structure using an insulating film such as a silicon oxide film, a silicon oxynitride film, a silicon nitride oxide film, a silicon nitride film, an aluminum oxide film, or a tantalum oxide film.

Alternatively, the gate insulating layer 102 can be formed of a silicon oxide layer by a CVD method using an organosilane gas. As the organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

Alternatively, the gate insulating layer 102 may be formed using one kind of oxide, nitride, oxynitride, or nitride oxide of aluminum, yttrium, or hafnium; or a compound including at least two or more kinds thereof.

In this embodiment, the gate insulating layer 102 which is a silicon oxynitride film having a thickness of 100 nm is formed over the gate electrode layer 101 in the following manner: a monosilane gas ($SiH_4$), nitrous oxide ($N_2O$), and a rare gas are introduced into a chamber of a high-density plasma apparatus as source gases, and high density plasma is generated under a pressure of 10 Pa to 30 Pa. In this embodiment, a high-density plasma apparatus refers to an apparatus which can realize a plasma density of $1 \times 10^{11}/cm^3$ or higher. For example, plasma is generated by application of a microwave power of 3 kW to 6 kW so that the gate insulating layer 102 is formed. In forming the gate insulating layer 102, the flow ratio of a monosilane gas ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

In addition, since the gate insulating layer 102 formed with the high-density plasma apparatus can have a uniform thickness, the gate insulating layer 102 has excellent step coverage. Further, with the high-density plasma apparatus, the thickness of a thin insulating film can be controlled precisely.

The insulating film obtained with the high-density plasma apparatus is greatly different from an insulating film obtained with a conventional parallel plate PCVD apparatus. The insulating film obtained with the high-density plasma apparatus has an etching rate which is lower than that of the insulating film obtained with the conventional parallel plate PCVD apparatus by 10% or more or 20% or more in the case where the etching rates with the same etchant are compared to each other. Thus, it can be said that the insulating film obtained with the high-density plasma apparatus is a dense film.

Note that in this specification, oxynitride refers to a substance that contains more oxygen atoms than nitrogen atoms and nitride oxide refers to a substance that contains more nitrogen atoms than oxygen atoms.

Note that before an oxide film 113 for forming the oxide layer 106 is formed, reverse sputtering by which plasma is generated by introduction of an argon gas into a chamber where the substrate 100 is set is preferably performed to remove powder substances (also referred to as particles or dust) that are generated at the time of deposition and attached to a surface of the gate insulating layer. By reverse sputtering, the planarity of the surface of the gate insulating layer 102 can be improved as well. The reverse sputtering is a method in which voltage is applied to a substrate side, not to a target side, using a RF power source in an argon atmosphere and plasma is deposited on the substrate so that a surface is modified. Note that instead of an argon atmosphere, a nitrogen atmosphere, a helium atmosphere, or the like may be used. Alternatively, an argon atmosphere to which oxygen, $N_2O$, or the like is added may be used. Further alternatively, an argon atmosphere to which $Cl_2$, $CF_4$, or the like is added may be used. When the oxide film 113 is formed without exposure to the air after the reverse sputtering, dust or moisture can be prevented from attaching to an interface between the gate insulating layer 102 and the oxide layer 106.

Next, the oxide film 113 for forming the oxide layer 106 is formed over the gate insulating layer 102 by a sputtering method in an atmosphere of a rare gas such as an argon gas and an oxygen gas. In that case, by performing deposition under the condition where the flow rate of a rare gas such as an argon gas is higher than that of an oxygen gas or performing deposition in an atmosphere of only a rare gas such as an argon gas without using an oxygen gas, conductivity of the oxide layer 106 can be increased. For the oxide film 113, a Zn—O-based or Sn—Zn—O-based oxide can be used. Note that a pulse direct current (DC) power supply is preferable because powder substances generated at the time of deposition can be reduced and the film thickness can be made uniform. The thickness of the oxide film 113 is set to 10 nm to 300 nm, preferably 20 nm to 100 nm.

Next, an oxide semiconductor film 114 including insulating oxide for forming the oxide semiconductor layer 103 including insulating oxide is formed over the oxide film 113 without exposure to the air, by a sputtering method in an atmosphere of a rare gas such as an argon gas and an oxygen gas. Here, as the insulating oxide, silicon oxide is preferable. In that case, by performing deposition under the condition in which the flow rate of an oxygen gas is high, conductivity of the oxide semiconductor layer 103 including insulating oxide can be reduced. For the oxide semiconductor film 114 including insulating oxide, a Zn—O-based or Sn—Zn—O-based oxide semiconductor can be used. In forming the oxide semiconductor film 114 including insulating oxide, it is preferable to use a target containing $SiO_2$ at 2.5 percent by weight to 20 percent by weight inclusive, and particularly preferable to use a target containing $SiO_2$ at 7.5 percent by weight to 12.5 percent by weight inclusive. Note that a pulse direct current (DC) power supply is preferable because powder substances generated at the time of deposition can be reduced and the film thickness can be made uniform. The thickness of the oxide semiconductor film 114 including insulating oxide is set to 10 nm to 300 nm, preferably 20 nm to 100 nm. A cross-sectional view at this stage is illustrated in FIG. 2B.

Since insulating oxide such as silicon oxide is included in the oxide semiconductor film 114 including insulating oxide, the oxide semiconductor film 114 including insulating oxide can have an amorphous structure and, in addition, crystallization of the oxide semiconductor can be suppressed in the case where the oxide semiconductor is subjected to heat treatment.

The oxide semiconductor film 114 including insulating oxide may be formed in the same chamber in which reverse sputtering is previously conducted or in a different chamber therefrom.

Examples of a sputtering method include an RF sputtering method in which a high-frequency power source is used as a sputtering power source, a DC sputtering method in which direct current is used, a pulsed DC sputtering method in which a bias is applied in a pulsed manner, and the like. An RF sputtering method is mainly used for forming an insulating film, and a DC sputtering method is mainly used for forming a metal film.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method by sputtering, there are also a reactive sputtering method in which a target substance and a sputtering gas component are chemically reacted with each other during deposition to form a thin compound film thereof, and a bias sputtering in which a voltage is also applied to a substrate during deposition.

Next, a photolithography process is performed. A resist mask is formed, and the oxide film 113 and the oxide semiconductor film 114 including insulating oxide are etched. In the etching, organic acid such as citric acid or oxalic acid can be used for an etchant. Here, the oxide film 113 and the oxide semiconductor film 114 including insulating oxide are etched by wet etching with the use of ITO-07N (manufactured by Kanto Chemical Co., Inc.) to remove an unnecessary portion. Thus, the oxide film 113 and the oxide semiconductor film 114 including insulating oxide are processed to have island shapes, whereby the oxide layer 106 and an oxide semiconductor layer 111 including insulating oxide are formed. In the case where etching is performed so that the end portions of the oxide layer 106 and the oxide semiconductor layer 111 including insulating oxide have tapered shapes, breakage of a wiring due to a step shape can be prevented.

Here, the wet etching rate of the oxide semiconductor film 114 including insulating oxide such as silicon oxide is lower than that of the oxide film 113. In the case where the oxide film 113 and the oxide semiconductor film 114 including insulating oxide are stacked and subjected to wet etching, the oxide film 113 is side-etched more than the oxide semiconductor film 114 including insulating oxide. Therefore, as illustrated in FIGS. 11A and 11B, the end portion of the oxide layer 106 is on the inner side than that of the oxide semiconductor layer 111 including insulating oxide, and thus the hollow 210 is formed under the end portion of the oxide semiconductor layer 111 including insulating oxide. Accordingly, source and drain electrode layers 105a and 105b can be prevented from being in contact with the end portion of the oxide layer 106 when the source and drain electrode layers 105a and 105b are formed in a later step, whereby a current can be prevented from flowing directly between the source and drain electrode layers 105a and 105b and the end portion of the oxide layer 106.

In this embodiment, after the oxide film 113 and the oxide semiconductor film 114 including insulating oxide are formed to be stacked, the oxide layer 106 and the oxide semiconductor layer 111 including insulating oxide are formed by a photolithography process; however, this embodiment is not limited thereto. After the oxide film 113 is formed and the oxide layer 106 is formed by photolithography, the oxide semiconductor film 114 including insulating oxide may be formed and the oxide semiconductor layer 111 including insulating oxide may be formed by photolithography. In that case, as illustrated in FIGS. 12A and 12B, a structure is employed in which the oxide semiconductor layer 103 including insulating oxide (the oxide semiconductor layer 223 including insulating oxide) covers the oxide layer 106 (the oxide layer 226). Accordingly, the source and drain electrode layers 105a and 105b can be prevented from being in contact with the end portion of the oxide layer 226 when the source and drain electrode layers 105a and 105b are formed in a later step, whereby a current can be prevented from flowing directly between the source and drain electrode layers 105a and 105b and the end portion of the oxide layer 226.

Note that etching here is not limited to wet etching and dry etching may also be used. As an etching apparatus used for the dry etching, an etching apparatus using a reactive ion etching method (an RIE method), or a dry etching apparatus using a high-density plasma source such as an ECR (electron cyclotron resonance) source or an ICP (inductively coupled plasma) source can be used. Further, as a dry etching apparatus by which uniform electric discharge can be obtained over a wider area as compared to an ICP etching apparatus, there is an ECCP (enhanced capacitively coupled plasma) mode etching apparatus in which an upper electrode is grounded, a high-frequency power source at 13.56 MHz is connected to a lower electrode, and further a low-frequency power source at 3.2 MHz is connected to the lower electrode. This ECCP mode etching apparatus can be applied, for example, even when a substrate of the tenth generation with a side of larger than 3 meters is used.

Figure 5:
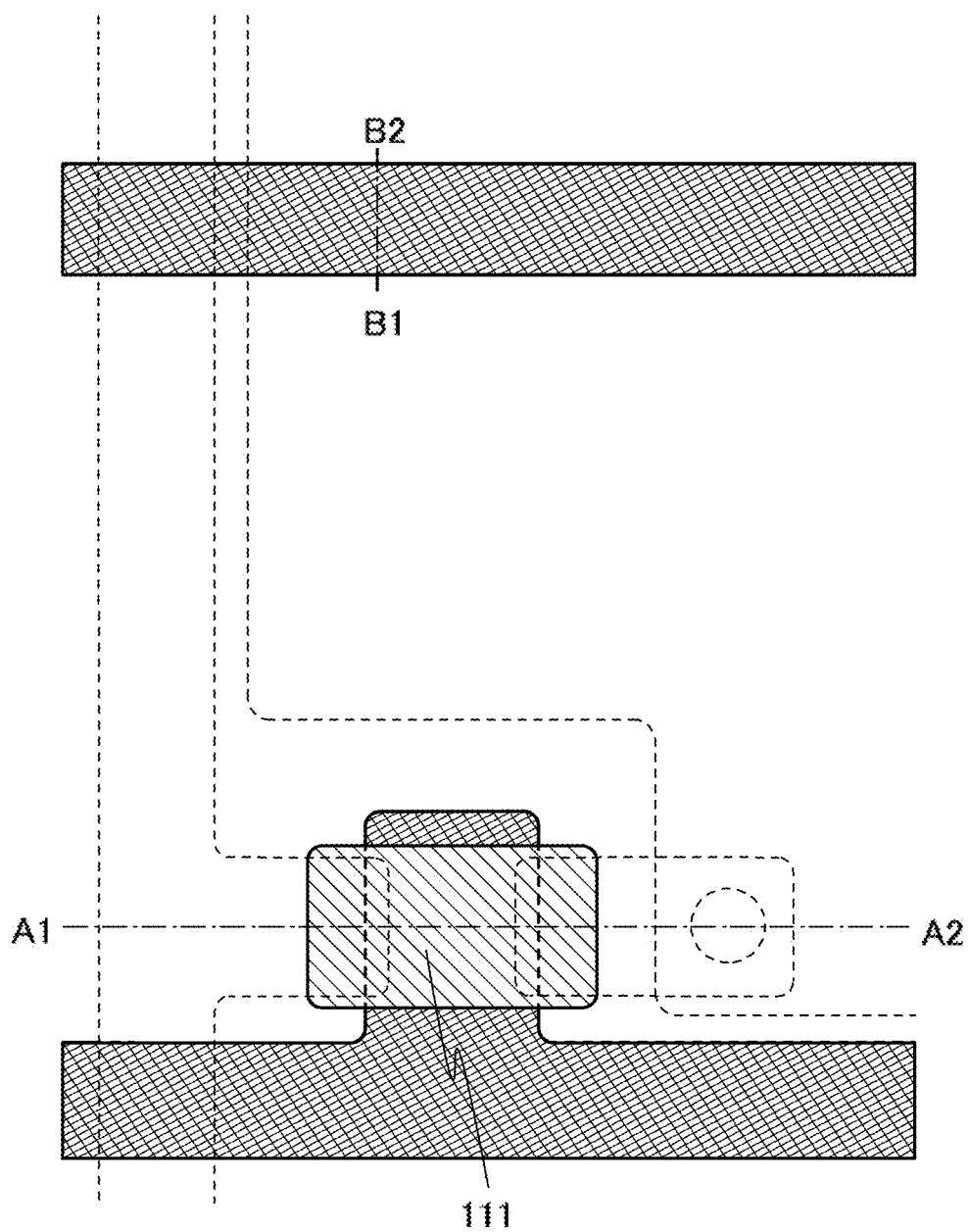
FIG. 5 illustrates a manufacturing method of a semiconductor device according to an embodiment of the present invention.

Next, a photolithography process is performed. That is, a resist mask is formed, and an unnecessary portion of the gate insulating layer 102 is removed by etching, whereby a contact hole that reaches the wiring or the electrode layer which is formed from the same material as that of the gate electrode layer 101 is formed. The contact hole is provided for direct connection with a conductive film to be formed later. For example, a contact hole is formed in the case of forming a transistor whose gate electrode layer is in direct contact with the source electrode layer or the drain electrode layer in the driver circuit portion, or in the case of forming a terminal that is electrically connected to a gate wiring in the terminal portion. FIG. 2C is a cross-sectional view at this stage. FIG. 5 is a plan view at this stage.

Next, over the oxide semiconductor layer 111 including insulating oxide and the gate insulating layer 102, a conductive film 112 formed from a metal material is formed by a sputtering method or a vacuum evaporation method. FIG. 2D is a cross-sectional view at this stage.

The conductive film 112 can be formed to have a single-layer structure or a layered structure using any of the conductive materials described in Embodiment 1. For example, in the conductive film 112, a first conductive layer and a third conductive layer may be formed using titanium that is a heat-resistant conductive material, and a second conductive layer may be formed using an aluminum alloy containing neodymium. With such a structure of the conductive film 112, generation of hillocks can be reduced while low resistance of aluminum is utilized.

Next, a photolithography process is performed. That is, a resist mask 131 is formed, and an unnecessary portion is removed by etching, whereby the source and drain electrode layers 105a and 105b, the oxide semiconductor layer 103 including insulating oxide, and a connection electrode 120 are formed. Wet etching or dry etching is employed as an etching method at this time. For example, in the case where in the conductive film 112, the first and third conductive layers are formed using titanium and the second conductive layer is formed using an aluminum alloy containing neodymium, wet etching can be performed using a hydrogen peroxide solution, heated hydrochloric acid, or a nitric acid solution containing ammonium fluoride as an etchant. For example, the conductive film 112 including the first conductive layer, the second conductive layer, and the third conductive layer can be etched collectively with the use of KSMF-240 (manufactured by Kanto Chemical Co., Inc.). In this etching step, an exposed region of the oxide semiconductor layer 111 including insulating oxide is also etched partly, so that the oxide semiconductor layer 103 including insulating oxide, which has a region which is between the source and drain electrode layers 105a and 105b and whose thickness is smaller than that of a region overlapped with the source or drain electrode layer 105a or 105b, is formed. Accordingly, a channel formation region of the oxide semiconductor layer 103 including insulating oxide and the oxide layer 106 is a region that overlaps with the small-thickness region of the oxide semiconductor layer 103 including insulating oxide.

Figure 6:
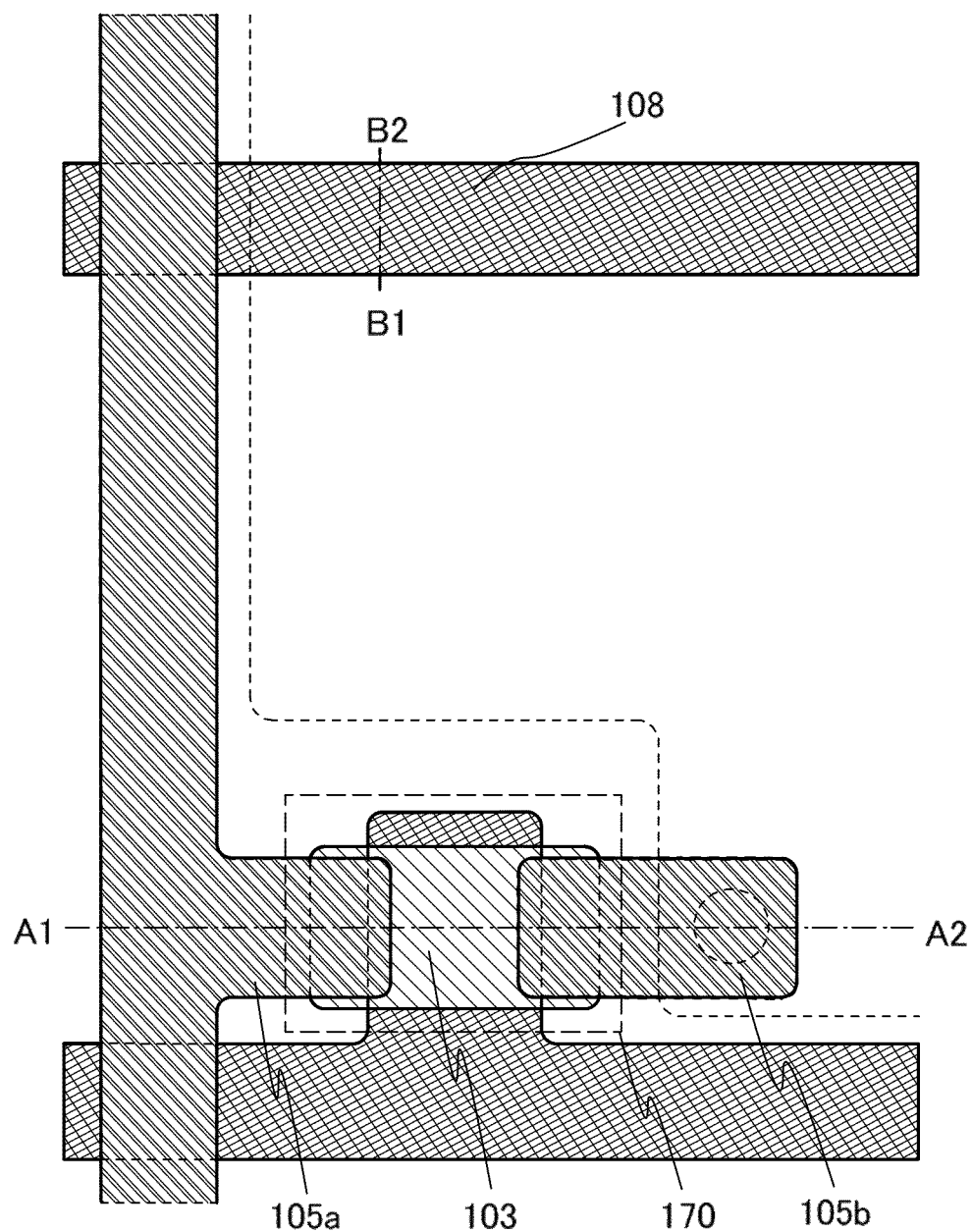
FIG. 6 illustrates a manufacturing method of a semiconductor device according to an embodiment of the present invention.

In the case where in the conductive film 112, the first and third conductive layers are formed using titanium and the second conductive layer is formed using an aluminum alloy containing neodymium, the conductive film 112 and the oxide semiconductor layer 111 including insulating oxide can be etched in one step with the use of a hydrogen peroxide solution, heated hydrochloric acid, or a nitric acid solution containing ammonium fluoride as an etchant. Accordingly, end portions of the source and drain electrode layers 105a and 105b and end portions of the oxide semiconductor layer 103 including insulating oxide are aligned with each other, thereby forming a continuous structure. In addition, since wet etching allows the layers to be etched isotropically, the end portions of the source and drain electrode layers 105a and 105b are recessed from the resist mask 131. Through the aforementioned process, a transistor 170 which includes the oxide semiconductor layer 103 including insulating oxide and the oxide layer 106 as a channel formation region can be manufactured. FIG. 3A is a cross-sectional view at this stage. FIG. 6 is a plan view at this stage.

Further, in this photolithography process, a second terminal 122 formed using the same material as that of the source and drain electrode layers 105a and 105b is left in the terminal portion. Note that the second terminal 122 is electrically connected to a source wiring (a source wiring including the source or drain electrode layers 105a and 105b).

In the terminal portion, the connection electrode 120 is directly connected to the first terminal 121 of the terminal portion through the contact hole formed in the gate insulating film. Although not illustrated here, a source or drain wiring of the transistor of the driver circuit can be directly connected to the gate electrode through the same process as the above-described process.

In the above photolithography process, two masks are necessary for a step where the conductive film 112 is etched to have an island shape and for a step where the source and drain electrode layers 105a and 105b are formed. However, with the use of a resist mask having regions with plural thicknesses (typically, two different thicknesses) which is formed using a multi-tone (high-tone) mask, the number of resist masks can be reduced, resulting in simplified process and lower costs. A photolithography process using a multi-tone mask will be described with reference to FIGS. 33A to 33C.

First, from the state of FIG. 2B, the conductive film 112 is formed over the oxide semiconductor film 114 including insulating oxide by the above method. Then, as illustrated in FIG. 33A, a resist mask 132 having regions with a plurality of different thicknesses is formed over the conductive film 112 by light exposure using a multi-tone (high-level grayscale) mask with which light transmitted therethrough has a plurality of intensities. The resist mask 132 has a thin film thickness in a region that overlaps with part of the gate electrode layer 101. Next, the oxide film 113, the oxide semiconductor film 114 including insulating oxide, and the conductive film 112 are etched and processed to have an island shape with the use of the resist mask 132, so that the oxide layer 106, the oxide semiconductor layer 111 including insulating oxide, a conductive layer 115, and a second terminal 124 are formed. FIG. 33A is a cross-sectional view at this stage.

Next, the resist mask 132 is subjected to ashing to form the resist mask 131. As illustrated in FIG. 33B, the resist mask 131 has a reduced area and a reduced thickness due to ashing, and the region in the resist mask 132 having a small thickness is removed.

Lastly, the conductive layer 115 and the second terminal 124 are etched using the resist mask 131 to form the source and drain electrode layers 105a and 105b, the oxide semiconductor layer 103 including insulating oxide, and the second terminal 122. Due to reduction in area of the resist mask 132, end portions of the source and drain electrode layers 105a and 105b, the oxide semiconductor layer 103 including insulating oxide, the oxide layer 106, and the second terminal 122 are etched. FIG. 33C is a cross-sectional view at this stage. Note that as for the first terminal 121, after a protective insulating layer 107 is formed in a later step, the gate insulating layer 102 and the protective insulating layer 107 are etched to form a contact hole, whereby a transparent conductive film is formed to connect the first terminal 121 and an FPC to each other. In the above-described manner, the transistor 170 can be manufactured using a multi-tone mask.

Next, after the resist mask 131 is removed, heat treatment (which may be light annealing) is preferably performed at 200° C. to 600° C., typically, 250° C. to 500° C. Here, heat treatment is performed in air in a furnace at 350° C. for 1 hour. By this heat treatment, rearrangement of the oxide semiconductor layer 103 including insulating oxide and the oxide layer 106 at the atomic level is caused. Further, because of the insulating oxide such as silicon oxide included in the oxide semiconductor layer 103 including insulating oxide, crystallization of the oxide semiconductor layer 103 including insulating oxide due to the heat treatment can be hindered and an amorphous structure can be maintained. In the case where the oxide layer 106 has an amorphous structure or a structure including crystal grains and is made to have a polycrystalline structure through this heat treatment, transistor conductivity can be improved. Note that there is no particular limitation on the timing of the heat treatment as long as it is performed after formation of the oxide semiconductor layer 103 including insulating oxide, and, for example, heat treatment may be performed after formation of a pixel electrode.

Further, the exposed channel formation region of the oxide semiconductor layer 103 including insulating oxide may be subjected to oxygen radical treatment. By performing the oxygen radical treatment, the transistor can have a normally-off characteristic. In addition, the radical treatment can repair damage due to the etching of the oxide semiconductor layer 103 including insulating oxide. The radical treatment is preferably performed in an atmosphere of $O_2$ or $N_2O$, and preferably in an atmosphere of $N_2$, He, or Ar which contains oxygen. Alternatively, the radical treatment may be performed in an atmosphere in which $Cl_2$ and $CF_4$ are added to the above atmosphere. Note that the radical treatment is preferably performed with no bias applied.

Next, the protective insulating layer 107 and a resin layer 133 are formed so as to cover the transistor 170. First, the protective insulating layer 107 is formed. The protective insulating layer 107 can be formed using a silicon nitride film, a silicon oxide film, a silicon oxynitride film, an aluminum oxide film, a tantalum oxide film, or the like by a PCVD method, a sputtering method, or the like. In particular, it is preferable to form a silicon nitride film with a high-density plasma apparatus. In the case of using a high-density plasma apparatus, the protective insulating layer 107 can be formed dense as compared to the case of using a PCVD method. Such a protective insulating layer 107 can prevent moisture, hydrogen ions, $OH^-$, and the like from entering the oxide semiconductor layer 103 including insulating oxide and the oxide layer 106.

Next, a photolithography process is performed. That is, a resist mask is formed and the protective insulating layer 107 is etched to form a contact hole 125 reaching the source or drain electrode layer 105b. In addition, a contact hole 126 reaching the connection electrode 120 and a contact hole 127 reaching the second terminal 122 are also formed by this etching.

Next, the resin layer 133 is formed over the protective insulating layer 107 in the pixel portion of the display device. The resin layer 133 is formed with a thickness ranging from 0.5 μm to 3 μm using polyimide, acrylic, polyamide, polyimideamide, resist, or benzocyclobutene, which is a photosensitive or non photosensitive organic material; or a stack of any of these materials. When photosensitive polyimide is deposited by a coating method, the number of steps can be reduced. The resin layer 133 is formed in the pixel portion of the display device through exposure to light, development, and baking; at this time, the resin layer 133 is not formed in a portion overlapping with the contact hole 125 and a portion overlapping with the capacitor wiring 108. The resin layer 133 can prevent moisture, hydrogen, and the like from entering the oxide semiconductor layer 103 including insulating oxide and the oxide layer 106. In addition, the resin layer 133 enables formation of a planar pixel electrode which is provided over the resin layer 133.

Then, a transparent conductive film is formed. The transparent conductive film is formed of indium oxide ($In_2O_3$), an indium oxide-tin oxide alloy ($In_2O_3$—$SnO_2$, abbreviated to ITO), or the like by a sputtering method, a vacuum evaporation method, or the like. Etching of such a material is conducted with a hydrochloric acid-based solution. However, since a residue is likely to be generated particularly in etching of ITO, an indium oxide-zinc oxide alloy ($In_2O_3$—ZnO) may be used to improve etching processability.

Next, a photolithography process is performed. That is, a resist mask is formed and an unnecessary portion is removed by etching to form a pixel electrode layer 110.

In this photolithography process, a storage capacitor is formed with the capacitor wiring 108 and the pixel electrode layer 110, in which the gate insulating layer 102 and the protective insulating layer 107 in the capacitor portion are used as a dielectric.

In addition, in this photolithography process, the connection electrode 120 and the second terminal 122 are covered with the resist mask, and transparent conductive films 128 and 129 are left in the terminal portion. The transparent conductive films 128 and 129 serve as an electrode connected to an FPC. The transparent conductive film 128 formed over the connection electrode 120 which is directly connected to the first terminal 121 is a connection terminal electrode which functions as an input terminal of the gate wiring. The transparent conductive film 129 formed over the second terminal 122 is a connection terminal electrode which functions as an input terminal of the source wiring.

Figure 7:
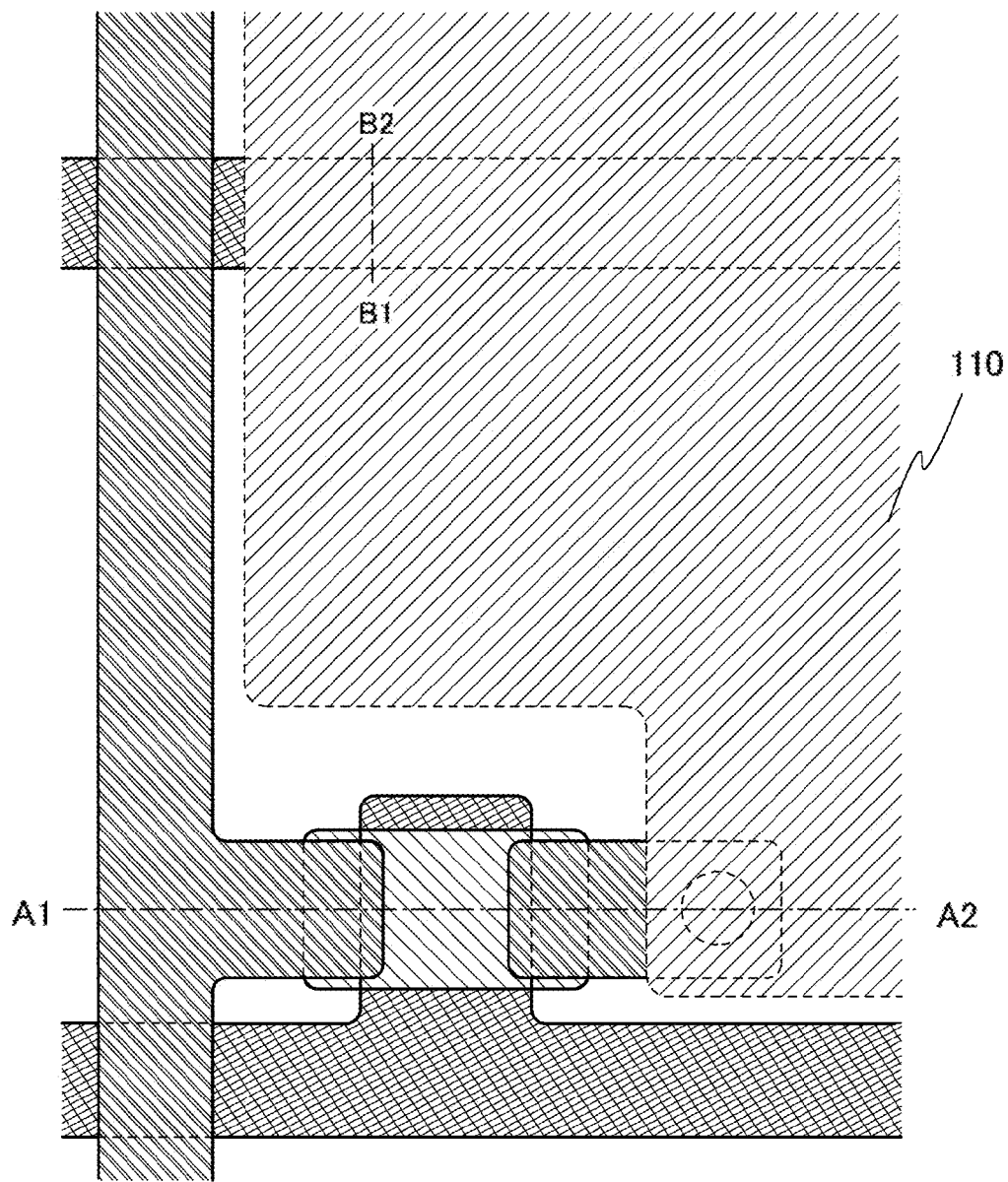
FIG. 7 illustrates a manufacturing method of a semiconductor device according to an embodiment of the present invention.

Then, the resist mask is removed. FIG. 3B is a cross-sectional view at this stage. FIG. 7 is a plan view at this stage.

Although the protective insulating layer 107 is formed and the resin layer 133 is formed thereover in this embodiment, the present embodiment is not limited thereto. As illustrated in FIG. 3C, after the resin layer 133 is formed so as to cover the transistor 170, the protective insulating layer 107 may be formed over the resin layer 133. When the protective insulating layer 107 and the resin layer 133 are formed in this order, the resin layer 133 can protect the oxide semiconductor layer 103 including insulating oxide and the oxide layer 106 from plasma damage which is caused in formation of the protective insulating layer 107.

Further, FIGS. 9A1 and 9A2 are a cross-sectional view and a plan view, respectively, of a gate wiring terminal portion in FIGS. 3B and 3C. FIG. 9A1 is a cross-sectional view along line C1-C2 in FIG. 9A2. In FIG. 9A1, a transparent conductive film 155 formed over a protective insulating layer 154 is a connection terminal electrode which functions as an input terminal. Further, in the terminal portion of FIG. 9A1, a first terminal 151 formed of the same material as that of the gate wiring and a connection electrode 153 formed of the same material as that of the source wiring overlap with each other with a gate insulating layer 152 interposed therebetween, and are in direct contact with each other so as to be electrically connected. Further, the connection electrode 153 and the transparent conductive film 155 are in direct contact with each other and are electrically connected through a contact hole provided in the protective insulating layer 154.

Further, FIGS. 9B1 and 9B2 are a cross-sectional view and a plan view, respectively, of a source wiring terminal portion. FIG. 9B1 is a cross-sectional view along line D1-D2 in FIG. 9B2. In FIG. 9B1, a transparent conductive film 155 formed over a protective insulating layer 154 is a connection terminal electrode which functions as an input terminal. Further, in the terminal portion of FIG. 9B1, an electrode 156 formed of the same material as that of the gate wiring is located below and overlapped with a second terminal 150 with a gate insulating layer 152 interposed therebetween. The electrode 156 is not electrically connected to the second terminal 150, and a capacitor to prevent noise or static electricity can be formed if the potential of the electrode 156 is set to a potential different from that of the second terminal 150, such as floating, GND, or 0 V. The second terminal 150 is electrically connected to the transparent conductive film 155 through the protective insulating layer 154.

A plurality of gate wirings, source wirings, and capacitor wirings are provided depending on the pixel density. Also in the terminal portion, the first terminal at the same potential as the gate wiring, the second terminal at the same potential as the source wiring, the third terminal at the same potential as the capacitor wiring, and the like are arranged in plurality. The number of each of the terminals may be any number, and the number of the terminals may be determined by a practitioner as appropriate.

Thus, a pixel transistor portion including the transistor 170 that is a bottom-gate n-channel transistor, and a storage capacitor can be completed. When these pixel transistor portion and storage capacitor are arranged in a matrix corresponding to respective pixels, a pixel portion can be formed and one of the substrates for manufacturing an active matrix display device can be obtained. In this specification, such a substrate is referred to as an active matrix substrate for convenience.

In the case of manufacturing an active matrix liquid crystal display device, an active matrix substrate and a counter substrate provided with a counter electrode are bonded to each other with a liquid crystal layer interposed therebetween. Note that a common electrode electrically connected to the counter electrode on the counter substrate is provided over the active matrix substrate, and a fourth terminal electrically connected to the common electrode is provided in the terminal portion. The fourth terminal is provided so that the common electrode is set to a fixed potential such as GND or 0 V.

Figure 8:
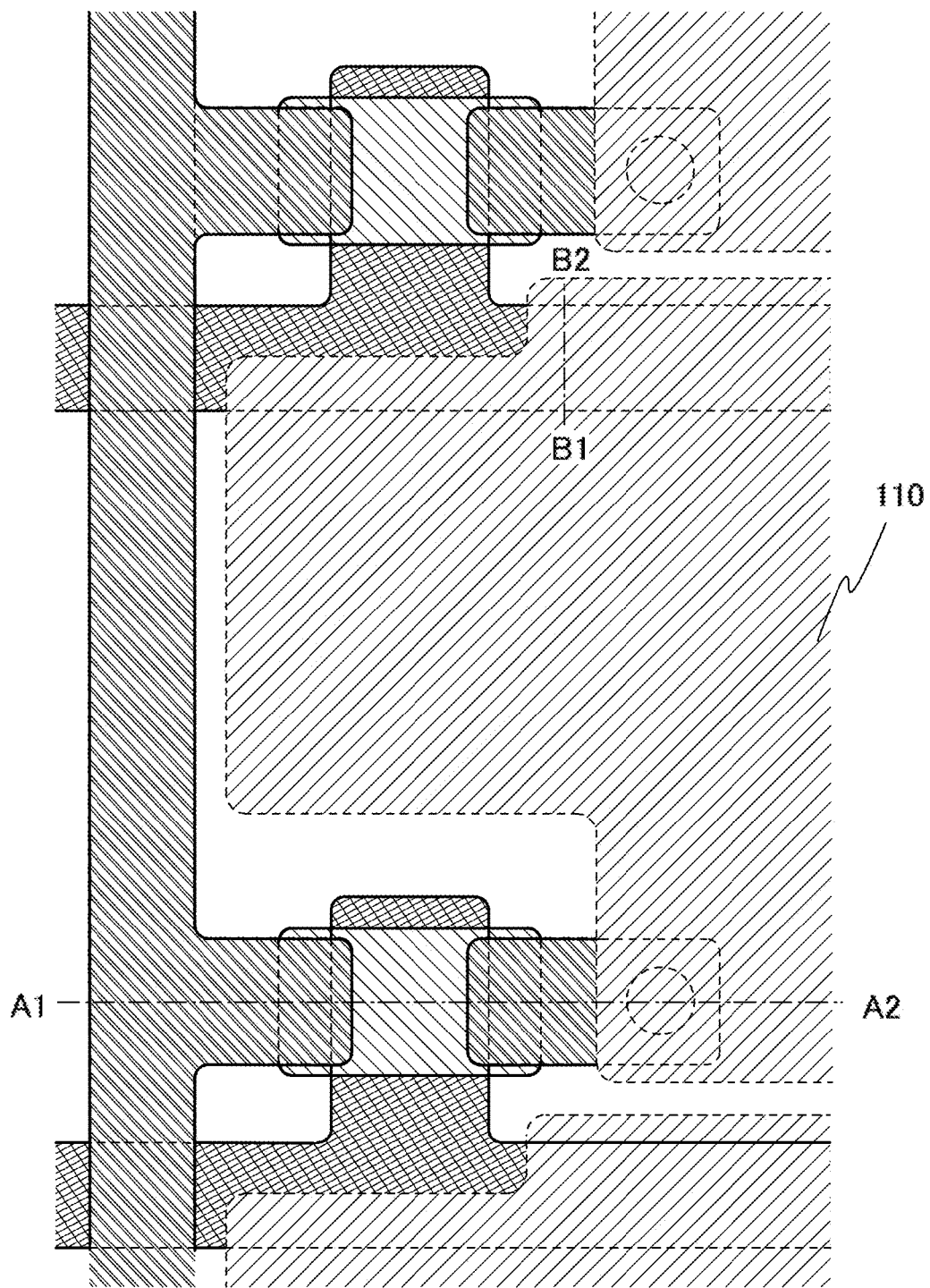
FIG. 8 illustrates a manufacturing method of a semiconductor device according to an embodiment of the present invention.

This embodiment is not limited to the pixel structure in FIG. 7, and an example of a plan view different from FIG. 7 is illustrated in FIG. 8. FIG. 8 illustrates an example in which a capacitor wiring is not provided and a storage capacitor is formed with a pixel electrode and a gate wiring of an adjacent pixel which overlap with each other with a protective insulating layer and a gate insulating layer interposed therebetween. In this case, the capacitor wiring and the third terminal connected to the capacitor wiring can be omitted. Note that in FIG. 8, the same portion as that in FIG. 7 is denoted by the same reference numeral.

In an active matrix liquid crystal display device, pixel electrodes arranged in a matrix form are driven to form a display pattern on a screen. Specifically, voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer.

In displaying moving images, a liquid crystal display device has a problem in that a long response time of liquid crystal molecules themselves causes afterimages or blurring of moving images. In order to improve the moving-image characteristics of the liquid crystal display device, a driving technique called black insertion is employed in which black is displayed on the whole screen every other frame period.

Further, there is another driving technique which is so-called double-frame rate driving. In the double-frame rate driving, a vertical synchronizing frequency is set 1.5 times or more, preferably, 2 times or more as high as a usual vertical synchronizing frequency, whereby the response speed is increased, and the grayscale to be written is selected for every plural fields which have been divided in each frame.

Further alternatively, in order to improve the moving-image characteristics of a liquid crystal display device, there is a driving method in which a plurality of LEDs (light-emitting diodes) or a plurality of EL light sources are used to form a surface light source as a backlight, and each light source of the surface light source is independently driven in a pulsed manner in one frame period. As the surface light source, three or more kinds of LEDs may be used and an LED emitting white light may be used. Since a plurality of LEDs can be controlled independently, the light emission timing of the LEDs can be synchronized with the timing at which a liquid crystal layer is optically modulated. According to this driving method, LEDs can be partly turned off; therefore, an effect of reducing power consumption can be obtained particularly in the case of displaying an image having a black displayed region in large part.

By combining these driving techniques, display characteristics of a liquid crystal display device, such as moving-image characteristics, can be improved as compared to those of conventional liquid crystal display devices.

The n-channel transistor obtained in this embodiment includes an oxide semiconductor layer for a channel formation region and has excellent dynamic characteristics; thus, it can be combined with any of these driving techniques.

In manufacturing a light-emitting display device, one electrode (also referred to as a cathode) of an organic light-emitting element is set to a low power supply potential such as GND or 0 V; thus, a terminal portion is provided with a fourth terminal for setting the cathode to a low power supply potential such as GND or 0 V. Also in manufacturing a light-emitting display device, a power supply line is provided in addition to a source wiring and a gate wiring. Accordingly, the terminal portion is provided with a fifth terminal electrically connected to the power supply line.

Through the above-described process, a transistor including an oxide layer which includes Zn and does not include a rare metal such as In or Ga can be provided. Further, the transistor including an oxide layer which includes Zn is formed by stacking an oxide semiconductor layer including insulating oxide over an oxide layer so that the oxide layer is overlaps with a source electrode layer or a drain electrode layer with the oxide semiconductor layer including insulating oxide interposed therebetween, whereby variation in the threshold voltage of the transistor can be reduced and electric characteristics can be stabilized. Further, an off current can be reduced.

By using the transistor for a pixel portion or a driver circuit portion of a display device, the display device with high electric characteristics and high reliability can be provided.

Note that the structure described in this embodiment can be implemented in combination with any of the structures described in other embodiments as appropriate.

Embodiment 3

In this embodiment, a transistor having a structure different from the transistor described in Embodiment 1 will be described with reference to FIGS. 31A and 31B.

Figure 31A:
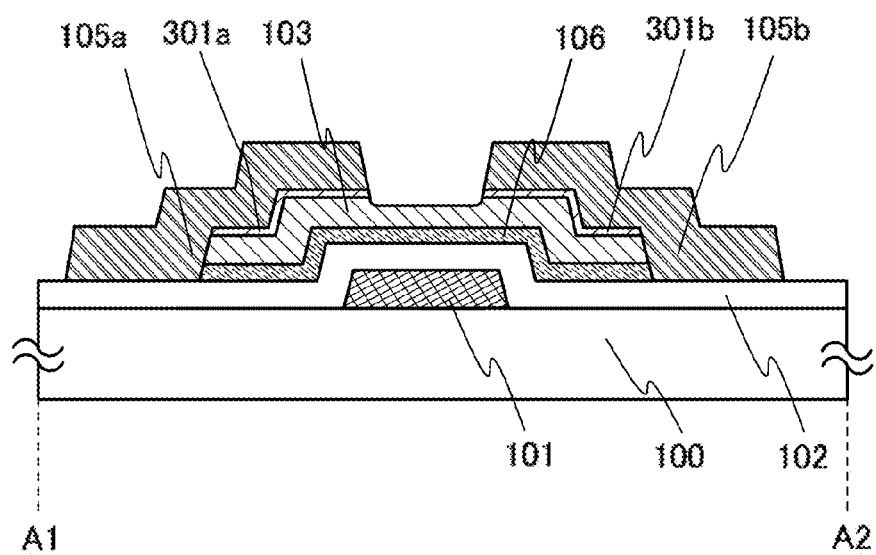
FIGS. 31A and 31B illustrate a semiconductor device according to an embodiment of the present invention.
Figure 31B:
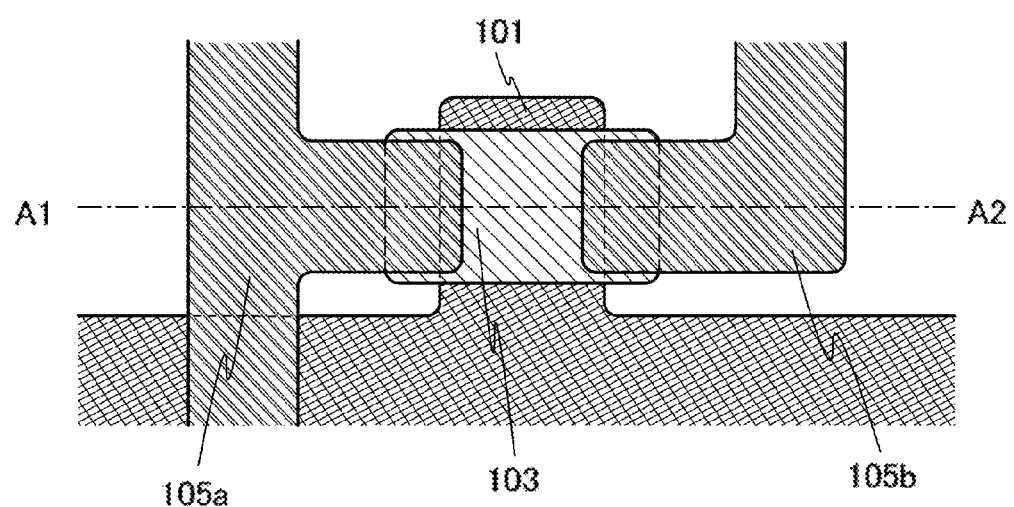

FIGS. 31A and 31B illustrate a transistor having a bottom gate structure of this embodiment. In the transistor illustrated in FIGS. 31A and 31B, the gate electrode layer 101 is provided over the substrate 100, the gate insulating layer 102 is provided over the gate electrode layer 101, the oxide layer 106 is provided over the gate insulating layer 102, the oxide semiconductor layer 103 including insulating oxide is provided over the oxide layer 106, buffer layers 301a and 301b are provided over the oxide semiconductor layer 103 including insulating oxide, and the source and drain electrode layers 105a and 105b are provided over the buffer layers 301a and 301b. Note that the oxide layer 106 and the oxide semiconductor layer 103 including insulating oxide include zinc (Zn). That is, the transistor illustrated in FIGS. 31A and 31B has a structure in which the buffer layers 301a and 301b are additionally provided between the oxide semiconductor layer 103 including insulating oxide and the source and drain electrode layers 105a and 105b in the transistor illustrated in FIGS. 1A and 1B in Embodiment 1.

The buffer layers 301a and 301b which function as a source and a drain region are preferably formed using a non-single-crystal film including a Zn—O-based or Sn—Zn—O-based oxide semiconductor in a manner similar to that of the oxide layer 106. Alternatively, a non-single-crystal film including a Zn—O-based or Sn—Zn—O-based oxide semiconductor including nitrogen may be used. The buffer layers 301a and 301b have n-type conductivity, and the conductivity is higher than that of the oxide semiconductor layer 103 including insulating oxide. Here, the buffer layers 301a and 301b may have any of an amorphous structure, a polycrystalline structure, a single crystal structure, or a structure including crystal grains (nano crystals). The crystal grains (nanocrystals) each have a diameter of 1 nm to 10 nm, typically approximately 2 nm to 4 nm.

The oxide semiconductor film used for the buffer layers 301a and 301b is formed in an atmosphere of a rare gas such as an argon gas and an oxygen gas by a sputtering method. In that case, by performing deposition under the condition where the flow rate of a rare gas such as an argon gas is higher than that of an oxygen gas or performing deposition in an atmosphere of only a rare gas such as an argon gas without using an oxygen gas, conductivity of the buffer layers 301a and 301b can be increased. The conductivity of the buffer layers 301a and 301b can also be increased when a nitrogen gas is used instead of the oxygen gas.

The thickness of the oxide semiconductor film used for the buffer layers 301a and 301b is 5 nm to 20 nm. Needless to say, in the case where a crystal grain is included in the film, the size of the crystal grain does not exceed the film thickness.

As described above, provision of the buffer layers 301a and 301b can make thermal stability improved more than formation of Schottky junction do, between the oxide layer 106 and the source and drain electrode layers 105a and 105b, whereby operating characteristics of the transistor can be stabilized. In addition, because of high electrical conductivity, favorable mobility can be kept even when high drain voltage is applied.

Note that as for a structure and materials of the transistor of this embodiment other than those of the buffer layers 301a and 301b, Embodiment 1 can be referred to.

A manufacturing process of the transistor of this embodiment is almost similar to the manufacturing process of the transistor described in Embodiment 2. First, by the method described in Embodiment 2, the process up to formation of the oxide semiconductor film for forming the oxide semiconductor layer 103 including insulating oxide is performed. Following the above process, the oxide semiconductor film for forming the buffer layers 301a and 301b is formed by sputtering with the use of the above method. Next, by a photolithography process, in a manner similar to that of formation of the oxide semiconductor layer 111 including insulating oxide and the oxide layer 106, the oxide semiconductor film for forming the buffer layers 301a and 301b is etched to have an island shape, whereby an oxide semiconductor film 302 is formed (see FIG. 32A). Then, by the method described in Embodiment 2, the process up to formation of the conductive film 112 is performed (see FIG. 32B). Next, by a photolithography process, in a manner similar to that of formation of the source and drain electrode layers 105a and 105b and the oxide semiconductor layer 103 including insulating oxide, the oxide semiconductor film 302 is etched to form the buffer layers 301a and 301b (see FIG. 32C). The following process is similar to that of Embodiment 2.

Note that the structure described in this embodiment can be implemented in combination with any of the structures described in other embodiments as appropriate.

Embodiment 4

In this embodiment, a transistor having a structure different from the transistors described in Embodiments 1 to 3 will be described with reference to FIGS. 35A to 35C.

Figure 35A:
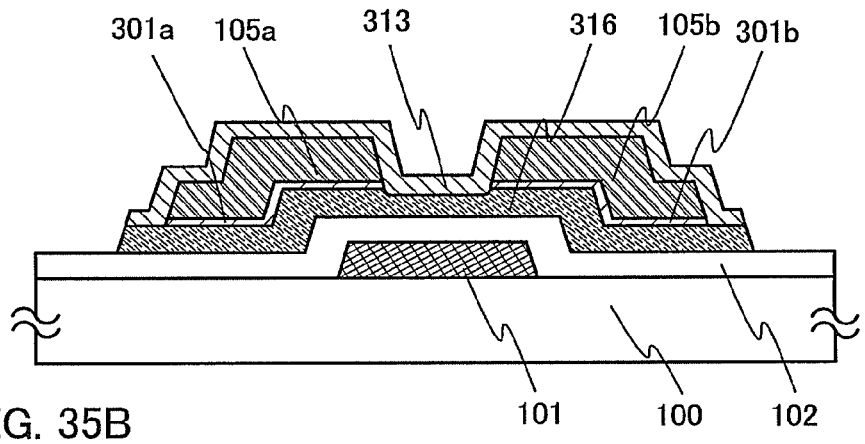
FIGS. 35A to 35C illustrate a semiconductor device according to an embodiment of the present invention.

In the transistor illustrated in FIG. 35A, the gate electrode layer 101 is provided over the substrate 100, the gate insulating layer 102 is provided over the gate electrode layer 101, an oxide layer 316 is provided over the gate insulating layer 102, the buffer layers 301a and 301b are provided over the oxide layer 316, the source and drain electrode layers 105a and 105b are provided over the buffer layers 301a and 301b, and an oxide semiconductor layer 313 including insulating oxide is provided over the source and drain electrode layers 105a and 105b and the oxide layer 316.

The oxide layer 316 includes zinc (Zn), and a layer similar to the oxide layer 106 described in Embodiment 1 is used. The oxide semiconductor layer 313 including insulating oxide is an oxide semiconductor layer including insulating oxide typified by $SiO_2$ and zinc (Zn) and having a conductivity lower than the oxide layer 106, and a layer similar to the oxide semiconductor layer 103 including insulating oxide described in Embodiment 1 is used. Further, the substrate 100, the gate electrode layer 101, the gate insulating layer 102, the buffer layers 301a and 301b, and the source and drain electrode layers 105a and 105b are similar to those described in Embodiments 1 to 3.

The oxide semiconductor layer 313 including insulating oxide is in contact with the oxide layer 316 at a peripheral portion of the oxide layer 316 and at a portion between the source and drain electrode layers 105a and 105b. The oxide layer 316 includes a region which is between the source and drain electrode layers 105a and 105b and whose thickness is smaller than that of a region overlapping with the source or drain electrode layer 105a or 105b. The oxide layer 316 is in contact with the oxide semiconductor layer 313 including insulating oxide at the region between the source and drain electrode layers 105a and 105b and the peripheral portion. Further, it is preferable that end portions of the oxide semiconductor layer 313 including insulating oxide and the oxide layer 316 are aligned with each other to form a continuous structure.

With the above-described structure, charge accumulated in a portion which is on the back channel side in the oxide layer 316 and overlaps with neither of the source and drain electrode layers 105a and 105b can be released into the oxide semiconductor layer 313 including insulating oxide and having a reduced conductivity. In addition, charge can be prevented from entering the back channel side of the oxide layer 316.

Figure 35B:
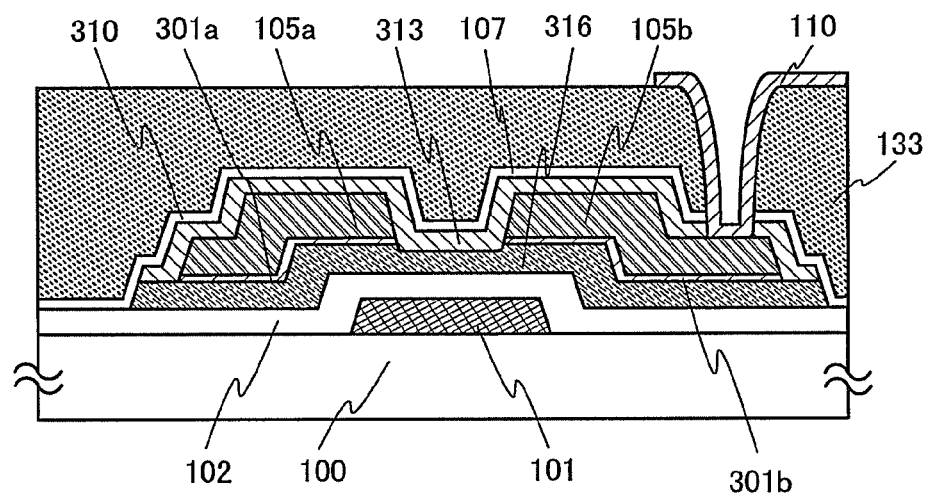

When the protective insulating layer 107 is provided over the transistor and the resin layer 133 is provided to cover the protective insulating layer 107 as illustrated in FIG. 35B, charge accumulation due to entry of moisture, hydrogen, and OH⁻ into the oxide layer 316 can be prevented. After forming a contact hole in the oxide semiconductor layer 313 including insulating oxide, the protective insulating layer 107, and the resin layer 133, the pixel electrode layer 110 is formed in contact with the source or drain electrode layer 105a or 105b.

Figure 35C:
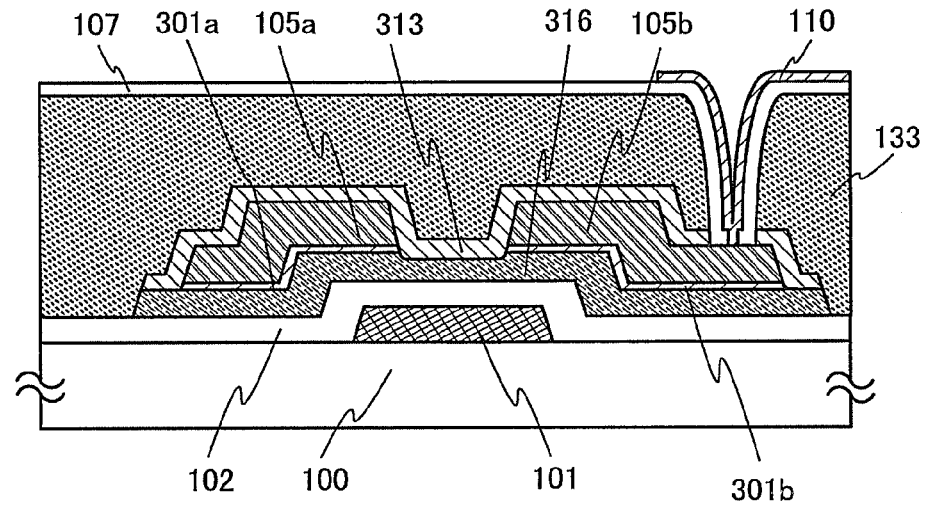

Alternatively, the resin layer 133 may be provided over the transistor and then the protective insulating layer 107 may be provided to cover the resin layer 133 as illustrated in FIG. 35C. This can prevent charge accumulation due to entry of moisture, hydrogen, and OH⁻ into the oxide layer 316. In addition, the resin layer 133 can protect the oxide semiconductor layer 313 including insulating oxide and the oxide layer 316 from plasma damage caused when the protective insulating layer 107 is formed. After forming a contact hole in the oxide semiconductor layer 313 including insulating oxide, the resin layer 133, and the protective insulating layer 107, the pixel electrode layer 110 is formed in contact with the source or drain electrode layer 105a or 105b.

Note that the structure described in this embodiment can be implemented in combination with any of the structures described in other embodiments as appropriate.

Embodiment 5

In this embodiment, an inverter circuit formed using two bottom-gate transistors described in Embodiment 1 will be described with reference to FIGS. 13A to 13C.

The driver circuit for driving a pixel portion is formed using an inverter circuit, a capacitor, a resistor, and the like. When the inverter circuit is formed using two n-channel TFTs in combination, there are an inverter circuit having a combination of an enhancement type transistor and a depletion type transistor (hereinafter, referred to as an EDMOS circuit) and an inverter circuit having a combination of two enhancement type TFTs (hereinafter, referred to as an EEMOS circuit). Note that an n-channel TFT whose threshold voltage is positive is referred to as an enhancement type transistor, and an n-channel TFT whose threshold voltage is negative is referred to as a depletion type transistor, throughout this specification.

The pixel portion and the driver circuit are formed over the same substrate. In the pixel portion, on and off of voltage application to a pixel electrode are switched using enhancement type transistors arranged in a matrix. The enhancement type transistors arranged in the pixel portion are formed using an oxide semiconductor.

Figure 13A:
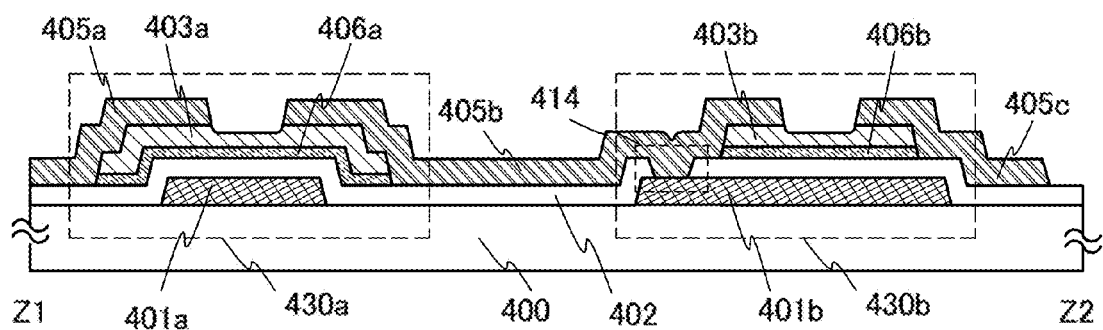
FIGS. 13A to 13C illustrate a semiconductor device according to an embodiment of the present invention.

FIG. 13A illustrates a cross-sectional structure of the inverter circuit of the driver circuit. Note that the inverted staggered transistor illustrated in FIGS. 1A and 1B is used for a first transistor 430a and a second transistor 430b in FIG. 13A. However, the structure of a transistor which can be used for the inverter circuit described in this embodiment is not limited to this.

In the first transistor 430a illustrated in FIG. 13A, a first gate electrode layer 401a is provided over a substrate 400, a gate insulating layer 402 is provided over the first gate electrode layer 401a, a first oxide layer 406a is provided over the gate insulating layer 402, a first oxide semiconductor layer 403a including insulating oxide is provided over the first oxide layer 406a, and a first wiring 405a and a second wiring 405b are provided over the first oxide semiconductor layer 403a including insulating oxide. In a similar manner, in the second transistor 430b, a second gate electrode layer 401b is provided over the substrate 400, the gate insulating layer 402 is provided over the second gate electrode layer 401b, a second oxide layer 406b is provided over the gate insulating layer 402, a second oxide semiconductor layer 403b including insulating oxide is provided over the second oxide layer 406b, and the second wiring 405b and a third wiring 405c are provided over the second oxide semiconductor layer 403b including insulating oxide. Here, the second wiring 405b is directly connected to the second gate electrode layer 401b through a contact hole 414 formed in the gate insulating layer 402. Note that as for the structures and materials of the respective portions, the transistor described above can be referred to.

The first wiring 405a is a power supply line at a ground potential (a ground power supply line). This power supply line at a ground potential may be a power supply line to which a negative voltage VDL is applied (a negative power supply line). The third wiring 405c is a power supply line to which a positive voltage VDD is applied (a positive power supply line).

As illustrated in FIG. 13A, the second wiring 405b which is electrically connected to both the first oxide semiconductor layer 403a including insulating oxide and the second oxide semiconductor layer 403b including insulating oxide is directly connected to the second gate electrode layer 401b of the second transistor 430b through the contact hole 414 formed in the gate insulating layer 402. By the direct connection between the second wiring 405b and the second gate electrode layer 401b, favorable contact can be obtained, which leads to a reduction in contact resistance. In comparison with the case where the second gate electrode layer 401b and the second wiring 405b are connected to each other with another conductive film, for example, a transparent conductive film interposed therebetween, reduction in the number of contact holes and reduction in an area occupied by the driver circuit due to the reduction in the number of contact holes can be achieved.

Figures 13B, 13C:
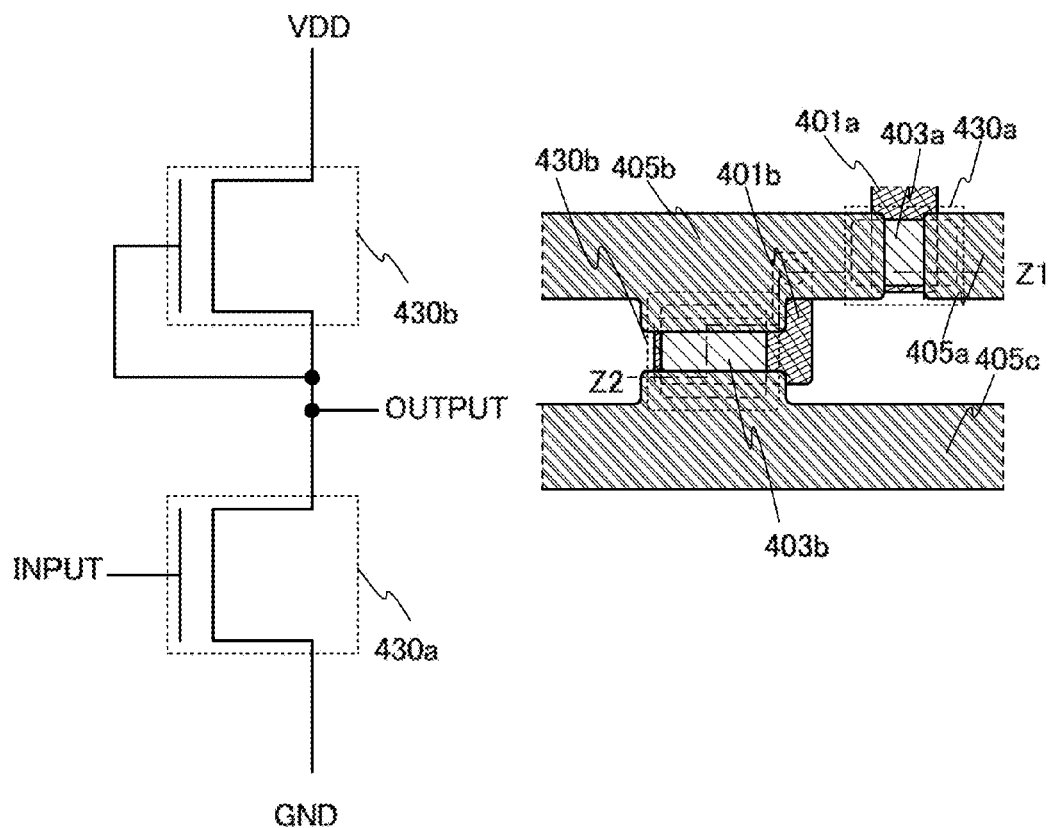

Further, FIG. 13C is a plan view of the inverter circuit of the driver circuit. A cross section taken along chain line Z1-Z2 in FIG. 13C corresponds to FIG. 13A.

Further, FIG. 13B illustrates an equivalent circuit of the EDMOS circuit. The circuit connection illustrated in FIGS. 13A and 13C corresponds to that illustrated in FIG. 13B. An example in which the first transistor 430a is an enhancement type n-channel transistor and the second transistor 430b is a depletion type n-channel transistor is illustrated.

In order to manufacture an enhancement type n-channel transistor and a depletion type n-channel transistor over one substrate, for example, the first oxide semiconductor layer 403a including insulating oxide and the first oxide layer 406a are formed using different materials or under different conditions from those of the second oxide semiconductor layer 403b including insulating oxide and the second oxide layer 406b. Alternatively, an EDMOS circuit may be formed in such a manner that gate electrodes are provided over and under the oxide semiconductor layer to control the threshold value and a voltage is applied to the gate electrodes so that one of the TFTs is normally on while the other TFT is normally off.

Alternatively, without limitation to the EDMOS circuit, an EEMOS circuit may be formed, in which the first transistor 430a and the second transistor 430b are enhancement type n-channel transistors. In that case, the third wiring 405c and the second gate electrode layer 401b are connected to each other instead of the connection between the second wiring 405b and the second gate electrode layer 401b.

Transistors of this embodiment are formed by stacking an oxide semiconductor layer including insulating oxide over an oxide layer including Zn so that the oxide layer is overlaps with a source electrode layer or a drain electrode layer with the oxide semiconductor layer including insulating oxide interposed therebetween, whereby variation in the threshold voltage of the transistors can be reduced and electric characteristics can be stabilized. Therefore, the circuit characteristics of the inverter circuit described in this embodiment can be improved.

Note that the structure described in this embodiment can be implemented in combination with any of the structures described in other embodiments as appropriate.

Embodiment 6

In this embodiment, an example is described below in which in a display device which is an example of a semiconductor device, at least a part of a driver circuit and a transistor of a pixel portion are formed over one substrate.

The transistor of the pixel portion is formed in accordance with Embodiment 2. Further, the transistor described in any of Embodiments 1 to 4 is an n-channel TFT, and thus a part of a driver circuit that can be formed of n-channel TFTs among driver circuits is formed over the same substrate as the transistor of the pixel portion.

Figure 14A:
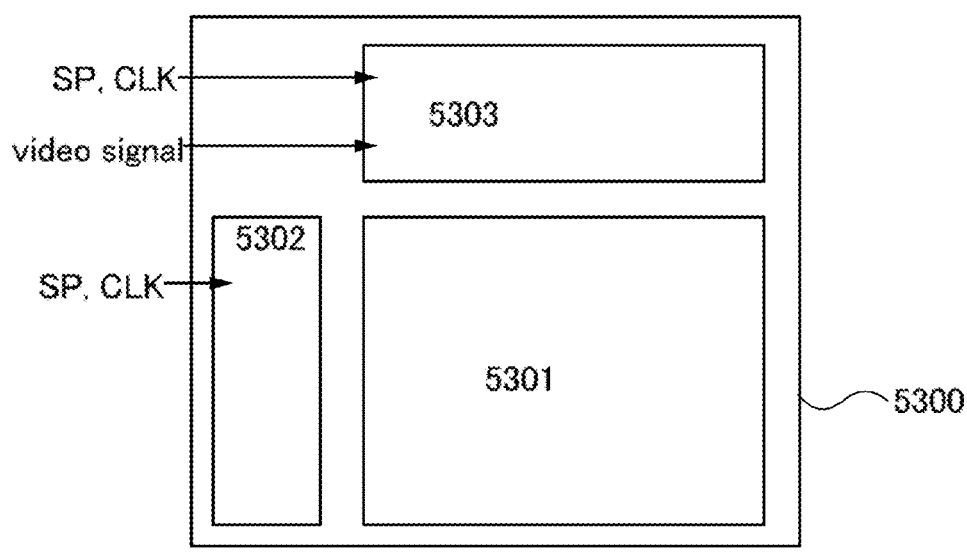
FIGS. 14A and 14B are block diagrams each illustrating a semiconductor device.

FIG. 14A illustrates an example of a block diagram of an active matrix liquid crystal display device which is an example of a semiconductor device. The display device illustrated in FIG. 14A includes, over a substrate 5300, a pixel portion 5301 including a plurality of pixels each provided with a display element; a scan line driver circuit 5302 that selects a pixel; and a signal line driver circuit 5303 that controls input of a video signal to the selected pixel.

The pixel portion 5301 is connected to the signal line driver circuit 5303 by a plurality of signal lines S1 to Sm (not illustrated) that extend in a column direction from the signal line driver circuit 5303, and to the scan line driver circuit 5302 by a plurality of scan lines G1 to Gn (not illustrated) that extend in a row direction from the scan line driver circuit 5302. The pixel portion 5301 includes a plurality of pixels (not illustrated) arranged in matrix corresponding to the signal lines S1 to Sm and the scan lines G1 to Gn. Each pixel is connected to a signal line Sj (any one of the signal lines S1 to Sm) and a scan line Gi (any one of the scan lines G1 to Gn).

In addition, the transistor described in any of Embodiments 1 to 4 is an n-channel TFT, and a signal line driver circuit including the n-channel TFT will be described with reference to FIG. 15.

Figure 15:
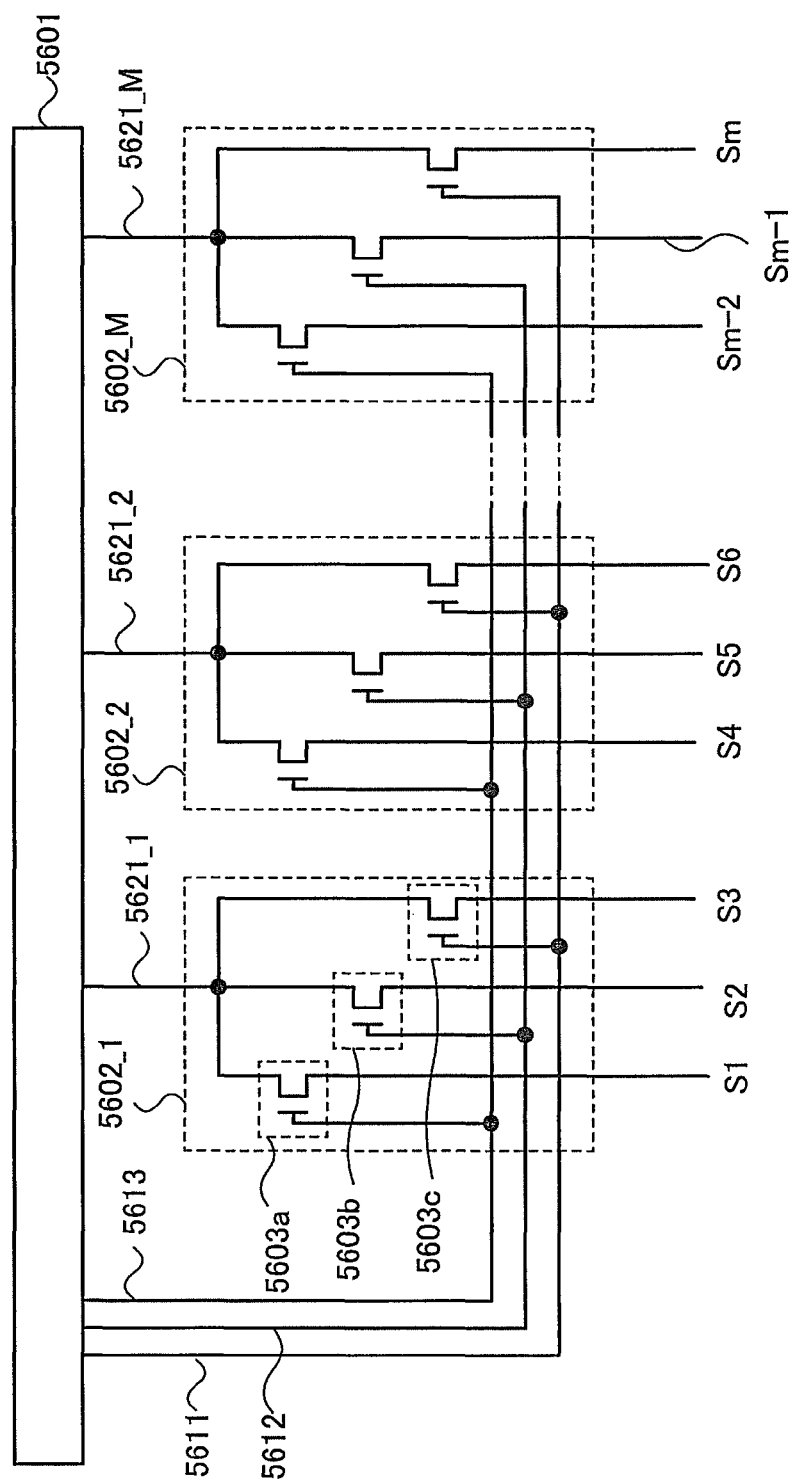
FIG. 15 illustrates a configuration of a signal line driver circuit.

The signal line driver circuit illustrated in FIG. 15 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first film transistor 5603a, a second transistor 5603b, and a third transistor 5603c.

The driver IC 5601 is connected to the first wiring 5611, the second wiring 5612, the third wiring 5613, and the wirings 5621_1 to 5621_M. The switch groups 5602_1 to 5602_M are connected to the wirings 5621_1 to 5621_M corresponding to the switch groups 5602_1 to 5602_M, respectively, and are each connected to the first wiring 5611, the second wiring 5612, and the third wiring 5613. Each of the wirings 5621_1 to 5621_M is connected to three signal lines (a signal line Sm−2, a signal line Sm−1, and a signal line Sm (m=3M)) via the first transistor 5603a, the second transistor 5603b, and the third transistor 5603c. For example, the wiring 5621_J of the J-th column (one of the wirings 5621_1 to 5621_M) is connected to a signal line Sj−2, a signal line Sj−1, and a signal line Sj (j=3J) via the first transistor 5603a, the second transistor 5603b, and the third transistor 5603c included in the switch group 5602_J.

Note that a signal is input to each of the first wiring 5611, the second wiring 5612, and the third wiring 5613.

Note that the driver IC 5601 is desirably formed using a single crystal semiconductor. The switch groups 5602_1 to 5602_M are desirably formed over the same substrate as the pixel portion. Therefore, the driver IC 5601 and the switch groups 5602_1 to 5602_M are preferably connected via an FPC or the like. Alternatively, a single crystal semiconductor layer may be provided over the same substrate as the pixel portion by a method such as bonding to form the driver IC 5601.

Figure 16:
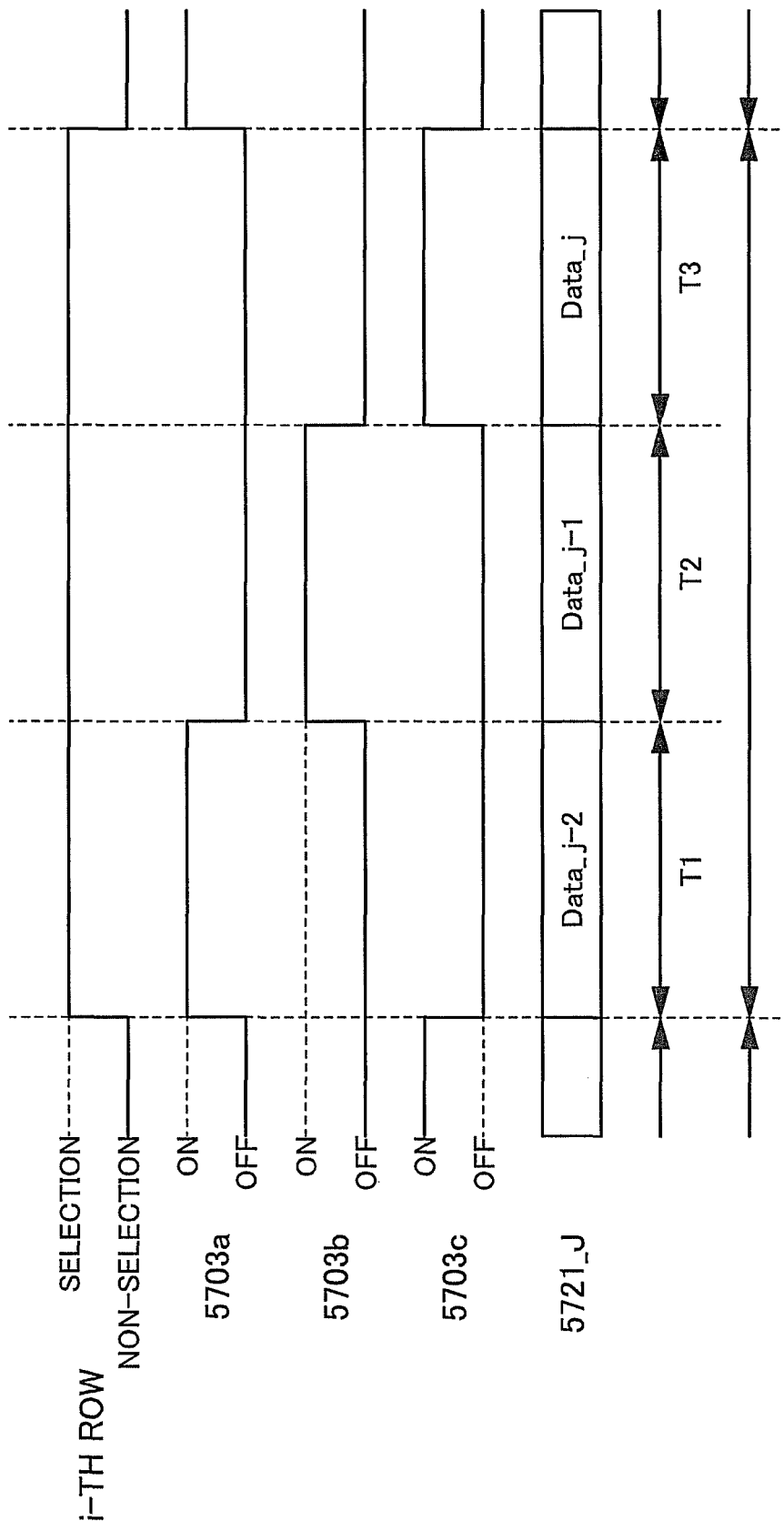
FIG. 16 is a timing chart of operation of a signal line driver circuit.

Next, operation of the signal line driver circuit illustrated in FIG. 15 will be described with reference to a timing chart in FIG. 16. Note that the timing chart in FIG. 16 shows the case where the scan line Gi of the i-th row is selected. A selection period of the scan line Gi of the i-th row is divided into a first sub-selection period T1, a second sub-selection period T2, and a third sub-selection period T3. In addition, the signal line driver circuit in FIG. 15 operates similarly to FIG. 16 even when a scan line of another row is selected.

Note that the timing chart in FIG. 16 shows the case where the wiring 5621_J of the J-th column is connected to the signal line Sj−2, the signal line Sj−1, and the signal line Sj via the first transistor 5603a, the second transistor 5603b, and the third transistor 5603c, respectively.

Note that the timing chart in FIG. 16 shows timing at which the scan line Gi of the i-th row is selected, timing 5703a of on/off of the first transistor 5603a, timing 5703b of on/off of the second transistor 5603b, timing 5703c of on/off of the third transistor 5603c, and a signal 5721_J input to the wiring 5621_J of the J-th column.

Note that in the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj−2, a video signal input to the wiring 5621_J in the second sub-selection period T2 is input to the signal line Sj−1, and a video signal input to the wiring 5621_J in the third sub-selection period T3 is input to the signal line Sj. In addition, in the first sub-selection period T1, the second sub-selection period T2, and the third sub-selection period T3, the video signals input to the wiring 5621_J are denoted by $Data_{13} j-2$, $Data_{13} j-1$, and $Data_{13} j$.

As illustrated in FIG. 16, in the first sub-selection period T1, the first transistor 5603a is on, and the second transistor 5603b and the third transistor 5603c are off. At this time, $Data_{13} j-2$ input to the wiring 5621_J is input to the signal line Sj−2 via the first transistor 5603a. In the second sub-selection period T2, the second transistor 5603b is on, and the first transistor 5603a and the third transistor 5603c are off. At this time, $Data_{13} j-1$ input to the wiring 5621_J is input to the signal line Sj−1 via the second transistor 5603b. In the third sub-selection period T3, the third transistor 5603c is on, and the first transistor 5603a and the second transistor 5603b are off. At this time, $Data_{13} j$ input to the wiring 5621_J is input to the signal line Sj via the third transistor 5603c.

In the above-described manner, in the signal line driver circuit in FIG. 15, by dividing one gate selection period into three, video signals can be input to three signal lines from one wiring 5621 in one gate selection period. Therefore, in the signal line driver circuit in FIG. 15, the number of connections of the substrate provided with the driver IC 5601 and the substrate provided with the pixel portion can be approximately ⅓ of the number of signal lines. The number of connections is reduced to approximately ⅓ of the number of the signal lines, so that reliability, yield, and the like of the signal line driver circuit in FIG. 15 can be improved.

Note that there is no particular limitation on the arrangement, the number, a driving method, and the like of the transistors, as long as one gate selection period is divided into a plurality of sub-selection periods and video signals are input to a plurality of signal lines from one wiring in the corresponding sub-selection periods as illustrated in FIG. 15.

For example, when video signals are input to three or more signal lines from one wiring in three or more sub-selection periods, it is only necessary to add a transistor and a wiring for controlling the transistor. It is to be noted that when one selection period is divided into four or more sub-selection periods, one sub-selection period becomes shorter. Therefore, one selection period is desirably divided into two or three sub-selection periods.

Figure 17:
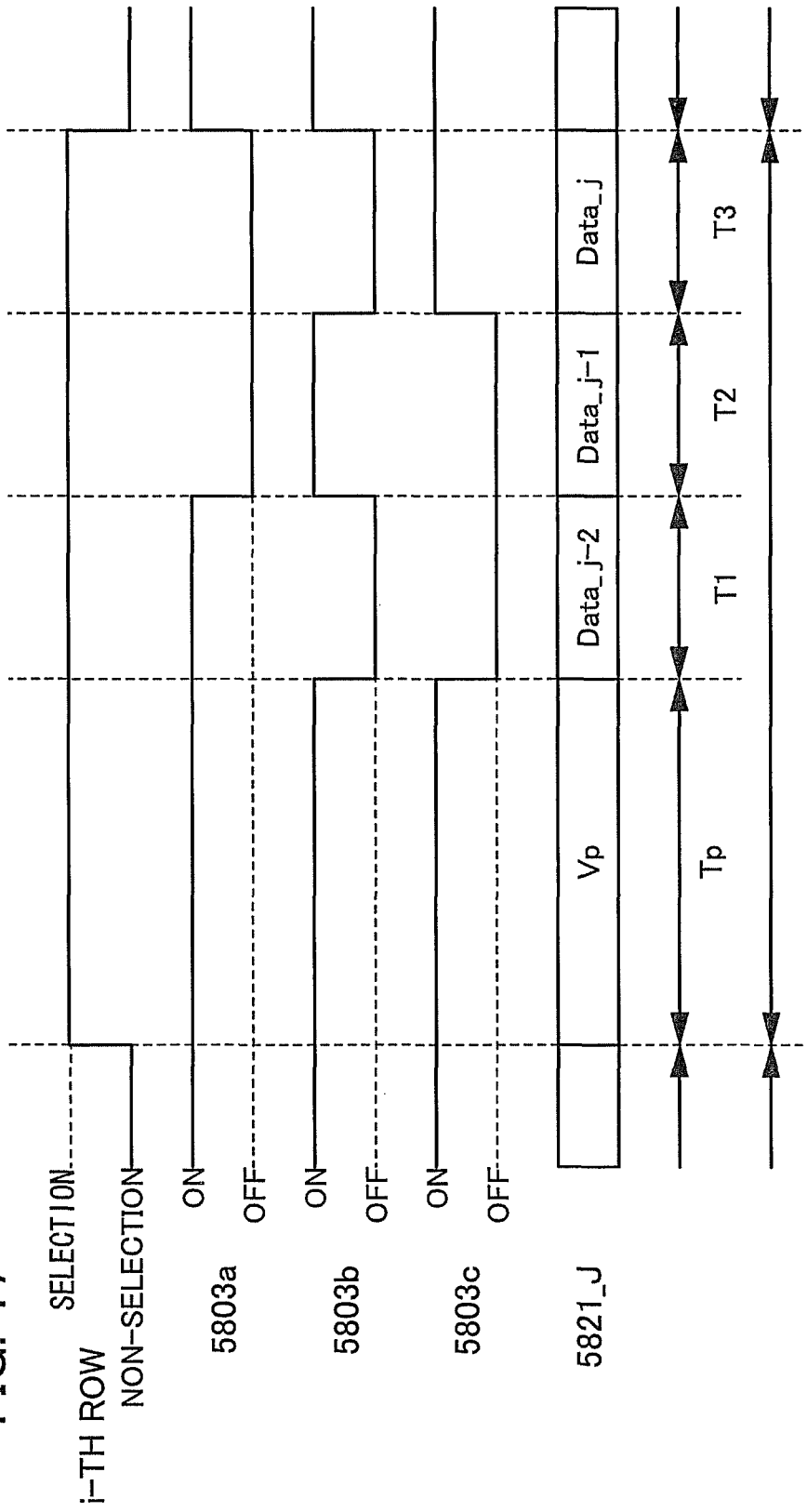
FIG. 17 is a timing chart of operation of a signal line driver circuit.

As another example, one selection period may be divided into a precharge period Tp, the first sub-selection period T1, the second sub-selection period T2, and the third sub-selection period T3 as illustrated in a timing chart in FIG. 17. The timing chart in FIG. 17 shows timing at which the scan line Gi of the i-th row is selected, timing 5803*a* of on/off of the first transistor 5603*a*, timing 5803*b* of on/off of the second transistor 5603*b*, timing 5803*c* of on/off of the third transistor 5603*c*, and a signal 5821_J input to the wiring 5621_J of the J-th column. As illustrated in FIG. 17, the first transistor 5603*a*, the second transistor 5603*b*, and the third transistor 5603*c* are on in the precharge period Tp. At this time, a precharge voltage Vp input to the wiring 5621_J is input to each of the signal line Sj−2, the signal line Sj−1, and the signal line Sj via the first transistor 5603*a*, the second transistor 5603*b*, and the third transistor 5603*c*, respectively. In the first sub-selection period T1, the first transistor 5603*a* is on, and the second transistor 5603*b* and the third transistor 5603*c* are off. At this time, Data_j−2 input to the wiring 5621_J is input to the signal line Sj−2 via the first transistor 5603*a*. In the second sub-selection period T2, the second transistor 5603*b* is on, and the first transistor 5603*a* and the third transistor 5603*c* are off. At this time, Data_j−1 input to the wiring 5621_J is input to the signal line Sj−1 via the second transistor 5603*b*. In the third sub-selection period T3, the third transistor 5603*c* is on, and the first transistor 5603*a* and the second transistor 5603*b* are off. At this time, Data$_{13}$ j input to the wiring 5621_J is input to the signal line Sj via the third transistor 5603*c*.

In the above-described manner, in the signal line driver circuit in FIG. 15 to which the timing chart in FIG. 17 is applied, the video signal can be written to the pixel at high speed because the signal line can be precharged by providing a precharge selection period before a sub-selection period. Note that portions in FIG. 17 which are similar to those of FIG. 16 are denoted by common reference numerals and detailed description of the portions which are the same and portions which have similar functions is omitted.

Further, a structure of a scan line driver circuit is described. The scan line driver circuit includes a shift register and a buffer. Additionally, the scan line driver circuit may include a level shifter in some cases. In the scan line driver circuit, when the clock signal (CLK) and the start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Further, since the transistors in the pixels of one line have to be turned on at the same time, a buffer which can feed a large amount of current is used.

One mode of a shift register used for a part of the scan line driver circuit will be described with reference to FIG. 18 and FIG. 19.

Figure 18:
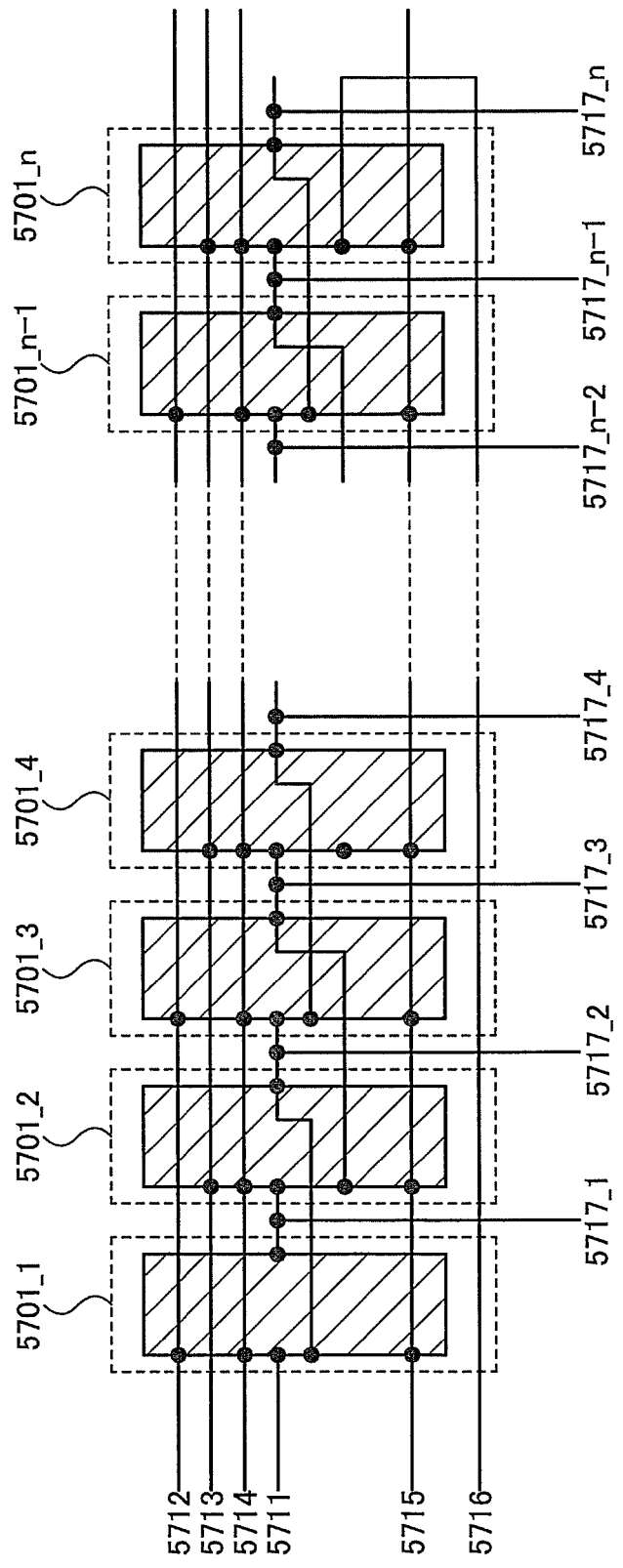
FIG. 18 illustrates a configuration of a shift register.

FIG. 18 illustrates a circuit configuration of the shift register. The shift register shown in FIG. 18 includes a plurality of flip-flops, flip-flops 5701_1 to 5701_*n*. The shift register is operated with input of a first clock signal, a second clock signal, a start pulse signal, and a reset signal.

The connection relationship of the shift register of FIG. 18 will be described. The flip-flop 5701_1 of a first stage is connected to a first wiring 5711, a second wiring 5712, a fourth wiring 5714, a fifth wiring 5715, a seventh wiring 5717_1, and a seventh wiring 5717_2. The flip-flop 5701_2 of a second stage is connected to a third wiring 5713, the fourth wiring 5714, the fifth wiring 5715, the seventh wiring 5717_1, the seventh wiring 5717_2, and a seventh wiring 5717_3.

In a similar manner, the i-th stage flip-flop 5701_*i* (any one of flip-flops 5701_1 to 5701_*n*) is connected to one of the second wiring 5712 and the third wiring 5713, the fourth wiring 5714, the fifth wiring 5715, a seventh wiring 5717_*i*−1, a seventh wiring 5717_*i*, and a seventh wiring 5717_*i*+1. Here, when i is an odd number, the i-th stage flip-flop 5701_*i* is connected to the second wiring 5712, whereas when i is an even number, the i-th stage flip-flop 5701_*i* is connected to the third wiring 5713.

The n-th stage flip-flop 5701_*n* is connected to one of the second wiring 5712 and the third wiring 5713, the fourth wiring 5714, the fifth wiring 5715, a seventh wiring 5717_*n*−1, a seventh wiring 5717_*n*, and a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power supply line and a second power supply line, respectively.

Next, details of the flip-flop illustrated in FIG. 18 are described with reference to FIG. 19. The flip-flop illustrated in FIG. 19 includes a first transistor 5571, a second transistor 5572, a third transistor 5573, a fourth transistor 5574, a fifth transistor 5575, a sixth transistor 5576, a seventh transistor 5577, and an eighth transistor 5578. Note that each of the first transistor 5571, the second transistor 5572, the third transistor 5573, the fourth transistor 5574, the fifth transistor 5575, the sixth transistor 5576, the seventh transistor 5577, and the eighth transistor 5578 is an n-channel transistor and is turned on when the gate-source voltage (Vgs) exceeds the threshold voltage (Vth).

Figure 19:
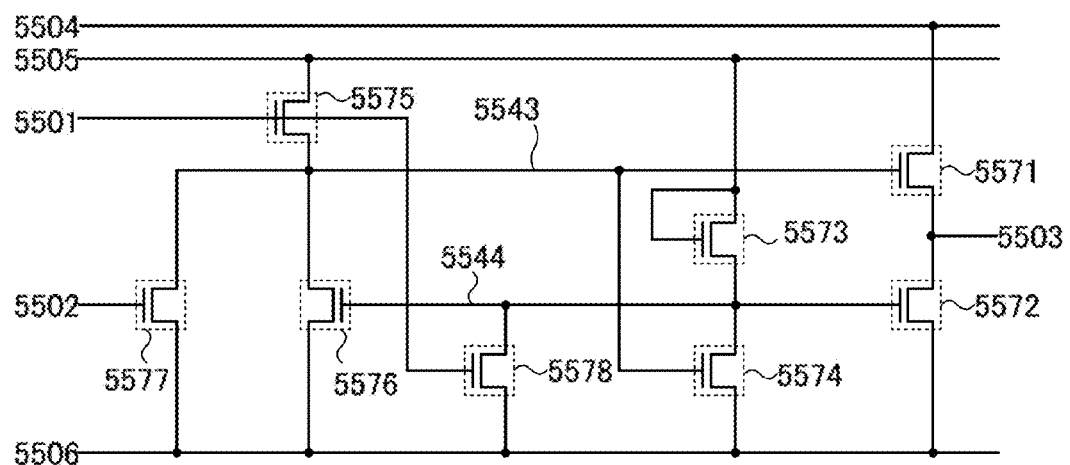
FIG. 19 illustrates a connection structure of the flip-flop in FIG. 18.

The flip-flop illustrated in FIG. 19 includes a first wiring 5501, a second wiring 5502, a third wiring 5503, a fourth wiring 5504, a fifth wiring 5505, and a sixth wiring 5506.

Here, an example is described in which all the transistors are enhancement-type n-channel transistors; however, the present invention is not limited thereto. For example, the driver circuits may be driven with the use of depletion-type n-channel transistors.

Next, connection structures of the flip-flop illustrated in FIG. 18 will be described below.

A first electrode (one of a source electrode and a drain electrode) of the first transistor 5571 is connected to the fourth wiring 5504. A second electrode (the other of the source electrode and the drain electrode) of the first transistor 5571 is connected to the third wiring 5503.

A first electrode of the second transistor 5572 is connected to the sixth wiring 5506. A second electrode of the second transistor 5572 is connected to the third wiring 5503.

A first electrode of the third transistor 5573 is connected to the fifth wiring 5505. A second electrode of the third transistor 5573 is connected to a gate electrode of the second transistor 5572. A gate electrode of the third transistor 5573 is connected to the fifth wiring 5505.

A first electrode of the fourth transistor 5574 is connected to the sixth wiring 5506. A second electrode of the fourth transistor 5574 is connected to the gate electrode of the second transistor 5572. A gate electrode of the fourth transistor 5574 is connected to a gate electrode of the first transistor 5571.

A first electrode of the fifth transistor 5575 is connected to the fifth wiring 5505. A second electrode of the fifth transistor 5575 is connected to the gate electrode of the first transistor 5571. A gate electrode of the fifth transistor 5575 is connected to the first wiring 5501

A first electrode of the sixth transistor 5576 is connected to the sixth wiring 5506. A second electrode of the sixth transistor 5576 is connected to the gate electrode of the first transistor 5571. A gate electrode of the sixth transistor 5576 is connected to the gate electrode of the second transistor 5572.

A first electrode of the seventh transistor 5577 is connected to the sixth wiring 5506. A second electrode of the seventh transistor 5577 is connected to the gate electrode of the first transistor 5571. A gate electrode of the seventh transistor 5577 is connected to the second wiring 5502.

A first electrode of the eighth transistor 5578 is connected to the sixth wiring 5506. A second electrode of the eighth transistor 5578 is connected to the gate electrode of the second transistor 5572. A gate electrode of the eighth transistor 5578 is connected to the first wiring 5501.

Note that the point at which the gate electrode of the first transistor 5571, the gate electrode of the fourth transistor 5574, the second electrode of the fifth transistor 5575, the second electrode of the sixth transistor 5576, and the second electrode of the seventh transistor 5577 are connected is referred to as a node 5543. The point at which the gate electrode of the second transistor 5572, the second electrode of the third transistor 5573, the second electrode of the fourth transistor 5574, the gate electrode of the sixth transistor 5576, and the second electrode of the eighth transistor 5578 are connected is referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power supply line and a second power supply line, respectively.

In the i-th stage flip-flop 5701_*i*, the first wiring 5501 in FIG. 19 is connected to the seventh wiring 5717_*i*−1 in FIG. 18; the second wiring 5502 in FIG. 19 is connected to the seventh wiring 5717_*i*+1 in FIG. 18; the third wiring 5503 in FIG. 19 is connected to the seventh wiring 5717_*i* in FIG. 18; and the sixth wiring 5506 in FIG. 19 is connected to the fifth wiring 5715 in FIG. 18.

When i is an odd number, the fourth wiring 5504 in FIG. 19 is connected to the second wiring 5712 in FIG. 18, whereas when i is an even number, the fourth wiring 5504 is connected to the third wiring 5713 in FIG. 18. In addition, the fifth wiring 5505 in FIG. 19 is connected to the fourth wiring 5714 in FIG. 18.

It is to be note that in the first stage flip-flop 5701_1, the first wiring 5501 in FIG. 19 is connected to the first wiring 5711 in FIG. 18. In the n-th stage flip-flop 5701_*n*, the second wiring 5502 in FIG. 19 is connected to the sixth wiring 5716 in FIG. 18.

In addition, the signal line driver circuit and the scan line driver circuit can be formed using only the n-channel TFTs described in any of Embodiments 1 to 4. The n-channel TFT described in any of Embodiments 1 to 4 has a high mobility, and thus a driving frequency of a driver circuit can be increased. Further, in the case of the n-channel TFT described in any of Embodiments 1 to 4, since parasitic capacitance is reduced by using an oxide semiconductor layer, frequency characteristics (also referred to as f characteristics) is favorable. For example, a scan line driver circuit using the n-channel TFT described in any of Embodiments 1 to 4 can be operated at high speed, and thus a frame frequency can be increased and insertion of black images can be realized.

In addition, when, for example, the channel width of the transistor in the scan line driver circuit is increased or a plurality of scan line driver circuits are provided, higher frame frequency can be realized. When a plurality of scan line driver circuits are provided, a scan line driver circuit for driving even-numbered scan lines is provided on one side and a scan line driver circuit for driving odd-numbered scan lines is provided on the opposite side; thus, increase in frame frequency can be realized. Furthermore, the use of the plurality of scan line driver circuits for output of signals to the same scan line is advantageous in increasing the size of a display device.

Figure 14B:
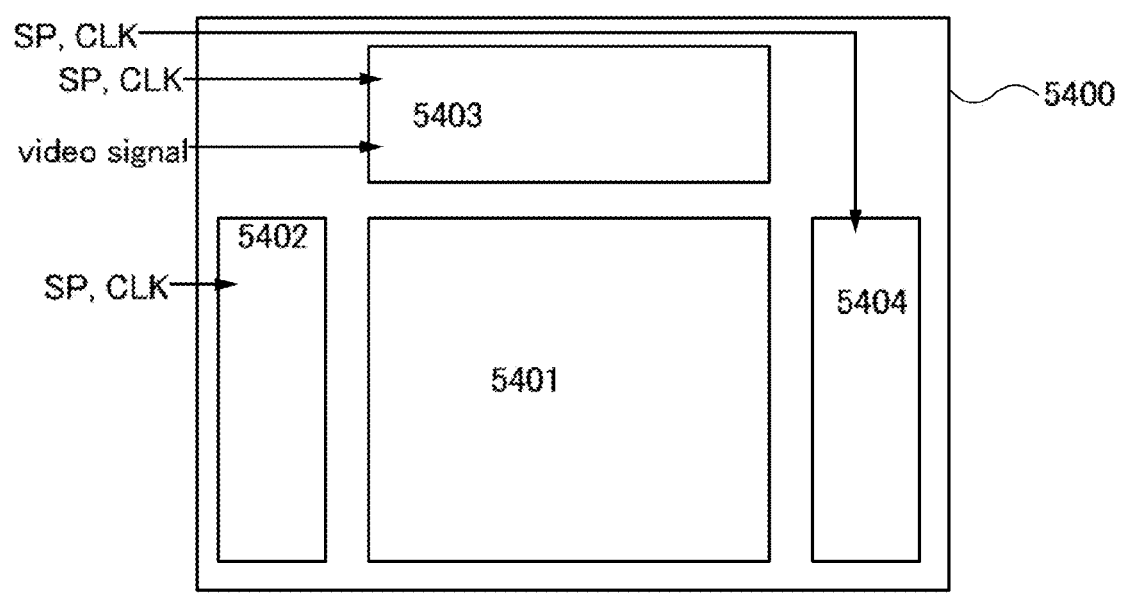

Further, when an active matrix light-emitting display device which is an example of a semiconductor device is manufactured, a plurality of transistors are arranged in at least one pixel, and thus a plurality of scan line driver circuits are preferably arranged. FIG. 14B is a block diagram illustrating an example of an active matrix light-emitting display device.

The light-emitting display device illustrated in FIG. 14B includes, over a substrate 5400, a pixel portion 5401 having a plurality of pixels each provided with a display element, a first scan line driver circuit 5402 and a second scan line driver circuit 5404 each select a pixel, and a signal line driver circuit 5403 that controls input of a video signal to the selected pixel.

When the video signal input to a pixel of the light-emitting display device illustrated in FIG. 14B is a digital signal, the pixel emits or does not emit light by switching of on/off of a transistor. Thus, grayscale can be displayed using an area ratio grayscale method or a time ratio grayscale method. An area ratio grayscale method refers to a driving method by which one pixel is divided into a plurality of subpixels and the subpixels are driven independently based on video signals so that grayscale is displayed. Further, a time ratio grayscale method refers to a driving method by which a period during which a pixel is in a light-emitting state is controlled so that grayscale is displayed.

Since the response speed of light-emitting elements is higher than that of liquid crystal elements or the like, the light-emitting elements are more suitable for a time ratio grayscale method than liquid-crystal display elements. Specifically, in the case of performing display with a time grayscale method, one frame period is divided into a plurality of subframe periods. Then, in accordance with video signals, the light-emitting element in the pixel is set in a light-emitting state or a non-light-emitting state in each subframe period. By dividing one frame into a plurality of subframes, the total length of time, in which pixels actually emit light in one frame period, can be controlled with video signals so that gray scales can be displayed.

In the example of the light-emitting display device illustrated in FIG. 14B, in the case where two switching TFTs are arranged in one pixel, the first scan line driver circuit 5402 generates a signal which is input to a first scan line serving as a gate wiring of one of the switching TFTs, and the second scan line driver circuit 5404 generates a signal which is input to a second scan line serving as a gate wiring of the other switching TFT; however, one scan line driver circuit may generate both the signal which is input to the first scan line and the signal which is input to the second scan line. In addition, for example, there is a possibility that a plurality of scan lines used for controlling the operation of a switching element are provided in each pixel, depending on the number of switching TFTs included in the pixel. In that case, one scan line driver circuit may generate all signals that are input to the plurality of scan lines, or a plurality of scan line driver circuits may generate signals that are input to the plurality of scan lines.

In addition, also in the light-emitting display device, a part of the driver circuits that can be formed of n-channel TFTs among driver circuits can be formed over the same substrate as the thin film transistors of the pixel portion. Alternatively, the signal line driver circuit and the scan line driver circuit can be formed using only the n-channel TFTs described in any of Embodiment 1 to 4.

Moreover, the above-described driver circuit can be used for electronic paper that drives electronic ink using an element electrically connected to a switching element, without being limited to applications to a liquid crystal display device or a light-emitting display device. Electronic paper is also referred to as an electrophoretic display device (electrophoretic display) and has advantages in that it has the same level of readability as plain paper, it has lower power consumption than other display devices, and it can be made thin and lightweight.

Through the aforementioned process, a highly reliable display device with stable electric characteristics as a semiconductor device can be manufactured.

Note that the structure described in this embodiment can be implemented in combination with any of the structures described in other embodiments as appropriate.

Embodiment 7

The transistor described in any of Embodiments 1 to 4 is manufactured, and a semiconductor device having a display function (also referred to as a display device) can be manufactured using the transistor for a pixel portion and further for a driver circuit. Further, part or whole of a driver circuit can be formed over the same substrate as a pixel portion, using the transistor described in any of Embodiments 1 to 4, whereby a system-on-panel can be obtained.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by a current or a voltage, and specifically include an inorganic electroluminescent (EL) element, an organic EL element, and the like. Further, a display medium whose contrast is changed by an electric effect, such as an electronic ink, can be used.

Further, a display device includes a panel in which a display element is sealed, and a module in which an IC or the like including a controller is mounted to the panel. An embodiment of the present invention further relates to one mode of an element substrate before the display element is completed in a manufacturing process of the display device, and the element substrate is provided with means to supply current to the display element in each of a plurality of pixels. Specifically, the element substrate may be in a state provided with only a pixel electrode of the display element, a state after a conductive film to be a pixel electrode is formed and before the conductive film is etched to form the pixel electrode, or any of other states.

Note that a display device in this specification means an image display device, a display device, or a light source (including a lighting device). Further, the display device includes any of the following modules in its category: a module to which a connector such as a flexible printed circuit (FPC), tape automated bonding (TAB) tape, or a tape carrier package (TCP) is attached; a module having TAB tape or a TCP which is provided with a printed wiring board at the end thereof; and a module having an integrated circuit (IC) which is directly mounted on a display element by a chip on glass (COG) method.

In this embodiment, the appearance and a cross section of liquid crystal display panels which are embodiments of a semiconductor device will be described with reference to FIGS. 20A1, 20A2, and 20B. FIGS. 20A1 and 20A2 are each a plan view of a panel in which highly reliable transistors 4010 and 4011 each having stable electric characteristics and using the oxide semiconductor layer described in any of Embodiments 1 to 4, and a liquid crystal element 4013 are formed over a first substrate 4001 and sealed between the first substrate 4001 and a second substrate 4006 with a sealant 4005. FIG. 20B is a cross-sectional view taken along line M-N of FIGS. 20A1 and 20A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that the connection method of a driver circuit which is separately formed is not particularly limited, and a COG method, a wire bonding method, a TAB method, or the like can be used. FIG. 20A1 illustrates an example of mounting the signal line driver circuit 4003 by a COG method, and FIG. 20A2 illustrates an example of mounting the signal line driver circuit 4003 by a TAB method.

The pixel portion 4002 and the scan line driver circuit 4004 provided over the first substrate 4001 include a plurality of transistors. FIG. 20B illustrates the transistor 4010 included in the pixel portion 4002 and the transistor 4011 included in the scan line driver circuit 4004, as an example. Insulating layers 4020 and 4021 are formed over the transistors 4010 and 4011.

As the transistors 4010 and 4011, highly reliable transistors each having stable electric characteristics and using the oxide semiconductor layer described in any of Embodiments 1 to 4 can be used. In this embodiment, the transistors 4010 and 4011 are n-channel transistors.

A pixel electrode layer 4030 included in the liquid crystal element 4013 is electrically connected to the transistor 4010. A counter electrode layer 4031 of the liquid crystal element 4013 is formed on the second substrate 4006. A portion where the pixel electrode layer 4030, the counter electrode layer 4031, and the liquid crystal layer 4008 are overlapped with one another corresponds to the liquid crystal element 4013. Note that the pixel electrode layer 4030 and the counter electrode layer 4031 are provided with an insulating layer 4032 and an insulating layer 4033 respectively which each function as an alignment film, and the liquid crystal layer 4008 is sandwiched between the pixel electrode layer 4030 and the counter electrode layer 4031 with the insulating layers 4032 and 4033 interposed therebetween.

Note that the first substrate 4001 and the second substrate 4006 can be formed using glass, metal (typically, stainless steel), ceramic, or plastic. As plastic, a fiberglass-reinforced plastics (FRP) plate, a polyvinyl fluoride (PVF) film, a polyester film, or an acrylic resin film can be used. Alternatively, a sheet with a structure in which an aluminum foil is sandwiched between PVF films or polyester films may be used.

Reference numeral 4035 denotes a columnar spacer obtained by selectively etching an insulating film and is provided to control the distance between the pixel electrode layer 4030 and the counter electrode layer 4031 (a cell gap). Alternatively, a spherical spacer may be used. The counter electrode layer 4031 is electrically connected to a common potential line provided over the same substrate as the transistor 4010. With the use of the common connection portion, the counter electrode layer 4031 is electrically connected to the common potential line through conductive particles provided between the pair of substrates. Note that the conductive particles are contained in the sealant 4005.

Alternatively, liquid crystal exhibiting a blue phase for which an alignment film is unnecessary may be used. A blue phase is one of the liquid crystal phases and generated just before a cholesteric phase changes into an isotropic phase when the temperature of cholesteric liquid crystal is increased. Because the blue phase appears only in a narrow temperature range, a liquid crystal composition containing a chiral agent at 5 percent by weight or more is used for the liquid crystal layer 4008 in order to improve the temperature range. The liquid crystal composition including liquid crystal exhibiting a blue phase and a chiral agent has a short response time of 10 μs to 100 μs and is optically isotropic; therefore, alignment treatment is unnecessary, and viewing angle dependence is small.

Although an example of a transmissive liquid crystal display device is described in this embodiment, an embodiment of the present invention can also be applied to a reflective liquid crystal display device or a transflective liquid crystal display device.

In this embodiment, an example of the liquid crystal display device is described in which a polarizing plate is provided on the outer surface of the substrate (on the viewer side) and a coloring layer and an electrode layer used for a display element are provided in this order on the inner surface of the substrate; however, the polarizing plate may be provided on the inner surface of the substrate. The layered structure of the polarizing plate and the coloring layer is not limited to that described in this embodiment and may be set as appropriate depending on materials of the polarizing plate and the coloring layer or conditions of manufacturing steps. Furthermore, a light-blocking film serving as a black matrix may be provided.

In this embodiment, in order to reduce the surface roughness of the transistor and to improve the reliability of the transistor, the transistor obtained in any of Embodiments 1 to 4 is covered with insulating layers (the insulating layers 4020 and 4021) serving as a protective film and a planarizing insulating film. Note that the protective film is provided to prevent entry of contamination impurities floating in the air, such as an organic substance, a metal substance, or moisture, and is preferably a dense film. The protective film may be formed by a sputtering method to have a single-layer structure or a layered structure including any of a silicon oxide film, a silicon nitride film, a silicon oxynitride film, a silicon nitride oxide film, an aluminum oxide film, an aluminum nitride film, an aluminum oxynitride film, and an aluminum nitride oxide film. Although this embodiment describes an example of forming the protective film by a sputtering method, the present invention is not particularly limited to this method and any of a variety of methods may be employed.

Here, the insulating layer 4020 having a layered structure is formed as the protective film. Here, as a first layer of the insulating layer 4020, a silicon oxide film is formed by a sputtering method. The use of the silicon oxide film for the protective film has an effect of preventing hillocks of an aluminum film used for the source and drain electrode layers.

As a second layer of the protective film, an insulating layer is formed. Here, a silicon nitride film is formed by a sputtering method, as a second layer of the insulating layer 4020. The use of the silicon nitride film as the protective film can prevent mobile ions such as sodium ions from entering a semiconductor region, thereby suppressing changes in electric characteristics of the TFT.

After the protective film is formed, the oxide semiconductor layer may be annealed (at 300° C. to 400° C.).

The insulating layer 4021 is formed as the planarizing insulating film. For the insulating layer 4021, an organic material having heat resistance, such as polyimide, acrylic, benzocyclobutene, polyamide, or epoxy, can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed using any of these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

There is no particular limitation on the method for forming the insulating layer 4021 and the insulating layer 4021 can be formed, depending on the material, by a sputtering method, an SOG method, spin coating, dipping, spray coating, a droplet discharge method (an ink jet method, screen printing, offset printing, or the like), doctor knife, roll coater, curtain coater, knife coater, or the like. In the case where the insulating layer 4021 is formed using a material solution, the annealing (at 300° C. to 400° C.) of the oxide semiconductor layer may also be performed in a baking step. The baking step of the insulating layer 4021 also serves as the annealing step of the oxide semiconductor layer, whereby a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive macromolecule (also referred to as a conductive polymer) can be used for the pixel electrode layer 4030 and the counter electrode layer 4031. The pixel electrode formed using the conductive composition preferably has a sheet resistance of 10000 ohms per square or less and a light transmissivity of 70% or more at a wavelength of 550 nm. Further, the resistivity of the conductive macromolecule contained in the conductive composition is preferably 0.1 Ω·cm or less.

As the conductive macromolecule, a so-called π-electron conjugated conductive macromolecule can be used. For example, polyaniline or a derivative thereof, polypyrrole or a derivative thereof, polythiophene or a derivative thereof, a copolymer of two or more kinds of them, and the like can be given.

Further, a variety of signals and potentials are supplied to the signal line driver circuit 4003 which is formed separately, the scan line driver circuit 4004 and the pixel portion 4002, from an FPC 4018.

In this embodiment, a connection terminal electrode 4015 is formed using the same conductive film that is used for the pixel electrode layer 4030 included in the liquid crystal element 4013, and a terminal electrode 4016 is formed using the same conductive film that is used for the source and drain electrode layers of the transistors 4010 and 4011.

The connection terminal electrode 4015 is electrically connected to a terminal included in the FPC 4018 through an anisotropic conductive film 4019.

Further, FIGS. 20A1, 20A2, and 20B illustrate an example in which the signal line driver circuit 4003 is formed separately and mounted on the first substrate 4001; however, this embodiment is not limited to this structure. The scan line driver circuit may be formed separately and then mounted, or only part of the signal line driver circuit or part of the scan line driver circuit may be formed separately and then mounted.

Figure 21:
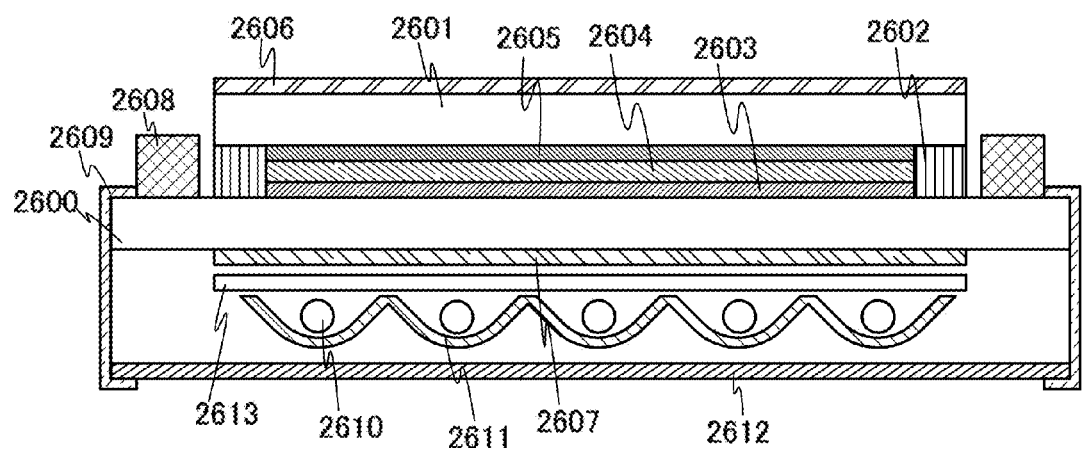
FIG. 21 illustrates a semiconductor device according to an embodiment of the present invention.

FIG. 21 illustrates an example in which a liquid crystal display module is formed as a semiconductor device by using a TFT substrate 2600 formed using the TFT described in any of Embodiments 1 to 4.

FIG. 21 illustrates an example of a liquid crystal display module, in which the TFT substrate 2600 and a counter substrate 2601 are fixed to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the case of the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611, and a circuit substrate 2612 is connected to a wiring circuit portion 2608 of the TFT substrate 2600 through a flexible wiring board 2609 and includes an external circuit such as a control circuit or a power supply circuit. The polarizing plate and the liquid crystal layer may be stacked with a retardation plate interposed therebetween.

For the liquid crystal display module, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

Through the aforementioned process, a highly reliable liquid crystal display panel with stable electric characteristics as a semiconductor device can be manufactured.

Note that the structure described in this embodiment can be implemented in combination with any of the structures described in other embodiments as appropriate.

Embodiment 8

In this embodiment, an example of electronic paper is described as a semiconductor device to which the transistor described in any of Embodiments 1 to 4 is applied.

Figure 22:
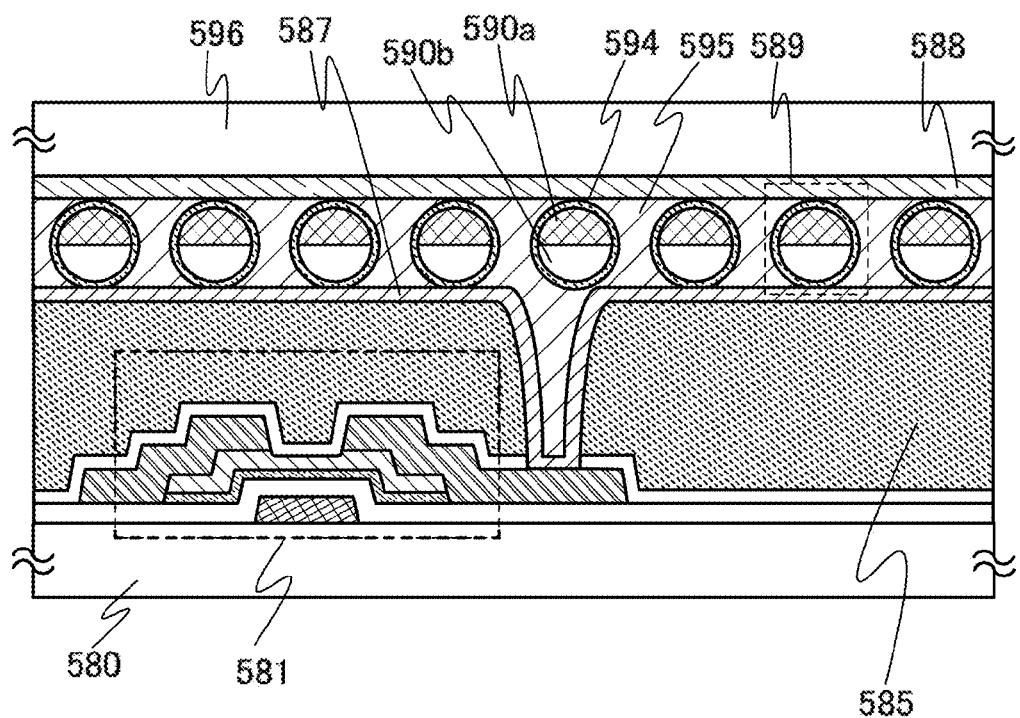
FIG. 22 illustrates a semiconductor device according to an embodiment of the present invention.

FIG. 22 illustrates active matrix electronic paper as an example of a semiconductor device. The transistor described in any of Embodiments 1 to 4 can be used as a transistor 581 for the semiconductor device.

The electronic paper in FIG. 22 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The transistor 581 sealed between a substrate 580 and a substrate 596 is a transistor with a bottom-gate structure, and a source electrode layer and a drain electrode layer thereof is in contact with a first electrode layer 587 at an opening formed in an insulating layer 585, whereby the transistor 581 is electrically connected to the first electrode layer 587. Between the first electrode layer 587 and a second electrode layer 588, spherical particles 589 each having a black region 590a, a white region 590b, and a cavity 594 around the regions, which is filled with liquid, are provided. A space around the spherical particles 589 is filled with a filler 595 such as a resin (see FIG. 22). In this embodiment, the first electrode layer 587 and the second electrode layer 588 correspond to a pixel electrode and a common electrode, respectively. The second electrode layer 588 is electrically connected to a common potential line provided over the same substrate as the transistor 581. With the use of any one of the common connection portions described in Embodiments 1 to 4, the second electrode layer 588 and the common potential line can be electrically connected to each other through conductive particles provided between the pair of substrates.

Further, instead of the twisting ball, an electrophoretic element may be used. A microcapsule having a diameter of about 10 μm to 200 μm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and black microparticles move to opposite sides from each other, so that white or black can be displayed. A display element using this principle is an electrophoretic display element and is generally called electronic paper. The electrophoretic display element has a higher reflectivity than a liquid crystal display element and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to as a display device simply or a semiconductor device provided with a display device) is distanced from a radio wave source.

An electrophoretic display element is a display element that utilizes a so-called dielectrophoretic effect by which a substance having a high dielectric constant moves to a high-electric field region. An electrophoretic display device using the electrophoretic display element does not need to use a polarizing plate, which is required in a liquid crystal display device, and both the thickness and weight of the electrophoretic display device can be half of those of a liquid crystal display device.

A solution in which the aforementioned microcapsules are dispersed in a solvent is referred to as electronic ink. This electronic ink can be printed on a surface of glass, plastic, cloth, paper, or the like. Furthermore, with the use of a color filter or particles each containing a pigment, color display is possible, as well.

In addition, if a plurality of the aforementioned microcapsules are arranged as appropriate over an active matrix substrate so as to be interposed between two electrodes, an active matrix display device can be completed, and display can be performed by application of an electric field to the microcapsules. For example, the active matrix substrate obtained using the transistor in any of Embodiments 1 to 4 can be used.

Note that the particles in the microcapsules may each be formed using a single material selected from a conductive material, an insulating material, a semiconductor material, a magnetic material, a liquid crystal material, a ferroelectric material, an electroluminescent material, an electrochromic material, or a magnetophoretic material or a composite material of any of these.

Note that the structure described in this embodiment can be implemented in combination with any of the structures described in other embodiments as appropriate.

Embodiment 9

In this embodiment, an example of a light-emitting display device will be described as a semiconductor device to which the transistor described in any of Embodiments 1 to 4 is applied. Here, a light-emitting element utilizing electroluminescence is described as a display element included in the display device. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of a voltage to a light-emitting element, electrons and holes are separately injected from a pair of electrodes into a layer containing a light-emitting organic compound, and a current flows. The carriers (electrons and holes) are recombined and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is given here using an organic EL element as a light-emitting element.

Figure 23:
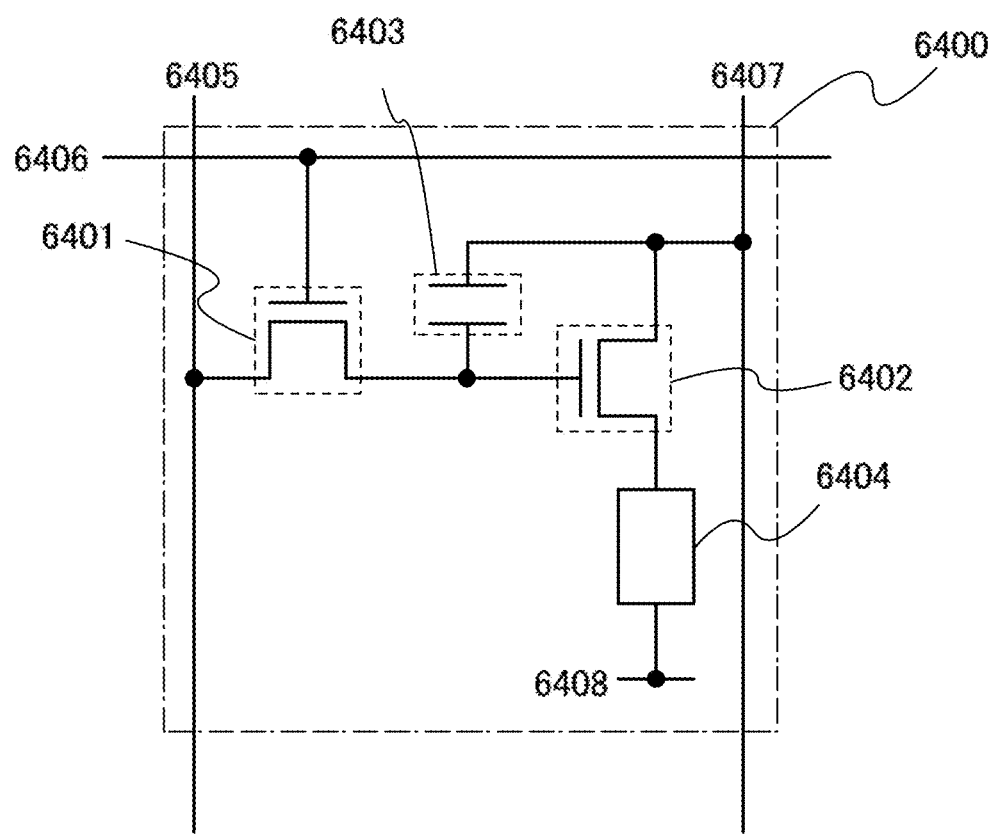
FIG. 23 illustrates a pixel equivalent circuit of a semiconductor device according to an embodiment of the present invention.

FIG. 23 is a diagram illustrating an example of a pixel structure to which digital time ratio grayscale driving can be applied, as an example of a semiconductor device to which the present invention is applied.

A structure and an operation of a pixel to which digital time ratio grayscale driving can be applied is described. Here, an example is described in which one pixel includes two n-channel transistors each using the oxide semiconductor layer described in any of Embodiments 1 to 4 for a channel formation region.

A pixel 6400 includes a switching transistor 6401, a driving transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driving transistor 6402. The gate of the driving transistor 6402 is connected to a power supply line 6407 through the capacitor 6403, a first electrode of the driving transistor 6402 is connected to the power supply line 6407, and a second electrode of the driving transistor 6402 is connected to a first electrode (pixel electrode) of the light-emitting element 6404. A second electrode of the light-emitting element 6404 corresponds to a common electrode 6408. The common electrode 6408 is electrically connected to a common potential line formed over the same substrate as the common electrode 6408.

The second electrode of the light-emitting element 6404 (the common electrode 6408) is set at a low power supply potential. Note that the low power supply potential is a potential satisfying the relation: the low power supply potential is lower than a high power supply potential when using the high power supply potential set at the power supply line 6407 as a reference. As the low power supply potential, GND, 0 V, or the like may be set, for example. A potential difference between the high power supply potential and the low power supply potential is applied to the light-emitting element 6404, and a current is supplied to the light-emitting element 6404, so that the light-emitting element 6404 emits light. Here, each potential is set so that the potential difference between the high power supply potential and the low power supply potential is higher than or equal to a forward threshold voltage of the light-emitting element 6404.

Note that gate capacitance of the driving transistor 6402 may be used as a substitute for the capacitor 6403, so that the capacitor 6403 can be omitted. The gate capacitance of the driving transistor 6402 may be formed between a channel region and the gate electrode.

Here, in the case of a voltage-input voltage driving method, a video signal is input to the gate of the driving transistor 6402 so that the driving transistor 6402 is sufficiently turned on or turned off. That is, the driving transistor 6402 operates in a linear region. Since the driving transistor 6402 operates in a linear region, a voltage higher than the voltage of the power supply line 6407 is applied to the gate of the driving transistor 6402. Note that a voltage higher than or equal to "power supply line voltage+$V_{th}$ of the driving transistor 6402" is applied to the signal line 6405.

Further, in the case of using analog grayscale driving instead of the digital time ratio grayscale driving, the same pixel structure as that of FIG. 23 can be employed by inputting signals in a different way.

In the case of performing the analog grayscale driving, a voltage higher than or equal to "a forward voltage of the light-emitting element 6404+$V_{th}$ of the driving transistor 6402" is applied to the gate of the driving transistor 6402. The forward voltage of the light-emitting element 6404 refers to a voltage for obtaining a desired luminance, and larger than a forward threshold voltage. Note that by inputting the video signal which allows the driving transistor 6402 to operate in a saturation region, a current can be supplied to the light-emitting element 6404. In order that the driving transistor 6402 may operate in the saturation region, the potential of the power supply line 6407 is set to be higher than the gate potential of the driving transistor 6402. When the video signal is an analog signal, a current corresponding to the video signal is supplied to the light-emitting element 6404, so that the analog grayscale driving can be performed.

Note that the pixel structure illustrated in FIG. 23 is not limited thereto. For example, a switch, a resistor, a capacitor, a transistor, a logic circuit, or the like may be added to the pixel illustrated in FIG. 23.

Next, structures of the light-emitting element are described with reference to FIGS. 24A to 24C. The cross-sectional structures of pixels are described by taking the case where a driving TFT is an n-channel TFT as an example. Driving TFTs 7001, 7011, and 7021 used for the semiconductor devices illustrated in FIGS. 24A to 24C can be manufactured similarly to the transistors described in Embodiments 1 to 4 and are highly reliable transistors with stable electric characteristics each using an oxide layer including Zn.

In order to extract light emitted from the light-emitting element, at least one of the anode and the cathode is required to have a light-transmitting property with respect to visible light. A transistor and a light-emitting element are formed over a substrate. A light-emitting element can have a top emission structure, in which light emission is extracted through the surface on the side opposite from the substrate side; a bottom emission structure, in which light emission is extracted through the surface on the substrate side; or a dual emission structure, in which light emission is extracted through the surface on the side opposite from the substrate side and the surface on the substrate side. The pixel structure according to an embodiment of the present invention can be applied to a light-emitting element having any of these emission structures.

A light-emitting element having a top emission structure is described with reference to FIG. 24A.

Figure 24A:
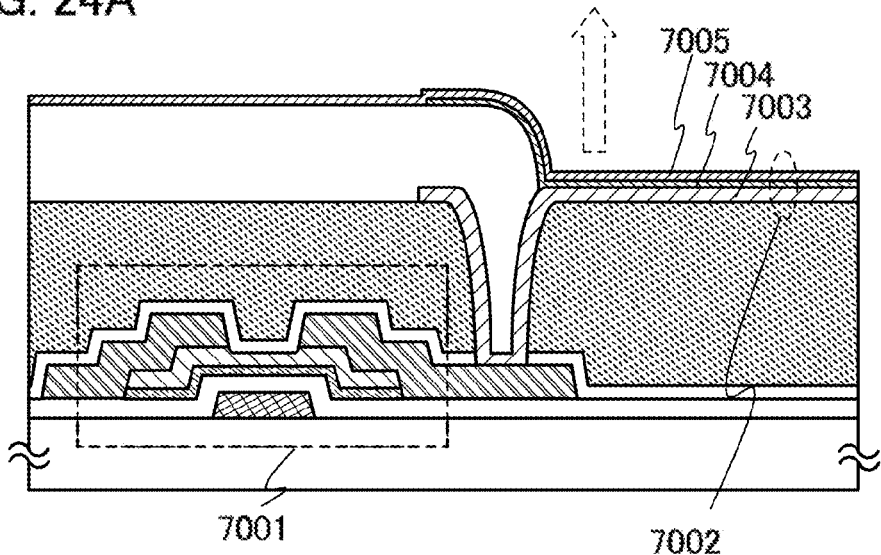
FIGS. 24A to 24C each illustrate a semiconductor device according to an embodiment of the present invention.

FIG. 24A is a cross-sectional view of a pixel in the case where the driving TFT 7001 is an n-channel transistor and light is emitted from a light-emitting element 7002 to the anode 7005 side. In FIG. 24A, a cathode 7003 of the light-emitting element 7002 is electrically connected to the driving TFT 7001, and a light-emitting layer 7004 and the anode 7005 are stacked in this order over the cathode 7003. The cathode 7003 can be formed using any of a variety of materials as long as it is a conductive film that has a low work function and reflects light. For example, Ca, Al, Mg—Ag, Al—Li, or the like is desirably used. The light-emitting layer 7004 may be formed using a single layer or a plurality of layers stacked. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. Note that it is not necessary to form all of these layers. The anode 7005 is formed using a conductive material having a light-transmitting property with respect to visible light such as a light-transmitting conductive film of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like.

The light-emitting element 7002 corresponds to a region where the light-emitting layer 7004 is sandwiched between the cathode 7003 and the anode 7005. In the case of the pixel illustrated in FIG. 24A, light is emitted from the light-emitting element 7002 to the anode 7005 side as shown by an arrow.

Next, a light-emitting element having a bottom emission structure is described with reference to FIG. 24B. FIG. 24B is a cross-sectional view of a pixel in the case where the driving TFT 7011 is an n-channel TFT and light is emitted from a light-emitting element 7012 to the cathode 7013 side. In FIG. 24B, the cathode 7013 of the light-emitting element 7012 is formed over a light-transmitting conductive film 7017 which is electrically connected to the driving TFT 7011, and a light-emitting layer 7014 and an anode 7015 are stacked in this order over the cathode 7013. Note that a light-blocking film 7016 for reflecting or blocking light may be formed so as to cover the anode 7015 when the anode 7015 has a light-transmitting property with respect to visible light. For the cathode 7013, any of a variety of materials can be used as in the case of FIG. 24A as long as it is a conductive material having a low work function. It is to be noted that the cathode 7013 is formed to have a thickness that allows light transmission (preferably, about 5 nm to 30 nm). For example, an aluminum film with a thickness of 20 nm can be used as the cathode 7013. As in the case of FIG. 24A, the light-emitting layer 7014 may be formed using either a single layer or a plurality of layers stacked. The anode 7015 is not required to transmit light, but can be formed using a conductive material having a light-transmitting property with respect to visible light as in the case of FIG. 24A. As the light-blocking film 7016, metal or the like that reflects light can be used for example; however, it is not limited to a metal film. For example, a resin or the like to which black pigments are added may alternatively be used.

The light-emitting element 7012 corresponds to a region where the light-emitting layer 7014 is sandwiched between the cathode 7013 and the anode 7015. In the case of the pixel illustrated in FIG. 24B, light is emitted from the light-emitting element 7012 to the cathode 7013 side as shown by an arrow.

Next, a light-emitting element having a dual emission structure is described with reference to FIG. 24C. In FIG. 24C, a cathode 7023 of a light-emitting element 7022 is formed over a conductive film 7027 having a light-transmitting property with respect to visible light which is electrically connected to the driving TFT 7021, and a light-emitting layer 7024 and an anode 7025 are stacked in this order over the cathode 7023. As in the case of FIG. 24A, the cathode 7023 can be formed using any of a variety of materials as long as it is a conductive material having a low work function. It is to be noted that the cathode 7023 is formed to have a thickness that allows light transmission. For example, a film of Al having a thickness of 20 nm can be used as the cathode 7023. As in FIG. 24A, the light-emitting layer 7024 may be formed using either a single layer or a plurality of layers stacked. The anode 7025 can be formed using a conductive material having a light-transmitting property with respect to visible light as in the case of FIG. 24A.

The light-emitting element 7022 corresponds to a region where the cathode 7023, the light-emitting layer 7024, and the anode 7025 are overlapped with one another. In the case of the pixel illustrated in FIG. 24C, light is emitted from the light-emitting element 7022 to both the anode 7025 side and the cathode 7023 side as shown by arrows.

Note that, although an organic EL element is described here as a light-emitting element, an inorganic EL element can alternatively be provided as a light-emitting element.

Note that in this embodiment, the example is described in which a transistor (driving TFT) which controls the driving of a light-emitting element is electrically connected to the light-emitting element; however, a structure may be employed in which a TFT for current control is connected between the driving TFT and the light-emitting element.

Figure 24B:
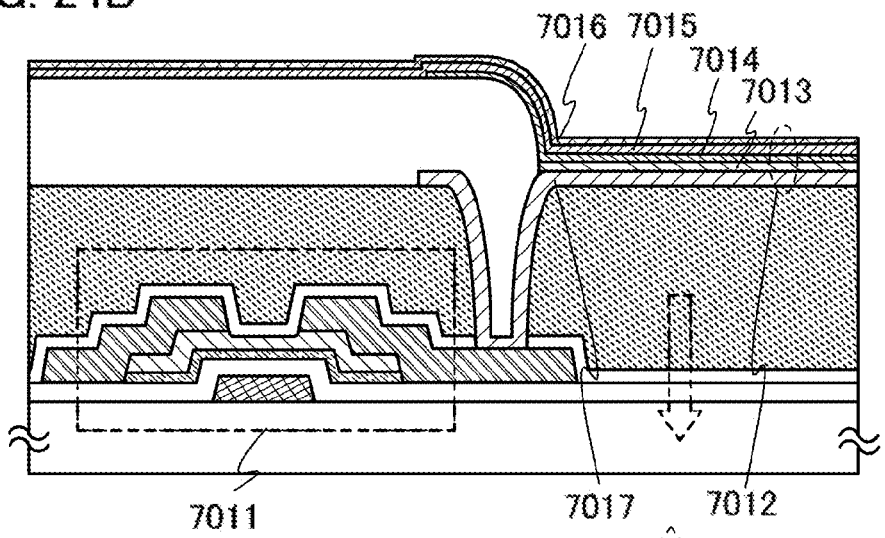
Figure 24C:
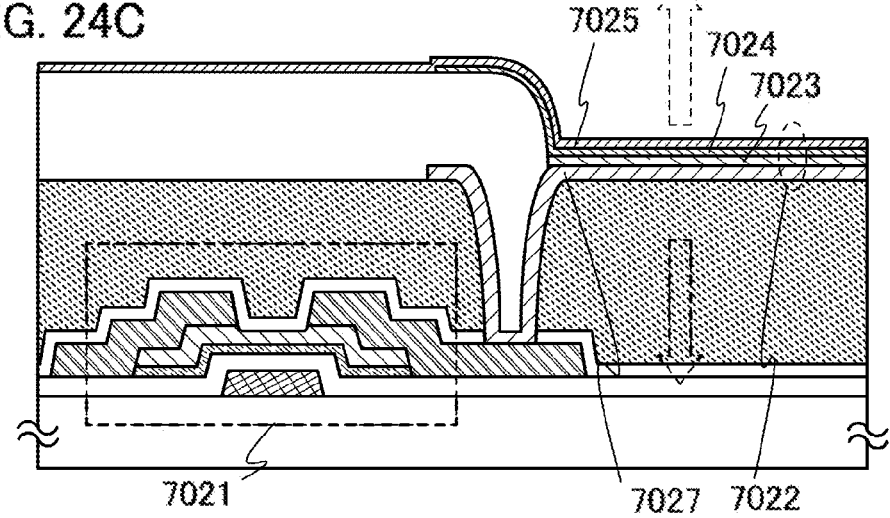

The semiconductor device described in this embodiment is not limited to the structures illustrated in FIGS. 24A to 24C and can be modified in various ways based on the spirit of techniques of the present invention.

Figure 25A:
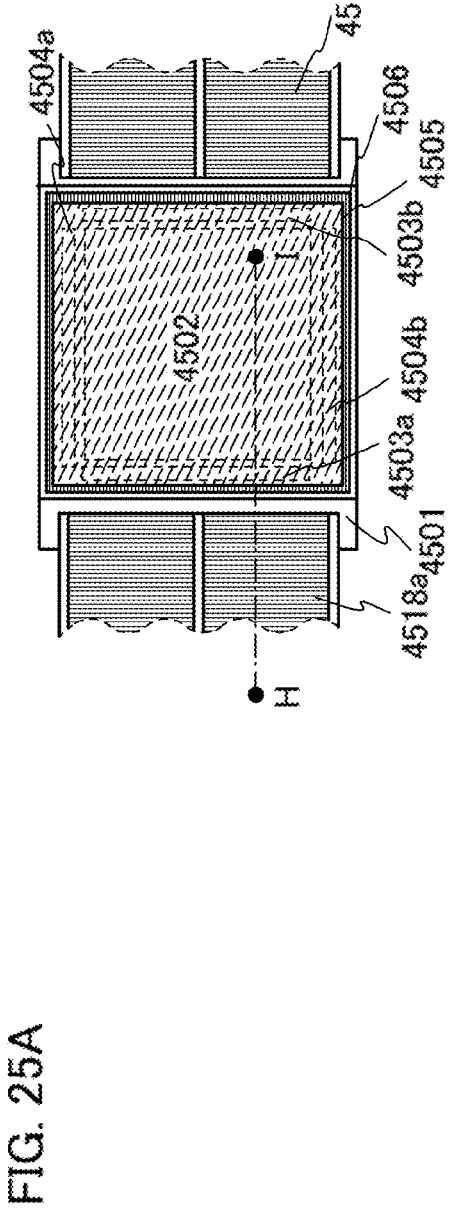
FIGS. 25A and 25B illustrate a semiconductor device according to an embodiment of the present invention.
Figure 25B:
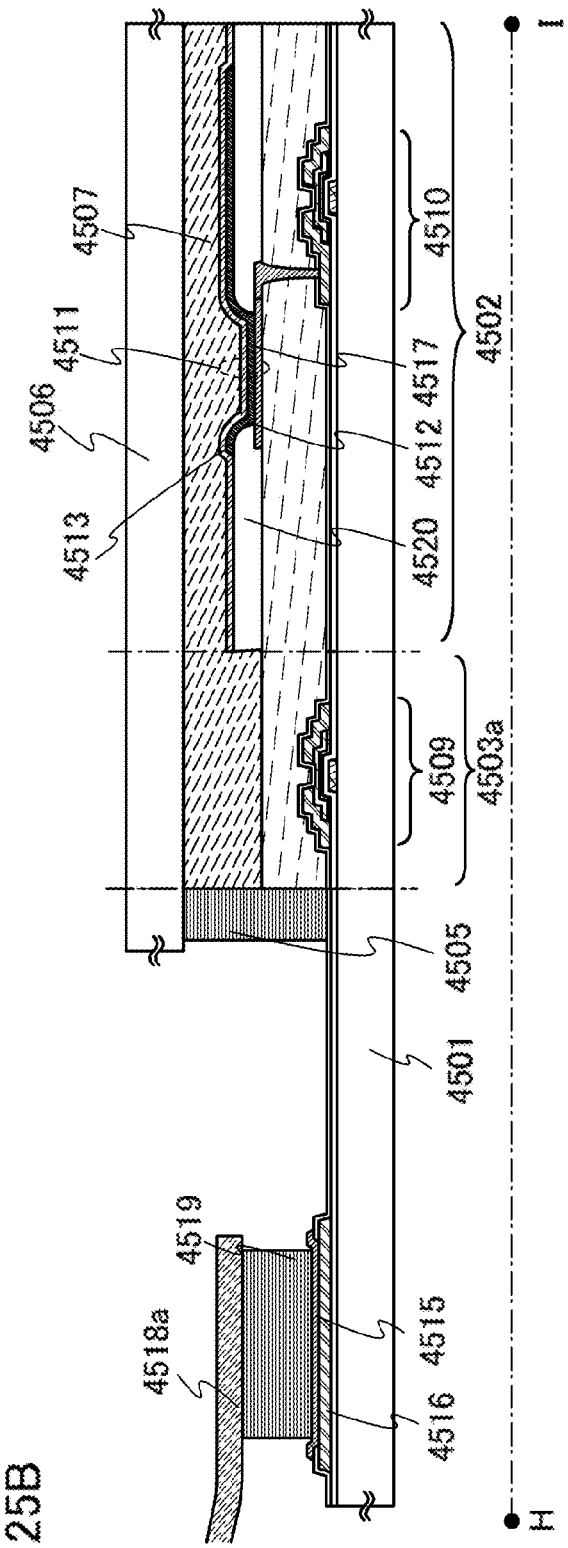

Next, the appearance and the cross section of a light-emitting display panel (also referred to as a light-emitting panel) which corresponds to one embodiment of a semiconductor device to which the transistor described in any of Embodiments 1 to 4 is applied are described with reference to FIGS. 25A and 25B. FIG. 25A is a plan view of a panel in which transistors and a light-emitting element, which are formed over a first substrate, are sealed between the first substrate and a second substrate with a sealant. FIG. 25B corresponds to a cross-sectional view taken along line H-I of FIG. 25A.

The sealant 4505 is provided so as to surround a pixel portion 4502, signal line driver circuits 4503a and 4503b, and scan line driver circuits 4504a and 4504b which are provided over the first substrate 4501. In addition, the second substrate 4506 is formed over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed, together with a filler 4507, by the first substrate 4501, the sealant 4505, and the second substrate 4506. In this manner, it is preferable that the pixel portion 4502, the signal line driver circuits 4503a and 4503b, and the scan line driver circuits 4504a and 4504b be packaged (sealed) with a protective film (such as an attachment film or an ultraviolet curable resin film) or a cover material with high air-tightness and little degasification so that the pixel portion 4502, the signal line driver circuits 4503a and 4503b, and the scan line driver circuits 4504a and 4504b are not exposed to the outside air.

The pixel portion 4502, the signal line driver circuits 4503a and 4503b, and the scan line driver circuits 4504a and 4504b formed over the first substrate 4501 each include a plurality of transistors, and the transistor 4510 included in the pixel portion 4502 and the transistor 4509 included in the signal line driver circuit 4503a are illustrated as an example in FIG. 25B.

As the transistors 4509 and 4510, highly reliable transistors with stable electric characteristics each using the oxide layer including Zn, which is described in any of Embodiments 1 to 4, can be used. In this embodiment, the transistors 4509 and 4510 are n-channel transistors.

Moreover, reference numeral 4511 denotes a light-emitting element. A first electrode layer 4517 which is a pixel electrode included in the light-emitting element 4511 is electrically connected to a source or drain electrode layer of the transistor 4510. Note that although the light-emitting element 4511 has a layered structure of the first electrode layer 4517, an electric field light-emitting layer 4512, and the second electrode layer 4513, the structure of the light-emitting element 4511 is not limited to the structure described in this embodiment. The structure of the light-emitting element 4511 can be changed as appropriate depending on a direction in which light is extracted from the light-emitting element 4511, or the like.

The partition wall 4520 is formed using an organic resin film, an inorganic insulating film, or organic polysiloxane. It is particularly preferable that the partition wall 4520 be formed using a photosensitive material and an opening portion be formed over the first electrode layer 4517 so that a sidewall of the opening portion is formed as an inclined surface with a continuous curvature.

The electric field light-emitting layer 4512 may be formed using a single layer or a plurality of layers stacked.

In order to prevent entry of oxygen, hydrogen, moisture, carbon dioxide, or the like into the light-emitting element 4511, a protective film may be formed over the second electrode layer 4513 and the partition wall 4520. As the protective film, a silicon nitride film, a silicon nitride oxide film, a DLC film, or the like can be formed.

In addition, a variety of signals and potentials are supplied to the signal line driver circuits 4503a and 4503b, the scan line driver circuits 4504a and 4504b, and the pixel portion 4502 from FPCs 4518a and 4518b.

In this embodiment, a connection terminal electrode 4515 is formed using the same conductive film that is used for the first electrode layer 4517 included in the light-emitting element 4511. A terminal electrode 4516 is formed using the same conductive film that is used for the source and drain electrode layers included in the transistors 4509 and 4510.

The connection terminal electrode 4515 is electrically connected to a terminal included in the FPC 4518a through an anisotropic conductive film 4519.

The substrate located in the direction in which light is extracted from the light-emitting element 4511 needs to have a light-transmitting property with respect to visible light. In this case, a material having a light-transmitting property with respect to visible light such as a glass plate, a plastic plate, a polyester film, or an acrylic film is used.

As the filler 4507, an inert gas such as nitrogen or argon, an ultraviolet curable resin, or a thermosetting resin can be used. For example, polyvinyl chloride (PVC), acrylic, polyimide, an epoxy resin, a silicone resin, polyvinyl butyral (PVB), or ethylene vinyl acetate (EVA) can be used. In this embodiment, nitrogen is used as the filler 4507.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Driver circuits formed using a single crystal semiconductor film or polycrystalline semiconductor film over a separately prepared substrate may be mounted as the signal line driver circuits 4503a and 4503b and the scan line driver circuits 4504a and 4504b. Alternatively, only the signal line driver circuits or part thereof, or the scan line driver circuits or part thereof may be separately formed and mounted. This embodiment is not limited to the structure illustrated in FIGS. 25A and 25B.

Through the above-mentioned process, a highly reliable light-emitting display device (display panel) with stable electric characteristics as a semiconductor device can be manufactured.

Note that the structure described in this embodiment can be implemented in combination with any of the structures described in other embodiments as appropriate.

Embodiment 10

A semiconductor device to which the transistor described in any of Embodiments 1 to 4 is applied can be used as electronic paper. Electronic paper can be used for electronic appliances of a variety of fields as long as they can display data. For example, electronic paper can be applied to an electronic book reader (e-book), a poster, an advertisement in a vehicle such as a train, displays of various cards such as a credit card, and the like. Examples of the electronic appliances are illustrated in FIGS. 26A and 26B and FIG. 27.

Figure 26A:
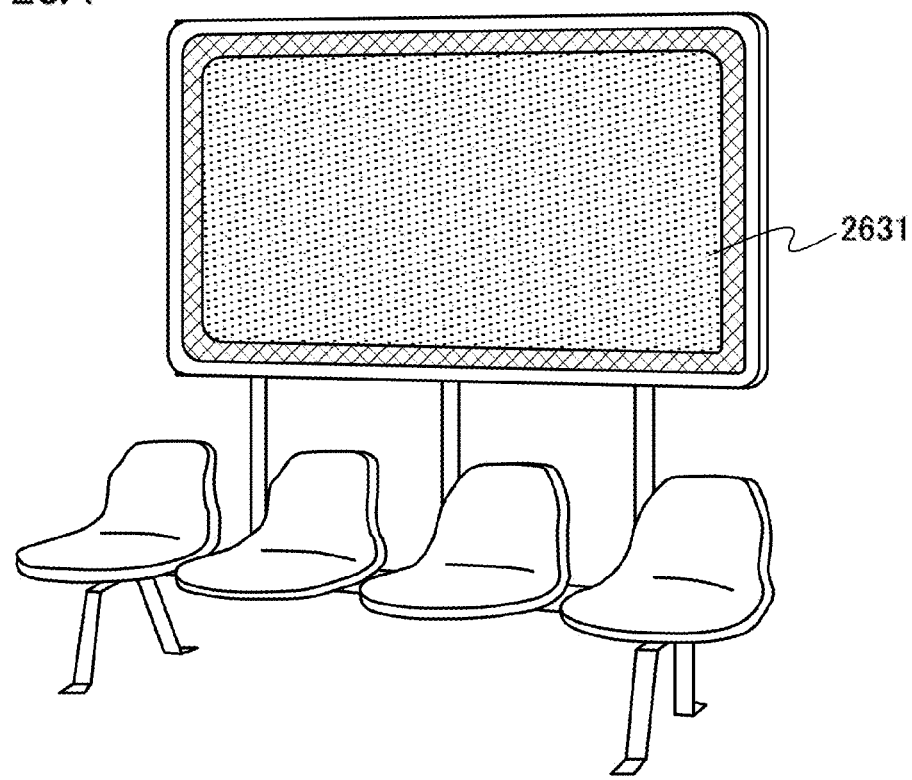
FIGS. 26A and 26B each illustrate an example of a usage mode of electronic paper.

FIG. 26A illustrates a poster 2631 formed using electronic paper. In the case where an advertising medium is printed paper, the advertisement is replaced by manpower; however, by using electronic paper, the advertising display can be changed in a short time. Further, an image can be stably displayed without display deterioration. Note that the poster may have a configuration capable of wirelessly transmitting and receiving data.

Figure 26B:
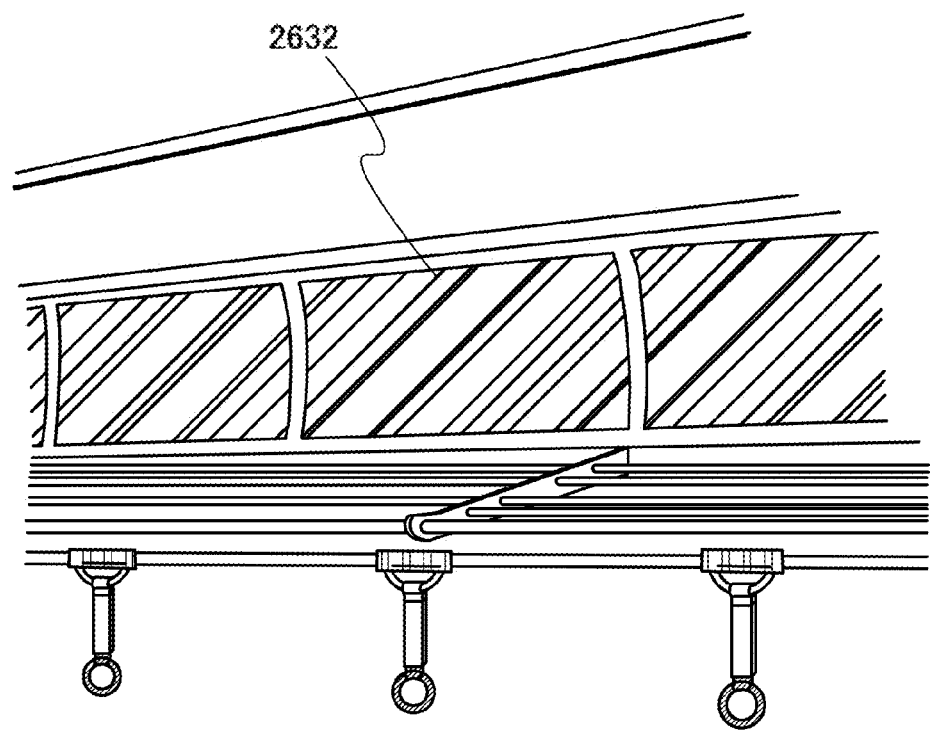

FIG. 26B illustrates an advertisement 2632 in a vehicle such as a train. In the case where an advertising medium is printed paper, the advertisement is replaced by manpower; however, by using electronic paper, the advertising display can be changed in a short time without a lot of manpower. Further an image can be stably displayed without display deterioration. Note that the advertisement in a vehicle may have a configuration capable of wirelessly transmitting and receiving data.

Figure 27:
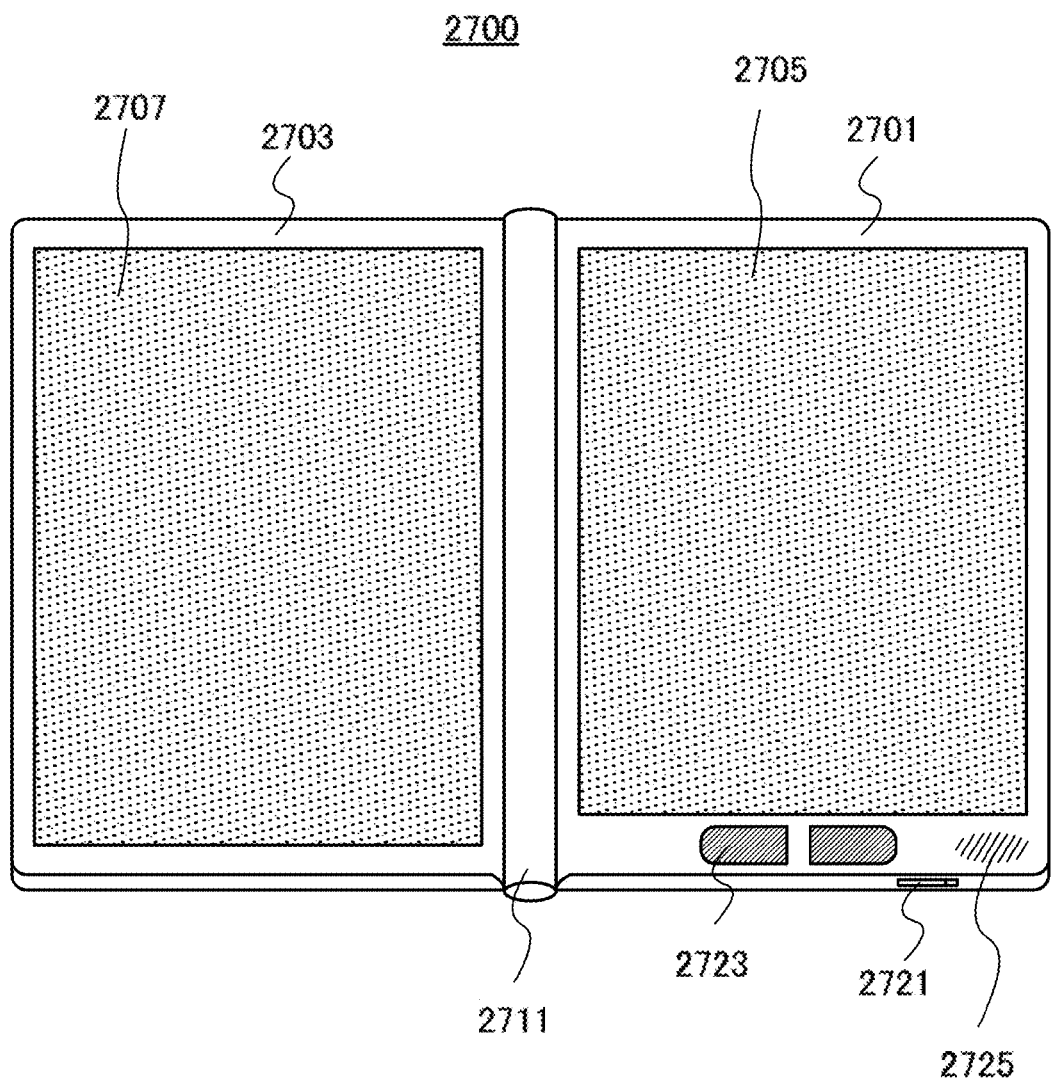
FIG. 27 is an external view of an example of an electronic book reader.

FIG. 27 illustrates an example of an electronic book reader 2700. For example, the electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can be operated like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 27) can display text and a display portion on the left side (the display portion 2707 in FIG. 27) can display graphics.

FIG. 27 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Further, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Further, the electronic book reader 2700 may have a function of an electronic dictionary.

The electronic book reader 2700 may have a configuration capable of wirelessly transmitting and receiving data. A structure may be employed in which a desired book data or the like is purchased and downloaded from an electronic book server wirelessly.

Note that the structure described in this embodiment can be implemented in combination with any of the structures described in other embodiments as appropriate.

Embodiment 11

A semiconductor device using the transistor described in any of Embodiments 1 to 4 can be applied to a variety of electronic appliances (including an amusement machine). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like.

Figure 28A:
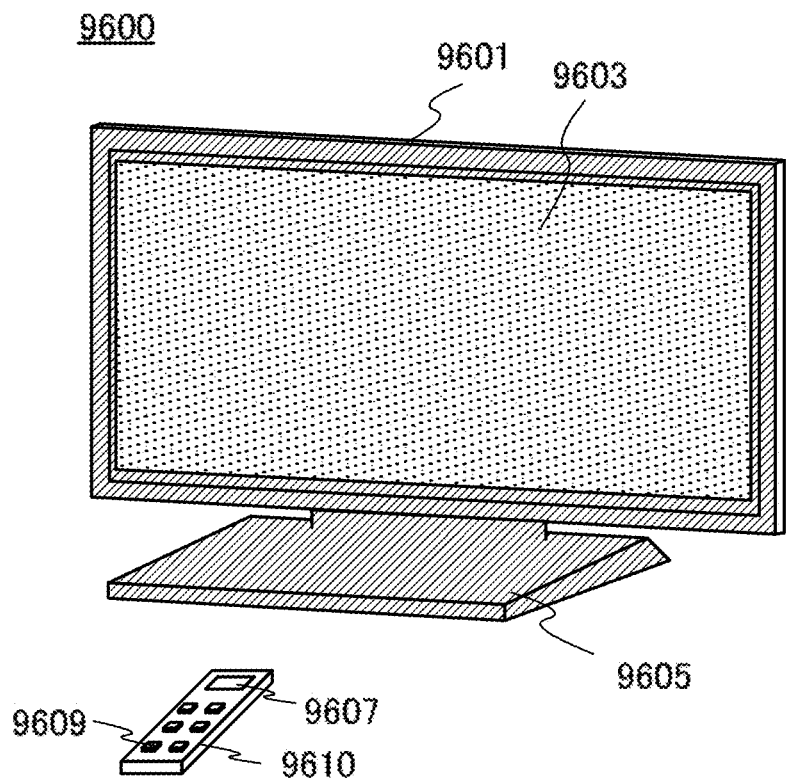
FIG. 28A is an external view of an example of a television device and FIG. 28B is an external view of an example of a digital photo frame.

FIG. 28A illustrates an example of a television set 9600. In the television set 9600, a display portion 9603 is incorporated in a housing 9601. The display portion 9603 can display an image. Further, the housing 9601 is supported by a stand 9605 here.

The television set 9600 can be operated by an operation switch of the housing 9601 or a separate remote controller 9610. Channels and volume can be controlled by operation keys 9609 of the remote controller 9610 so that an image displayed on the display portion 9603 can be controlled. Further, the remote controller 9610 may be provided with a display portion 9607 for displaying data output from the remote controller 9610.

Note that the television set 9600 is provided with a receiver, a modem, and the like. With the receiver, a general television broadcast can be received. Further, when the television set 9600 is connected to a communication network by wired or wireless connection via the modem, one-way (from a transmitter to a receiver) or two-way (between a transmitter and a receiver or between receivers) data communication can be performed.

Figure 28B:
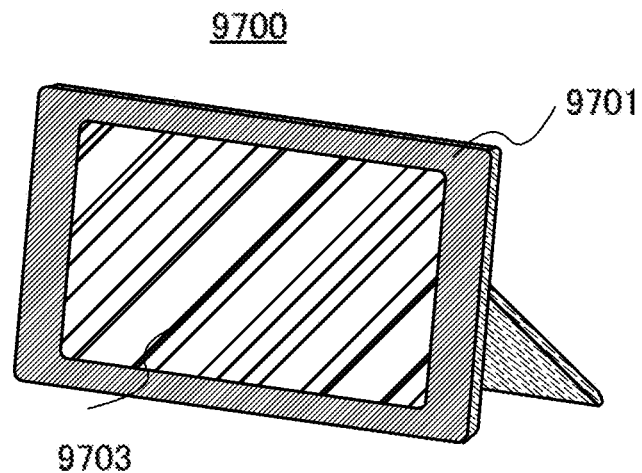

FIG. 28B illustrates an example of a digital photo frame 9700. For example, in the digital photo frame 9700, a display portion 9703 is incorporated in a housing 9701. The display portion 9703 can display various images. For example, the display portion 9703 can display data of an image shot by a digital camera or the like to function as a normal photo frame.

Note that the digital photo frame 9700 is provided with an operation portion, an external connection terminal (a USB terminal, a terminal that can be connected to various cables such as a USB cable, or the like), a recording medium insertion portion, and the like. Although they may be provided on the surface on which the display portion is provided, it is preferable to provide them on the side surface or the back surface for the design of the digital photo frame 9700. For example, a memory which stores data of an image shot by a digital camera is inserted in the recording medium insertion portion of the digital photo frame, whereby the image data can be transferred and displayed on the display portion 9703.

The digital photo frame 9700 may be configured to transmit and receive data wirelessly. A structure may be employed in which desired image data is transferred wirelessly to be displayed.

Figure 29A:
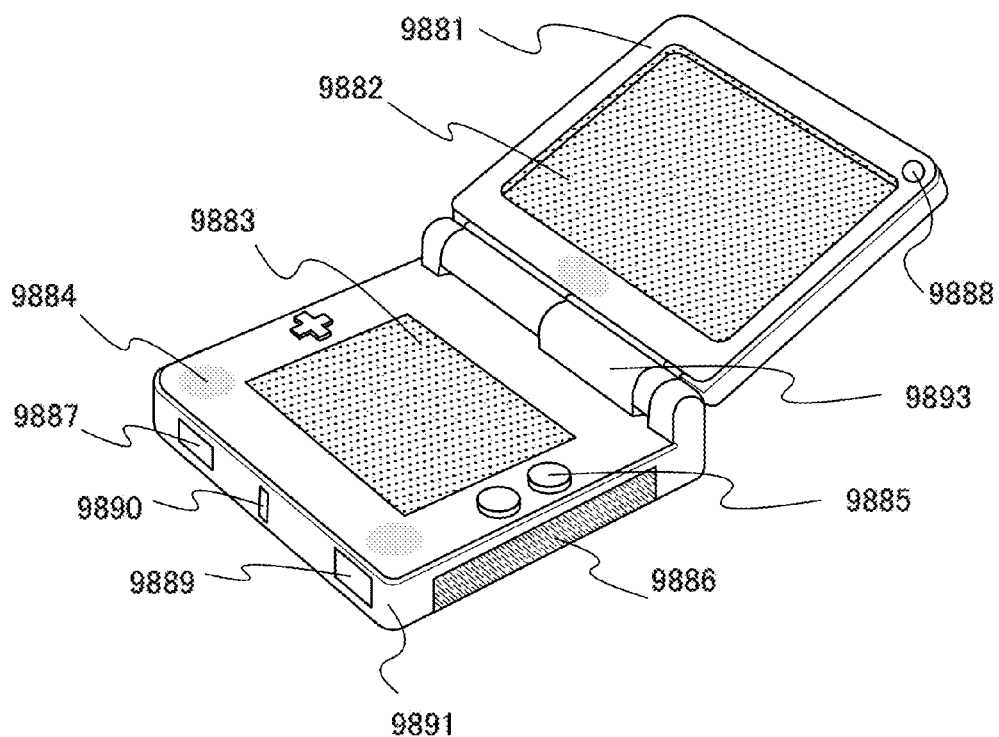
FIGS. 29A and 29B are external views of examples of game machines.

FIG. 29A illustrates a portable game machine including a housing 9881 and a housing 9891 which are jointed with a connector 9893 so as to be able to open and close. A display portion 9882 and a display portion 9883 are incorporated in the housing 9881 and the housing 9891, respectively. In addition, the portable game machine illustrated in FIG. 29A includes a speaker portion 9884, a storage medium inserting portion 9886, an LED lamp 9890, an input means (operation keys 9885, a connection terminal 9887, a sensor 9888 (including a function of measuring force, displacement, position, speed, acceleration, angular speed, the number of rotations, distance, light, liquid, magnetism, temperature, chemical substance, sound, time, hardness, electric field, current, voltage, electric power, radiation, flow rate, humidity, tilt angle, vibration, smell, or infrared ray), a microphone 9889), and the like. Needless to say, the structure of the portable game machine is not limited to the above, and may be any structure as long as at least a semiconductor device according to one embodiment of the present invention is provided. Moreover, another accessory may be provided as appropriate. The portable game machine illustrated in FIG. 29A has a function of reading out a program or data stored in a storage medium to display it on the display portion, and a function of sharing information with another portable game machine by wireless communication. The portable game machine in FIG. 29A can have a variety of functions other than those described above.

Figure 29B:
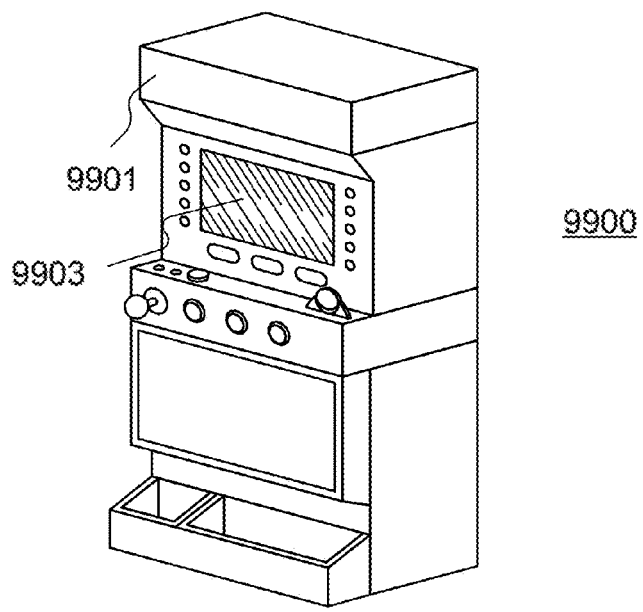

FIG. 29B illustrates an example of a slot machine 9900, which is a large game machine. A display portion 9903 is incorporated in a housing 9901 of the slot machine 9900. In addition, the slot machine 9900 includes an operation means such as a start lever or a stop switch, a coin slot, a speaker, and the like. Needless to say, the structure of the slot machine 9900 is not limited to the above, and may be any structure as long as at least a semiconductor device according to one embodiment of the present invention is provided. Moreover, another accessory may be provided as appropriate.

Figure 30A:
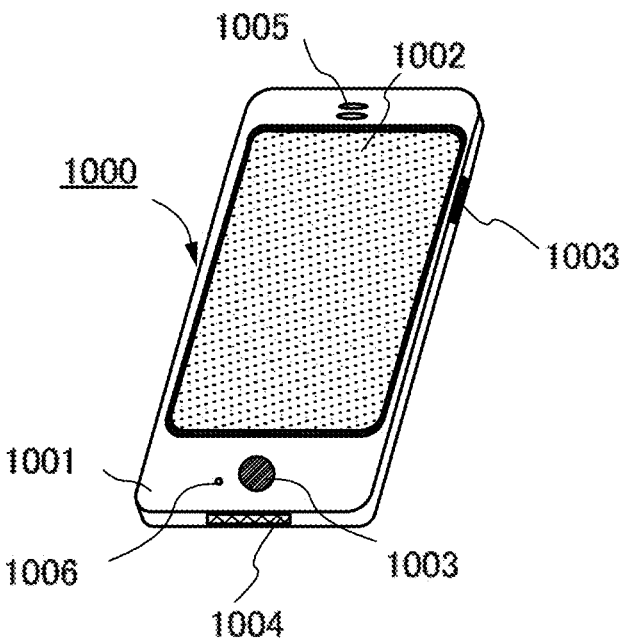
FIGS. 30A and 30B are external views of examples of mobile phone handsets.

FIG. 30A illustrates an example of a mobile phone handset 1000. The mobile phone handset 1000 is provided with a display portion 1002 incorporated in a housing 1001, an operation button 1003, an external connection port 1004, a speaker 1005, a microphone 1006, and the like.

When the display portion 1002 of the mobile phone handset 1000 illustrated in FIG. 30A is touched with a finger or the like, data can be input into the mobile phone handset 1000. Further, operations such as making calls and composing mails can be performed by touching the display portion 1002 with a finger or the like.

There are mainly three screen modes of the display portion 1002. The first mode is a display mode mainly for displaying an image. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1002 so that text displayed on a screen can be input. In this case, it is preferable to display a keyboard or number buttons on almost all area of the screen of the display portion 1002.

When a detection device including a sensor for detecting inclination, such as a gyroscope or an acceleration sensor, is provided inside the mobile phone handset 1000, display of the screen on the display portion 1002 can be automatically switched by determining the direction of the mobile phone handset 1000 (whether the mobile phone handset 1000 is placed horizontally or vertically for a landscape mode or a portrait mode).

The screen modes are switched by touching the display portion 1002 or operating the operation button 1003 of the housing 1001. Alternatively, the screen modes may be switched depending on the kind of the image displayed on the display portion 1002. For example, when a signal of an image displayed on the display portion is a signal of moving image data, the screen mode is switched to the display mode. When the signal is a signal of text data, the screen mode is switched to the input mode.

Further, in the input mode, when input by touching the display portion 1002 is not performed for a certain period while a signal detected by the optical sensor in the display portion 1002 is detected, the screen mode may be controlled so as to be switched from the input mode to the display mode.

The display portion 1002 may function as an image sensor. For example, an image of the palm print, the fingerprint, or the like is taken by touching the display portion 1002 with the palm or the finger, whereby personal authentication can be performed. Further, by providing a backlight or sensing light source emitting a near-infrared light for the display portion, an image of a finger vein, a palm vein, or the like can be taken.

Figure 30B:
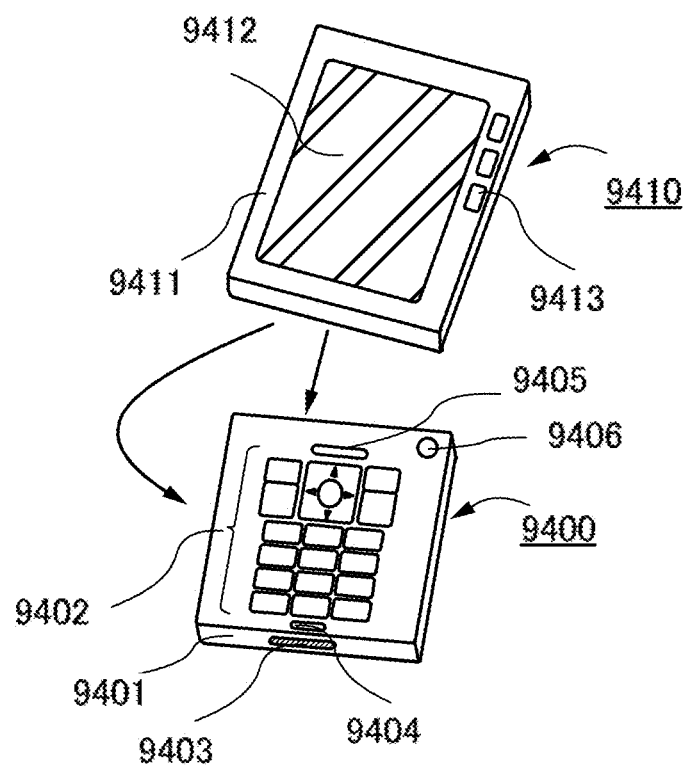

FIG. 30B illustrates another example of a mobile phone handset. The mobile phone handset illustrated in FIG. 30B is provided with a display device 9410 including a display portion 9412 and operation buttons 9413 in a housing 9411 and a communication device 9400 including scan buttons 9402, an external input terminal 9403, a microphone 9404, a speaker 9405, and a light-emitting portion 9406 which emits light when receiving a call in a housing 9401. The display device 9410 having a display function can be detached from or attached to the communication device 9400 having a telephone function in two directions shown by the arrows. Thus, the display device 9410 and the communication device 9400 may be attached to each other along their short sides or long sides. Further, when only the display function is needed, the display device 9410 can be detached from the communication device 9400 and used alone. Images or input data can be transmitted or received by wireless communication or wired communication between the communication device 9400 and the display device 9410, each of which has a rechargeable battery.

Note that the structure described in this embodiment can be implemented in combination with any of the structures described in other embodiments as appropriate.

This application is based on Japanese Patent Application serial no. 2009-100119 filed with Japan Patent Office on Apr. 16, 2009, the entire contents of which are hereby incorporated by reference.

What is claimed is:

1. A semiconductor device comprising:
    a gate electrode layer;
    a gate insulating layer over the gate electrode layer;
    an oxide semiconductor layer over the gate insulating layer;
    a source electrode layer and a drain electrode layer over the oxide semiconductor layer; and
    a layer comprising insulating oxide over the source electrode layer, the drain electrode layer and the oxide semiconductor layer,
    wherein the oxide semiconductor layer and the layer comprise Zn,
    wherein the layer is in contact with the oxide semiconductor layer at a portion between the source electrode layer and the drain electrode layer, and
    wherein the oxide semiconductor layer includes a region which is provided between the source electrode layer and the drain electrode layer and whose thickness is smaller than that of a region overlapping with the source electrode layer or the drain electrode layer.

2. The semiconductor device according to claim 1, wherein the gate electrode layer has a width in a channel direction which is larger than that of the oxide semiconductor layer.

3. The semiconductor device according to claim 1,
    wherein the oxide semiconductor layer and the layer do not comprise a rare metal.

4. The semiconductor device according to claim 1 further comprising:
    a pixel electrode in electrical contact with one of the source electrode layer and the drain electrode layer; and
    a light emitting layer over the pixel electrode.

5. The semiconductor device according to claim 1, wherein the layer has a conductivity lower than a conductivity of the oxide semiconductor layer.

6. The semiconductor device according to claim 1, wherein the layer comprises an amorphous structure.

7. The semiconductor device according to claim 1, wherein the oxide semiconductor layer comprises any of an amorphous structure, a polycrystalline structure, a single crystal structure, and a structure including crystal grains.

8. A semiconductor device comprising:
   a gate electrode layer;
   a gate insulating layer over the gate electrode layer;
   an oxide semiconductor layer over the gate insulating layer;
   a first n-type buffer layer and a second n-type buffer layer over the oxide semiconductor layer;
   a source electrode layer over the first n-type buffer layer, and a drain electrode layer over the second n-type buffer layer; and
   a layer comprising insulating oxide over the source electrode layer, the drain electrode layer and the oxide semiconductor layer,
   wherein the oxide semiconductor layer and the layer comprise Zn,
   wherein the layer is in contact with the oxide semiconductor layer at a portion between the source electrode layer and the drain electrode layer, and
   wherein the oxide semiconductor layer includes a region which is provided between the source electrode layer and the drain electrode layer and whose thickness is smaller than that of a region overlapping with the source electrode layer or the drain electrode layer.

9. The semiconductor device according to claim 8, wherein the gate electrode layer has a width in a channel direction which is larger than that of the oxide semiconductor layer.

10. The semiconductor device according to claim 8, wherein the oxide semiconductor layer and the layer do not comprise a rare metal.

11. The semiconductor device according to claim 8 further comprising:
    a pixel electrode in electrical contact with one of the source electrode layer and the drain electrode layer; and
    a light emitting layer over the pixel electrode.

12. The semiconductor device according to claim 8, wherein the layer has a conductivity lower than a conductivity of the oxide semiconductor layer.

13. The semiconductor device according to claim 8, wherein the first n-type buffer layer has a conductivity higher than a conductivity of the oxide semiconductor layer.

14. The semiconductor device according to claim 8, wherein the layer comprises an amorphous structure.

15. The semiconductor device according to claim 8, wherein the oxide semiconductor layer comprises any of an amorphous structure, a polycrystalline structure, a single crystal structure, and a structure including crystal grains.

* * * * *

UNITED STATES PATENT AND TRADEMARK OFFICE
CERTIFICATE OF CORRECTION

PATENT NO. : 8,853,690 B2
APPLICATION NO. : 13/743546
DATED : October 7, 2014
INVENTOR(S) : Shunpei Yamazaki et al.

It is certified that error appears in the above-identified patent and that said Letters Patent is hereby corrected as shown below:

In the Specification

At column 9, line 6, "I" should be --1--;

At column 11, line 39, "$cm^3$" should be --$cm^{-3}$--;

At column 30, line 47, "$Data_{13}$ j–2," should be --Data_j–2,--;

At column 30, line 47, "$Data_{13}$ j–1," should be --Data_j–1,--;

At column 30, line 47, "$Data_{13}$ j." should be --Data_j.--;

At column 30, line 51, "$Data_{13}$ j–2" should be --Data_j–2--;

At column 30, line 55, "$Data_{13}$j–1" should be --Data_j–1--;

At column 30, line 59, "$Data_{13}$ j" should be --Data_j--;

At column 31, line 45, "$Data_{13}$ j" should be --Data_j--.

Signed and Sealed this
Seventeenth Day of March, 2015

Michelle K. Lee
*Director of the United States Patent and Trademark Office*